United States Patent
Oh et al.

(10) Patent No.: US 9,824,916 B2
(45) Date of Patent: Nov. 21, 2017

(54) WIRING STRUCTURE AND METHOD OF FORMING A WIRING STRUCTURE

(71) Applicant: SAMSUNG ELECTRONICS CO., LTD., Suwon-si, Gyeonggi-do (KR)

(72) Inventors: In-Wook Oh, Suwon-si (KR); Jong-Hyun Lee, Suwon-si (KR); Sung-Wook Hwang, Gyeongsangbuk-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/250,199

(22) Filed: Aug. 29, 2016

(65) Prior Publication Data

US 2017/0162434 A1  Jun. 8, 2017

(30) Foreign Application Priority Data

Dec. 7, 2015  (KR) .................. 10-2015-0173131

(51) Int. Cl.
*H01L 21/768* (2006.01)
*H01L 21/66* (2006.01)
*H01L 21/033* (2006.01)

(52) U.S. Cl.
CPC .... *H01L 21/76811* (2013.01); *H01L 21/0332* (2013.01); *H01L 21/0337* (2013.01); *H01L 21/0338* (2013.01); *H01L 22/20* (2013.01)

(58) Field of Classification Search
None
See application file for complete search history.

(56) References Cited

U.S. PATENT DOCUMENTS

| | | | |
|---|---|---|---|
| 7,605,085 B2 | 10/2009 | Tomita et al. | |
| 8,117,582 B2 | 2/2012 | Lee | |
| 8,368,225 B2 | 2/2013 | Ikegami et al. | |
| 8,847,361 B2 | 9/2014 | Liaw et al. | |
| 2007/0063223 A1 | 3/2007 | Choi | |
| 2007/0262454 A1 | 11/2007 | Shibata | |
| 2008/0286698 A1* | 11/2008 | Zhuang | H01L 21/0337 430/323 |
| 2009/0169832 A1* | 7/2009 | Aton | H01L 21/0337 428/195.1 |
| 2012/0094492 A1* | 4/2012 | Park | H01L 21/0337 438/694 |

(Continued)

*Primary Examiner* — Asok K Sarkar
(74) *Attorney, Agent, or Firm* — F. Chau & Associates, LLC

(57) ABSTRACT

A method of forming a mask layout includes forming a layout of a first mask including a lower wiring structure pattern and a dummy lower wiring structure pattern. A layout of a second mask overlapping the first mask and including an upper wiring structure pattern and a dummy upper wiring structure pattern is formed. A layout of a third mask including a first via structure pattern and a first dummy via structure pattern is formed. A layout of a fourth mask including a second via structure pattern and a second dummy via structure pattern is formed. The second via structure pattern may commonly overlap the lower wiring structure pattern and the upper wiring structure pattern, and the second dummy via structure pattern may commonly overlap the dummy lower wiring structure pattern and the dummy upper wiring structure pattern. The fourth mask may overlap the third mask.

15 Claims, 43 Drawing Sheets

(56) References Cited

U.S. PATENT DOCUMENTS

| | | | |
|---|---|---|---|
| 2014/0045105 A1* | 2/2014 | Huang | H01L 21/31144 430/5 |
| 2014/0137060 A1 | 5/2014 | Liu et al. | |
| 2014/0213066 A1* | 7/2014 | Tung | H01L 21/0337 438/761 |
| 2014/0252653 A1 | 9/2014 | Okamoto et al. | |
| 2015/0091188 A1 | 4/2015 | Lee et al. | |
| 2015/0155274 A1 | 6/2015 | Jeong et al. | |

\* cited by examiner

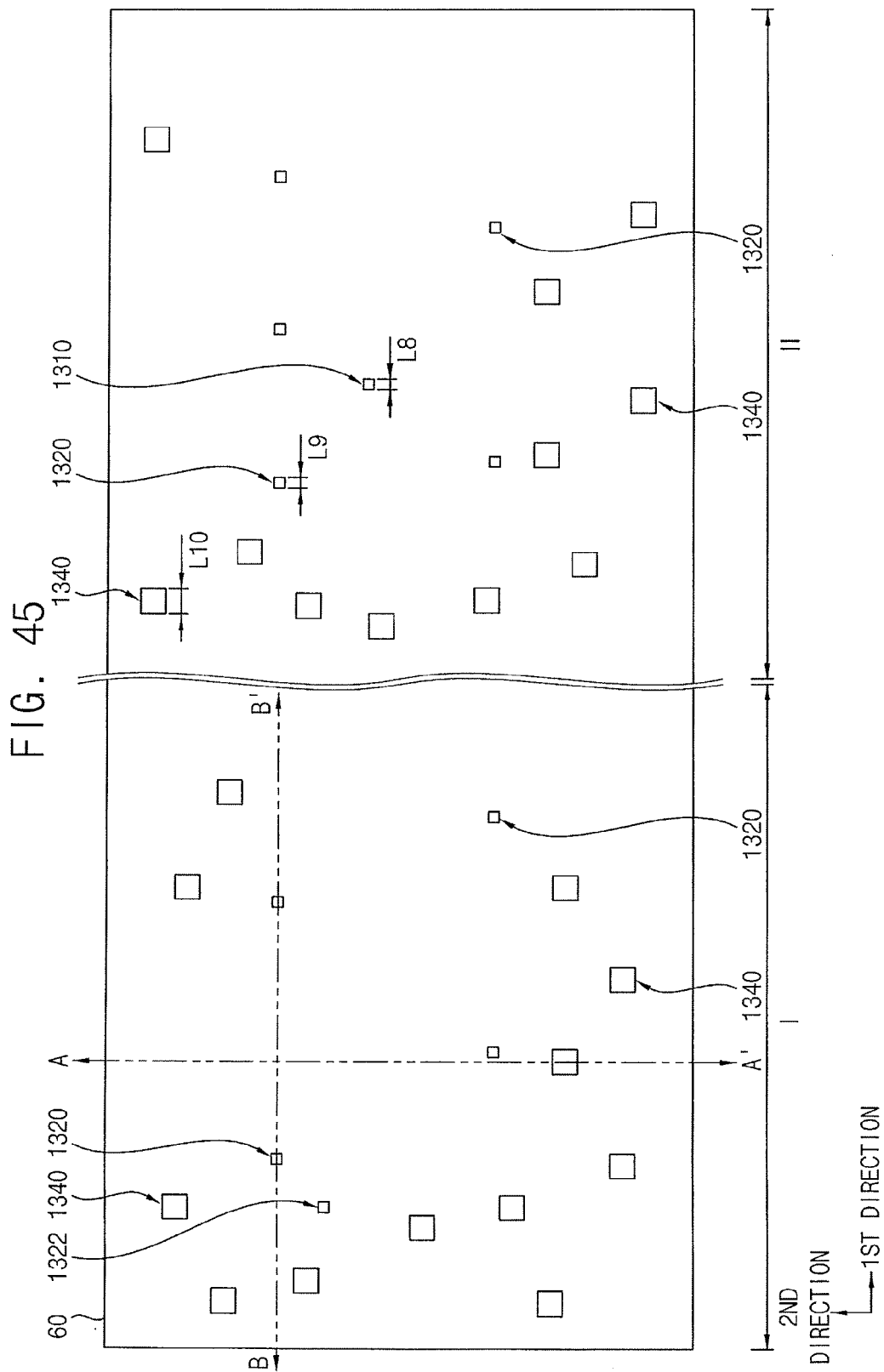

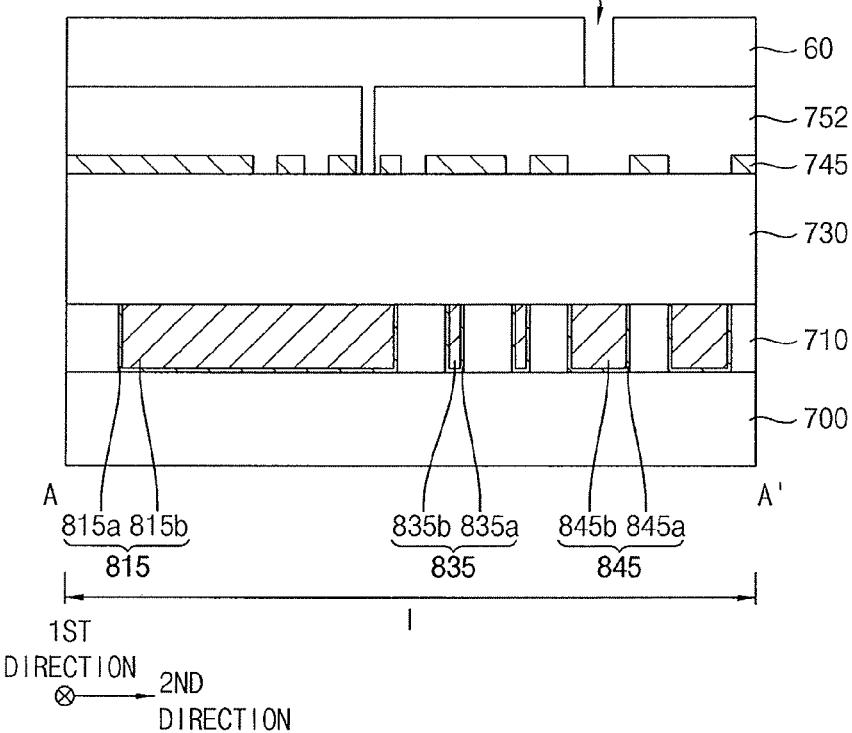
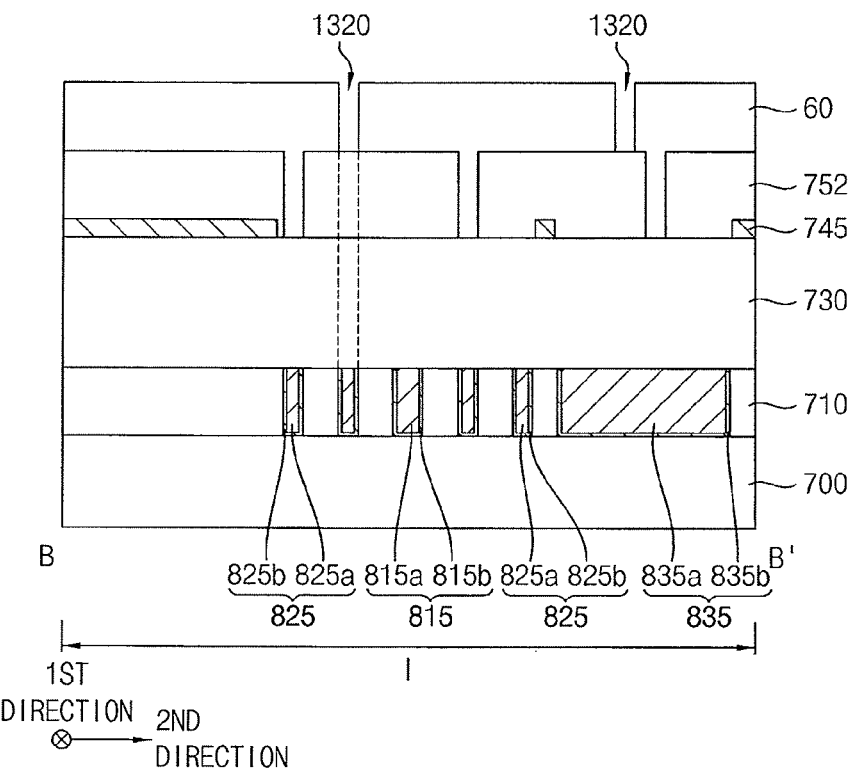

WIRING STRUCTURE AND METHOD OF FORMING A WIRING STRUCTURE

CROSS-REFERENCE TO RELATED APPLICATION

This application claims priority under 35 USC §119 to Korean Patent Application No. 10-2015-0173131, filed on Dec. 7, 2015 in the Korean Intellectual Property Office (KIPO), the disclosure of which is incorporated by reference herein in its entirety.

TECHNICAL FIELD

Exemplary embodiments of the present inventive concept relate to a wiring structure, and more particularly to a method of forming a wiring structure.

DISCUSSION OF RELATED ART

In integrated semiconductor devices, lower and upper wirings and vias connecting the lower and upper wirings with each other may have relatively small sizes. Vias might not have desired sizes and/or shapes in a photo process and/or an etching process. Optical proximity correction (OPC) may be used to form vias, however, when the vias have extremely small sizes, they might not be formed to have desired sizes and/or shapes even with the OPC.

SUMMARY

According to one or more exemplary embodiments of the present inventive concept, a method of forming a mask layout includes forming a layout of a first mask including a lower wiring structure pattern and a dummy lower wiring structure pattern. A layout of a second mask overlapping the first mask and including an upper wiring structure pattern and a dummy upper wiring structure pattern is formed. A layout of a third mask including a first via structure pattern and a first dummy via structure pattern is formed. The first via structure pattern may commonly overlap the lower wiring structure pattern and the upper wiring structure pattern, and the first dummy via structure pattern may commonly overlap the dummy lower wiring structure pattern and the dummy upper wiring structure pattern. A layout of a fourth mask including a second via structure pattern and a second dummy via structure pattern is formed. The second via structure pattern may commonly overlap the lower wiring structure pattern and the upper wiring structure pattern, and the second dummy via structure pattern may commonly overlap the dummy lower wiring structure pattern and the dummy upper wiring structure pattern. The fourth mask may overlap the third mask.

According to one or more exemplary embodiments of the present inventive concept, a method of forming a mask layout includes forming a layout of a first mask including a lower wiring structure pattern and a dummy lower wiring structure pattern. A layout of a second mask overlapping the first mask and including an upper wiring structure pattern and a dummy upper wiring structure pattern is formed. A layout of a third mask including a first via structure pattern and a first dummy via structure pattern is formed. The first via structure pattern may commonly overlap the lower wiring structure pattern and the upper wiring structure pattern, and the first dummy via structure pattern may commonly overlap the dummy lower wiring structure pattern and the dummy upper wiring structure pattern. The first dummy via structure pattern may include a plurality of first dummy via patterns and a plurality of second dummy via patterns. Each of the first dummy via patterns may have a size less than a predetermined size, and each of the second dummy via patterns may have a size equal to or greater than the predetermined size. A first OPC is performed on the first via structure pattern and the first dummy via patterns. A layout of a fourth mask overlapping the third mask and including a second via structure pattern and a second dummy via structure pattern is formed. The second via structure pattern may commonly overlap the lower wiring structure pattern and the upper wiring structure pattern, and the second dummy via structure pattern may commonly overlap the dummy lower wiring structure pattern and the dummy upper wiring structure pattern. The second via structure pattern may include a plurality of third dummy via patterns and a plurality of fourth dummy via patterns. Each of the third dummy via patterns may have a size less than the predetermined size, and each of the fourth dummy via patterns may have a size equal to or greater than the predetermined size. A second OPC on the second via structure pattern and the third dummy via patterns is performed.

According to one or more exemplary embodiments of the present inventive concept, a method of forming a wiring structure includes forming a lower wiring structure and a dummy lower wiring structure through a first insulating interlayer on a substrate. A second insulating interlayer and a first etching mask layer are formed on the first insulating interlayer, the lower wiring structure and the dummy lower wiring structure. The first etching mask layer may be patterned to form a first etching mask exposing an upper surface of the second insulating interlayer. A second etching mask layer is formed on the first etching mask and the exposed upper surface of the second insulating interlayer. The second etching mask layer may be patterned to form a preliminary second etching mask including first and second openings exposing the second insulating interlayer. The preliminary second etching mask may be patterned to form a second etching mask including third and fourth openings exposing the second insulating interlayer. An upper portion of the second insulating interlayer may be etched using the first and second etching masks to form first to fourth recesses corresponding to the first to fourth openings. After the second etching mask is removed, the second insulating interlayer may be etched using the first etching mask to form first and second trenches at upper portion of the second insulating interlayer and to form first to fourth via holes at lower portions of the second insulating interlayer. An upper wiring structure and a dummy upper wiring structure may be formed in the first and second trenches, respectively, first and second vias may be formed in the first and third via holes, respectively, and first and second dummy via structures may be formed in the second and fourth via holes, respectively. The first and second vias may be connected to the upper wiring structure, and the first and second dummy via structures may be connected to the dummy upper wiring structure.

One or more exemplary embodiments of the present inventive concept include a wiring structure including a dummy lower wiring structure at a level substantially the same as that of the lower wiring structure. The dummy lower wiring structure includes first dummy lower wirings and second dummy lower wirings. The first dummy lower wirings are closer to the lower wiring structure than the second dummy lower wirings, and each of the second dummy lower wirings has a size greater than that of each of the first dummy lower wirings. An upper wiring structure is over the lower wiring structure. The upper wiring structure at least partially overlaps the lower wiring structure. A dummy upper wiring structure is at a level substantially the same as that of the upper wiring structure and at least partially overlapping the dummy lower wiring structure. The dummy upper wiring structure includes first dummy upper wirings and second dummy upper wirings. The first dummy upper wirings are closer to the upper wiring structure than the second dummy upper wirings, and each of the second dummy upper wirings having a size greater than that of each of the first dummy upper wirings. A via structure is between the lower wiring structure and the upper wiring structure. The via structure contacts the lower wiring structure and the upper wiring structure. A dummy via structure is between the dummy lower wiring structure and the dummy upper wiring structure. The dummy via contacts the dummy lower wiring structure and the dummy upper wiring structure. The dummy via structure includes a plurality of first dummy vias and a plurality of second dummy vias. The first dummy upper wirings are closer to the upper wiring structure than the second dummy upper wirings, and each of the second dummy upper wirings having a size greater than that of each of the first dummy upper wirings. Each of the first dummy vias contacts at least one of the first dummy lower wirings and the first dummy upper wirings.

BRIEF DESCRIPTION OF THE DRAWINGS

The above and other features of the present inventive concept will become more apparent by describing in detail exemplary embodiments thereof with reference to the accompanying drawings, in which:

FIGS. 19 to 58 are plan views and cross-sectional views illustrating a method of forming a wiring structure in accordance with one or more exemplary embodiments of the present inventive concept.

DESCRIPTION OF EMBODIMENTS

Figure 1:
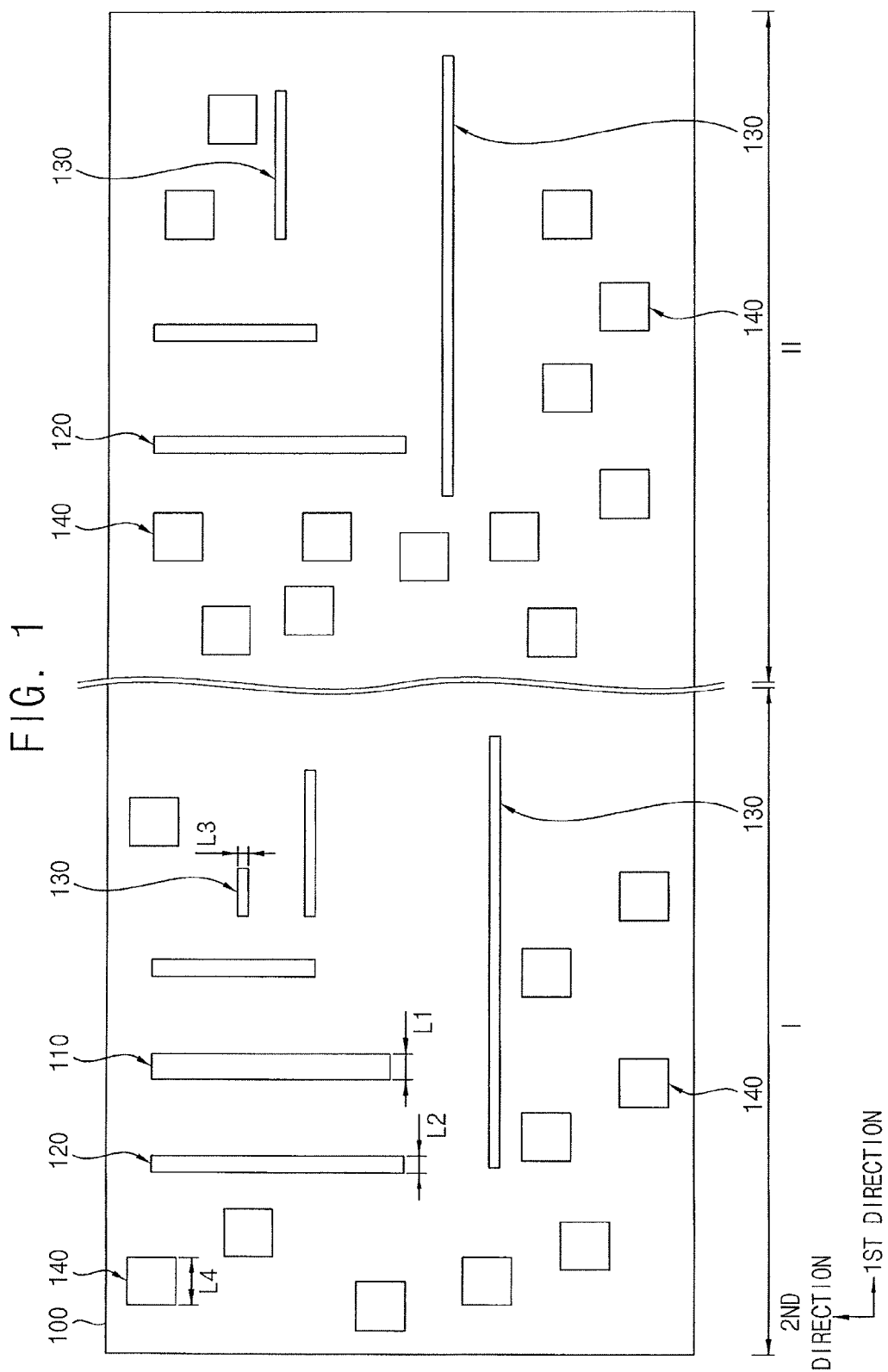
FIGS. 1 to 12 are plan views illustrating a method of forming a wiring structure in accordance with one or more exemplary embodiments of the present inventive concept.

Various exemplary embodiments of the present inventive concept will be described more fully hereinafter with reference to the accompanying drawings, in which some exemplary embodiments are shown. The present inventive concept may, however, be embodied in many different forms and should not be construed as limited to the exemplary embodiments set forth herein.

It will be understood that when an element or layer is referred to as being "on," "connected to" or "coupled to" another element or layer, it may be directly on, connected or coupled to the other element or layer or intervening elements or layers may be present. Like reference numerals may refer to like elements throughout the specification and drawings.

It will be understood that, although the terms first, second, third, and fourth may be used herein to describe various elements, components, regions, layers and/or sections, these elements, components, regions, layers and/or sections should not be limited by these terms.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, may occur. Thus, example embodiments should not be construed as limited to the particular shapes of regions illustrated herein but are to include deviations in shapes that result, for example, from manufacturing.

FIGS. 1 to 12 are plan views illustrating a method of forming a wiring structure in accordance with one or more exemplary embodiments of the present inventive concept.

Referring to FIG. 1, a first mask 100 may include a portion of a lower wiring structure pattern and a portion of a dummy lower wiring structure pattern.

The first mask 100 may include first and second regions I and II, which may be spaced apart from each other by a relatively long distance. Various patterns in the respective first and second regions I and II may be spaced apart from each other by a relatively long distance, and thus the patterns may be substantially isolated from each other. The lower wiring structure pattern need not be formed between the first and second regions I and II, however, a dummy lower wiring structure pattern may be formed between the first and second regions I and II.

The first mask 100 may include other regions than the first and second regions I and II. In this case, the lower wiring structure patterns in the other regions may be spaced apart from each other by a relatively long distance.

The layouts of the patterns in the respective first and second regions I and II may be similar to each other, however, exemplary embodiments of the present inventive concept are not limited thereto, and the layouts of the patterns may be different from each other.

For example, the first mask 100 may include a first lower wiring pattern 110 of the lower wiring structure pattern, and first dummy lower wiring patterns 120 and 130 and second dummy lower wiring patterns 140 of the dummy lower wiring structure pattern.

In an exemplary embodiment of the present inventive concept, each of the first lower wiring pattern 110, the first dummy lower wiring patterns 120 and 130, and the second dummy lower wiring patterns 140 may have a shape of a rectangle or a square in a plan view. A size of each of the first lower wiring pattern 110, the first dummy lower wiring patterns 120 and 130, and the second dummy lower wiring patterns 140 may be defined as a length of a relatively shorter side of the rectangle or a length of a side of the square, which may be applied to all patterns according to exemplary embodiments of the present inventive concept; however, exemplary embodiments of the present inventive concept are not limited thereto In an exemplary embodiment of the present inventive concept, the first lower wiring pattern 110 may have a shape of a rectangle extending in a second direction substantially parallel to an upper surface of the first mask 100, and may have a first length L1 along a first direction substantially parallel to the upper surface of the first mask 100 and substantially perpendicular to the second direction. Thus, a size of the first lower wiring pattern 110 may be defined as the first length L1.

The first dummy lower wiring patterns 120 and 130 may have a shape of a rectangle extending in the second direction or a shape of a rectangle extending in the first direction. The first dummy lower wiring patterns 120 and 130 may have second and third lengths L2 and L3 in the first and second directions, respectively. Thus, a size of the first dummy lower wiring pattern 120 may be defined as the second length L2, and a size of the first dummy lower wiring pattern 130 may be defined as the third length L3.

Each of the second dummy lower wiring patterns 140 may have a shape of a square, and may have a fourth length L4 along each of the first and second directions. However, exemplary embodiments of the present inventive concept are not limited thereto, and each of the first dummy lower wiring patterns 120 and 130 may have a square shape, or each of the second dummy lower wiring patterns 140 may have a rectangular shape.

In an exemplary embodiment of the present inventive concept, the second and third lengths L2 and L3 (e.g., the sizes of the first dummy lower wiring patterns 120 and 130) may be less than the fourth length L4 (e.g., the size of the second dummy lower wiring patterns 140). That is, the size of each of the first dummy lower wiring patterns 120 and 130 may be less than a predetermined size, and the size of each of the second dummy lower wiring patterns 140 may be equal to or greater than the predetermined size.

In an exemplary embodiment of the present inventive concept, the first length L1 may be less than the fourth length L4, and thus the first lower wiring pattern 110 may have a size less than the predetermined size, and may be narrower than the second dummy lower wiring patterns 140.

In an exemplary embodiment of the present inventive concept, the first dummy lower wiring patterns 120 and 130 may be spaced apart from the first lower wiring pattern 110 by a relatively small distance, and the second dummy lower wiring patterns 140 may be spaced apart from the first lower wiring pattern 110 by a relatively large distance. That is, the first dummy lower wiring patterns 120 and 130 relatively close to the first lower wiring pattern 110 having a relatively small size may have relatively small sizes, and the second dummy lower wiring patterns 140 relatively distant from the first lower wiring pattern 110 may have relatively large sizes.

Figure 2:
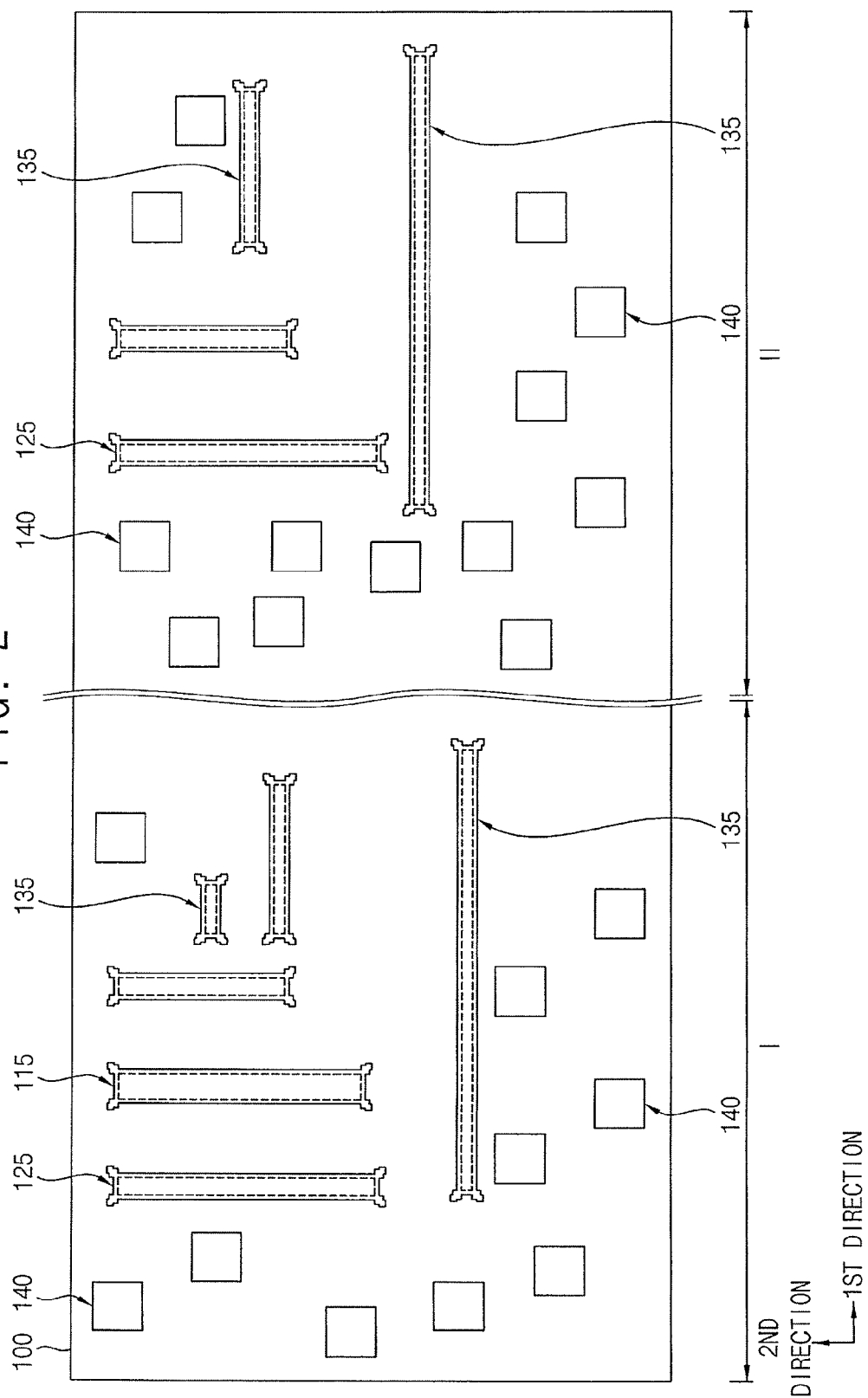

Referring to FIG. 2, an optical proximity correction (OPC) may be performed on the first mask 100 including the first lower wiring pattern 110, the first dummy lower wiring patterns 120 and 130, and the second dummy lower wiring patterns 140.

Patterns having sizes less than the predetermined size in the first mask 100 might not have desired sizes and/or shapes due to the optical proximity effect in a photo process in which the patterns may be transferred to a photoresist pattern, and thus the OPC may be performed so that the patterns may be more accurately transferred to the photoresist pattern.

In an exemplary embodiment of the present inventive concept, the OPC may be performed on the first lower wiring pattern 110 and the first dummy lower wiring patterns 120 and 130 having sizes less than the predetermined size.

In an exemplary embodiment of the present inventive concept, the OPC may include enlarging the whole size of each pattern and processing corners of each pattern. Thus, the first lower wiring pattern 110 and the first dummy lower wiring patterns 120 and 130 may have desired shapes (e.g., the shapes illustrated in FIG. 2). However, exemplary embodiments of the present inventive concept are not limited thereto, and various types of OPC may be performed.

The OPC need not be performed on the second dummy lower wiring patterns 140 having sizes substantially equal to or greater than the predetermined size.

After the OPC, the layout of the first mask 100 may be corrected. That is, the first mask 100 may include a corrected first lower wiring pattern 115, corrected first dummy lower wiring patterns 125 and 135, and the second dummy lower wiring patterns 140.

Figure 3:
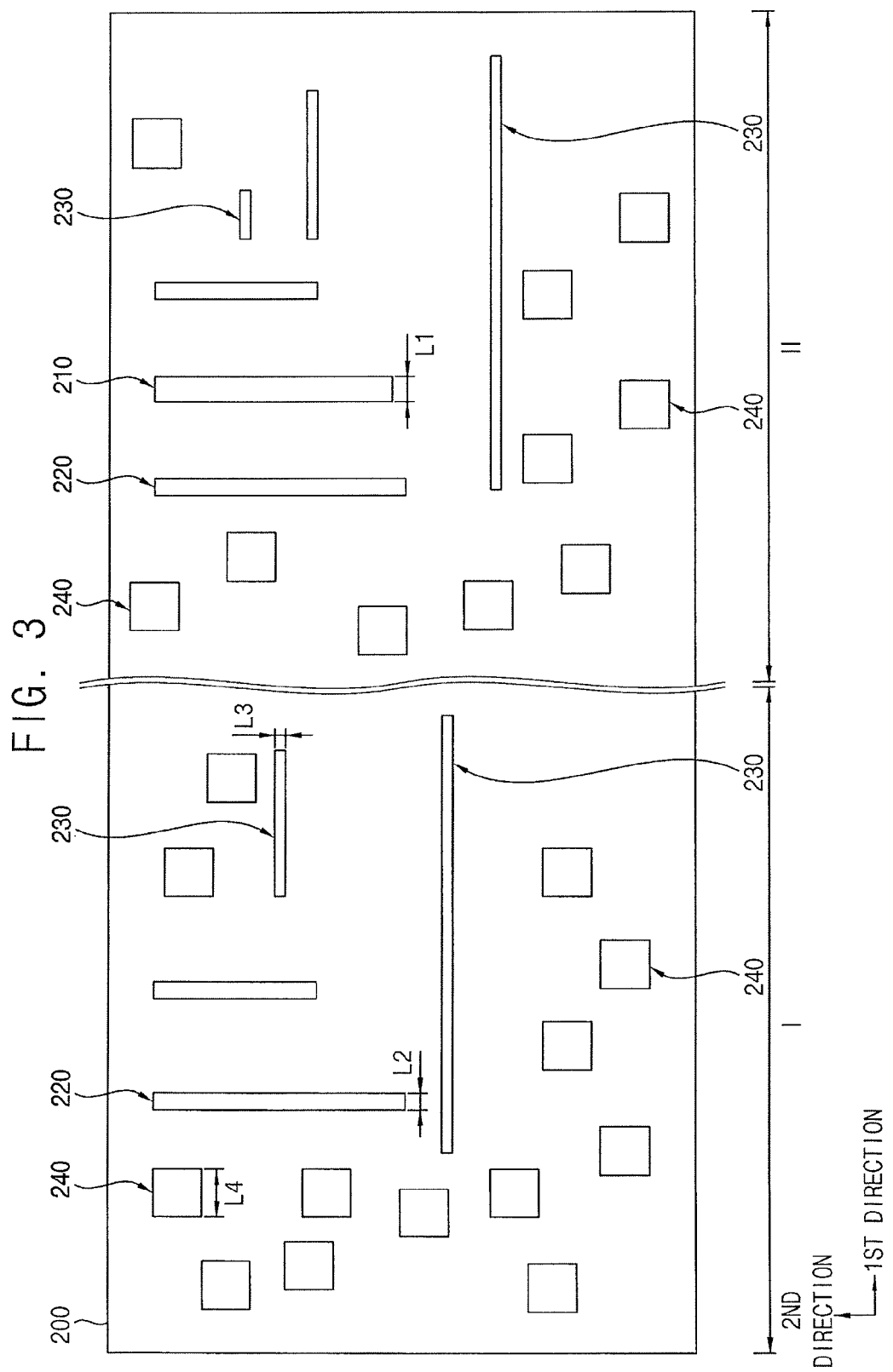

Referring to FIG. 3, a process substantially the same as or similar to that described above with reference to FIG. 1 may be performed.

That is, a layout of a second mask 200 including other portions of the lower wiring structure pattern and other portions of the dummy lower wiring structure pattern may be formed.

The second mask 200 may include regions substantially the same as those described above with reference to FIGS. 1 and 2. The first and second regions I and II may be spaced apart from each other by a relatively long distance. The second mask 200 may vertically overlap the first mask 100.

For example, the second mask 200 may include a second lower wiring pattern 210 of the lower wiring structure pattern, and third dummy lower wiring patterns 220 and 230 and fourth dummy lower wiring patterns 240 of the dummy lower wiring structure pattern.

In an exemplary embodiment of the present inventive concept, the second lower wiring pattern 210, the third dummy lower wiring patterns 220 and 230, and the fourth dummy lower wiring patterns 240 may have shapes and positions similar to those of the first lower wiring pattern 110, the first dummy lower wiring patterns 120 and 130, and the second dummy lower wiring patterns 140, respectively. Thus, the second lower wiring pattern 210 may have a size of the first length L1, the third dummy lower wiring patterns 220 and 230 may have sizes of the second and third lengths L2 and L3, and the fourth dummy lower wiring patterns 240 may have sizes of the fourth length L4.

However, when the first and second masks 100 and 200 are vertically overlapped, the second lower wiring pattern 210, the third dummy lower wiring patterns 220 and 330, and the fourth dummy lower wiring patterns 240 may be horizontally close to but might not vertically overlap the first lower wiring pattern 110, the first dummy lower wiring patterns 120 and 130, and the second dummy lower wiring patterns 140, respectively. Thus, the third dummy lower wiring patterns 220 and 230 having relatively small sizes may be relatively close to the second lower wiring pattern 210, while the fourth dummy lower wiring patterns 240 having relatively large sizes may be relatively distant from the second lower wiring pattern 210.

In an exemplary embodiment of the present inventive concept, each of the lower wiring structure pattern and the dummy lower wiring structure pattern may be divided into two parts. The configuration of the two parts may be substantially the same as the first and second masks 100 and 200, respectively. Thus, patterns of the lower wiring structure pattern and the dummy lower wiring structure pattern may be formed relatively densely.

In an exemplary embodiment of the present inventive concept, the number of the first dummy lower wiring patterns 120 and 130 and the second dummy lower wiring patterns 140 in the first mask 100 may be equal to the number of the third dummy lower wiring patterns 220 and 230 and the fourth dummy lower wiring patterns 240 in the second mask 200, respectively, and thus densities of the first dummy lower wiring patterns 120 and 130 and the second dummy lower wiring patterns 140 in the first mask 100 may be substantially equal to densities of the third dummy lower wiring patterns 220 and 230 and the fourth dummy lower wiring patterns 240 in the second mask 200, respectively. However, exemplary embodiments of the present inventive concept are not limited thereto, and the number of the first dummy lower wiring patterns 120 and 130 and the second dummy lower wiring patterns 140 in the first mask 100 may be different from the number of the third dummy lower wiring patterns 220 and 230 and the fourth dummy lower wiring patterns 240 in the second mask 200, respectively, and thus the densities of the first dummy lower wiring patterns 120 and 130 and the second dummy lower wiring patterns 140 in the first mask 100 may be different from the densities of the third dummy lower wiring patterns 220 and 230 and the fourth dummy lower wiring patterns 240 in the second mask 200, respectively.

In an exemplary embodiment of the present inventive concept, the lower wiring structure pattern and the dummy lower wiring structure pattern may be divided into a plurality of parts greater than two parts and the layouts thereof may be formed using a plurality of masks, respectively. Alternatively, the lower wiring structure pattern and the dummy lower wiring structure pattern need not be divided into a plurality of parts, and the layout thereof may be formed using one mask, e.g., the first mask 100. A case in which the patterns are divided into two parts and the layouts thereof are formed by two masks will be described in more detail below; however, exemplary embodiments of the present inventive concept are not limited thereto.

FIG. 1 shows the first lower wiring pattern 110 is formed in the first region I of the first mask 100, and FIG. 3 shows the second lower wiring pattern 210 is formed in the second region II of the second mask 200, however, exemplary embodiments of the present inventive concept are not limited thereto. Thus, the first lower wiring pattern 110 may be formed in the second region II of the first mask 100, and the second lower wiring pattern 210 may be formed in the first region I of the second mask 200.

Figure 4:
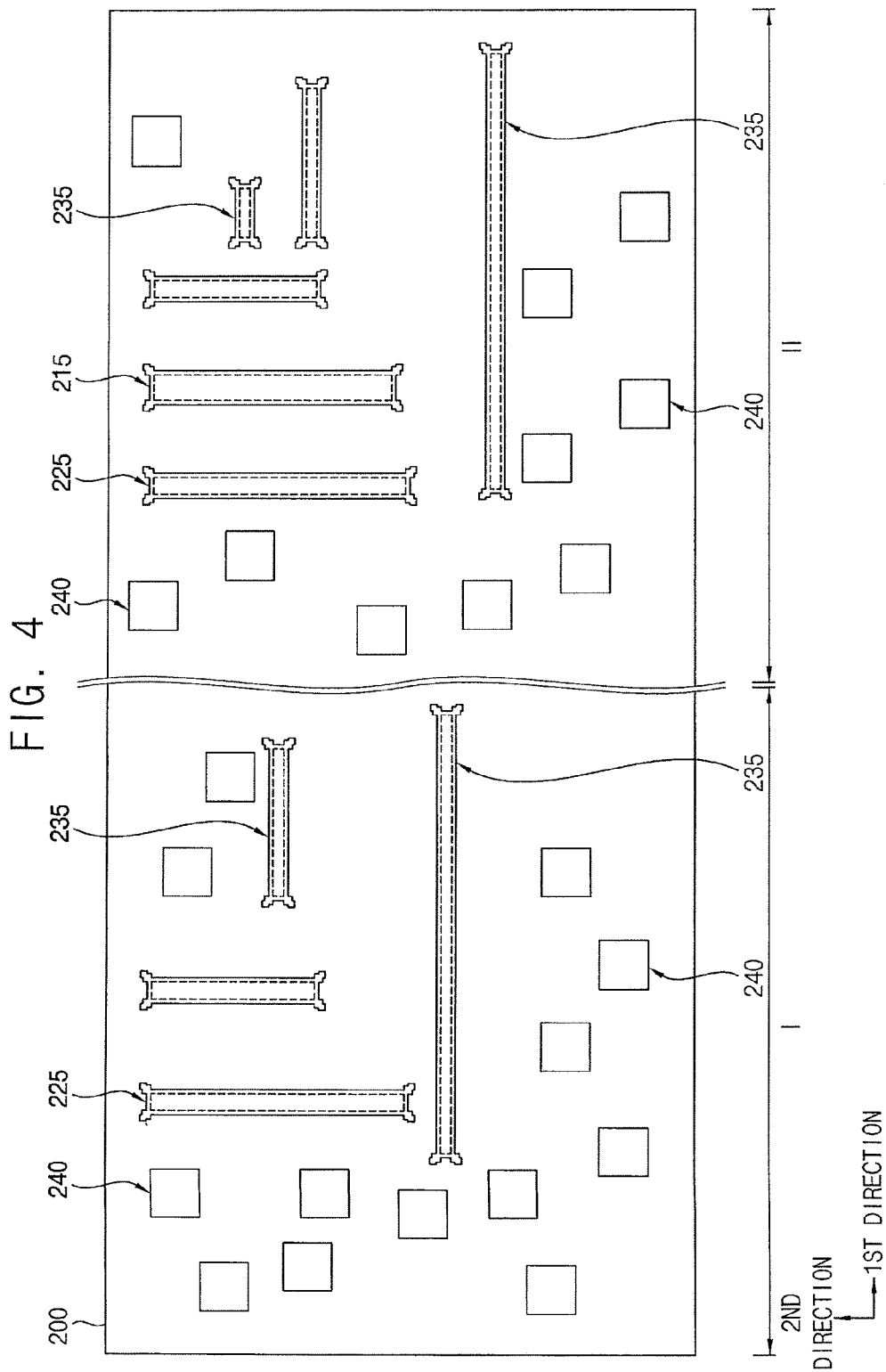

Referring to FIG. 4, a process substantially the same as or similar to that described above with reference to FIG. 2 may be performed.

Thus, an OPC may be performed on the second mask 200 including the second lower wiring pattern 210, the third dummy lower wiring patterns 220 and 230, and the fourth dummy lower wiring patterns 240.

In an exemplary embodiment of the present inventive concept, the OPC may be performed on the second lower wiring pattern 210 and the third dummy lower wiring patterns 220 and 230 having sizes less than the predetermined size, and need not be performed on the fourth dummy lower wiring patterns 240 having sizes equal to or greater than the predetermined size.

After the OPC, the layout of the second mask 200 may be corrected. That is, the second mask 200 may include a corrected second lower wiring pattern 215, corrected second dummy lower wiring patterns 225 and 235, and the fourth dummy lower wiring patterns 240.

Figure 5:
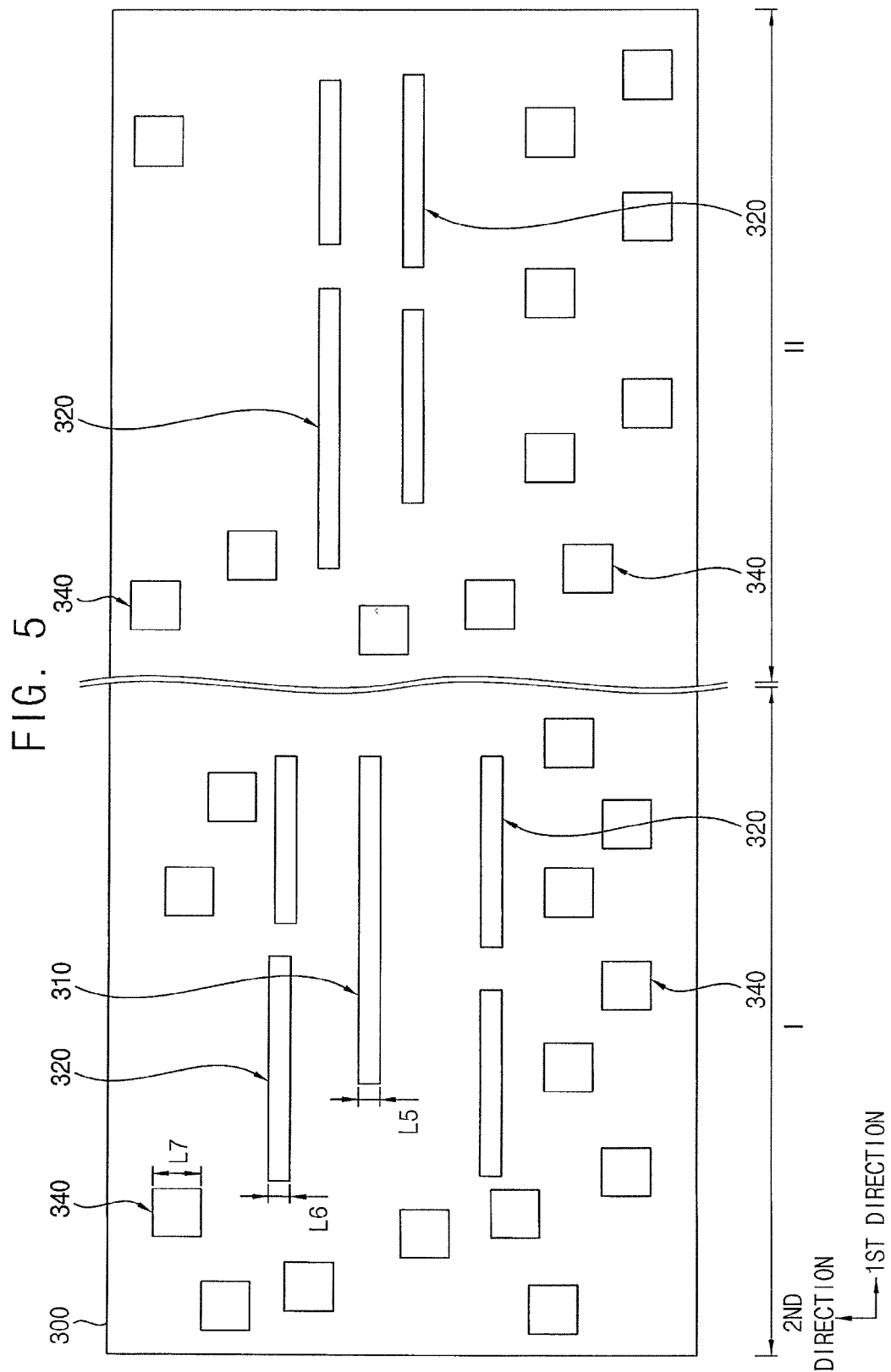

Referring to FIG. 5, a layout of a third mask 300 including a portion of an upper wiring structure pattern and a portion of a dummy upper wiring structure pattern may be formed.

The third mask 300 may include the first and second regions I and II, as the first and second masks 100 and 200. The layout of the third mask 300 may be formed with the third mask 300 not vertically overlapping the first and second masks 100 and 200, and layouts of all masks subsequently formed may be substantially the same.

The third mask 300 may include a first upper wiring pattern 310 of the upper wiring structure pattern, and first dummy upper wiring patterns 320 and second dummy upper wiring patterns 340 of the dummy upper wiring structure pattern. FIG. 5 shows that all of the first dummy upper wiring patterns 320 extend in the first direction; however, exemplary embodiments of the present inventive concept are not limited thereto. That is, the dummy upper wiring structure pattern may include first dummy wiring patterns extending in the second direction.

The first upper wiring pattern 310, the first dummy upper wiring patterns 320, and the second dummy upper wiring patterns 340 may have shapes similar to those of the first lower wiring pattern 110, the first dummy lower wiring patterns 120, and the second dummy lower wiring patterns 140, respectively, or those of the second lower wiring pattern 210, the third dummy lower wiring patterns 220, and the fourth dummy lower wiring patterns 2140, respectively.

That is, each of the first upper wiring pattern 310, the first dummy upper wiring patterns 320, and the second dummy upper wiring patterns 340 may have a shape of a rectangle or a square in a plan view. Sizes of the first upper wiring pattern 310, the first dummy upper wiring patterns 320, and the second dummy upper wiring patterns 340 may have fifth, sixth and seventh lengths L5, L6 and L7, respectively.

In an exemplary embodiment of the present inventive concept, the fifth and sixth lengths L5 and L6 e.g., the sizes of the first upper wiring pattern 310 and the first dummy upper wiring patterns 320) may be less than the sixth length L6 (e.g., the sizes of the second dummy upper wiring patterns 340). That is, the size of each of the first upper wiring pattern 310 and the first dummy upper wiring patterns 320 may be less than the predetermined size, and the size of each of the second dummy upper wiring patterns 340 may be equal to or greater than the predetermined size.

In an exemplary embodiment of the present inventive concept, the first upper wiring pattern 310 may at least partially vertically overlap the lower wiring structure pattern, and each of the first dummy upper wiring patterns 320 and the second dummy upper wiring patterns 340 may at least partially vertically overlap the dummy lower wiring structure pattern.

For example, the first upper wiring pattern 310 may at least partially vertically overlap the first lower wiring pattern 110 and/or the second lower wiring pattern 210 of the lower wiring structure pattern. Each of the first dummy upper wiring patterns 320 may at least partially vertically overlap the first dummy lower wiring patterns 120 and 130 or the third dummy lower wiring patterns 220 and 230 of the dummy lower wiring structure pattern, and each of the second dummy upper wiring patterns 340 may at least partially vertically overlap the second dummy lower wiring patterns 140 or the fourth dummy lower wiring patterns 240 of the dummy lower wiring structure pattern.

Figure 6:
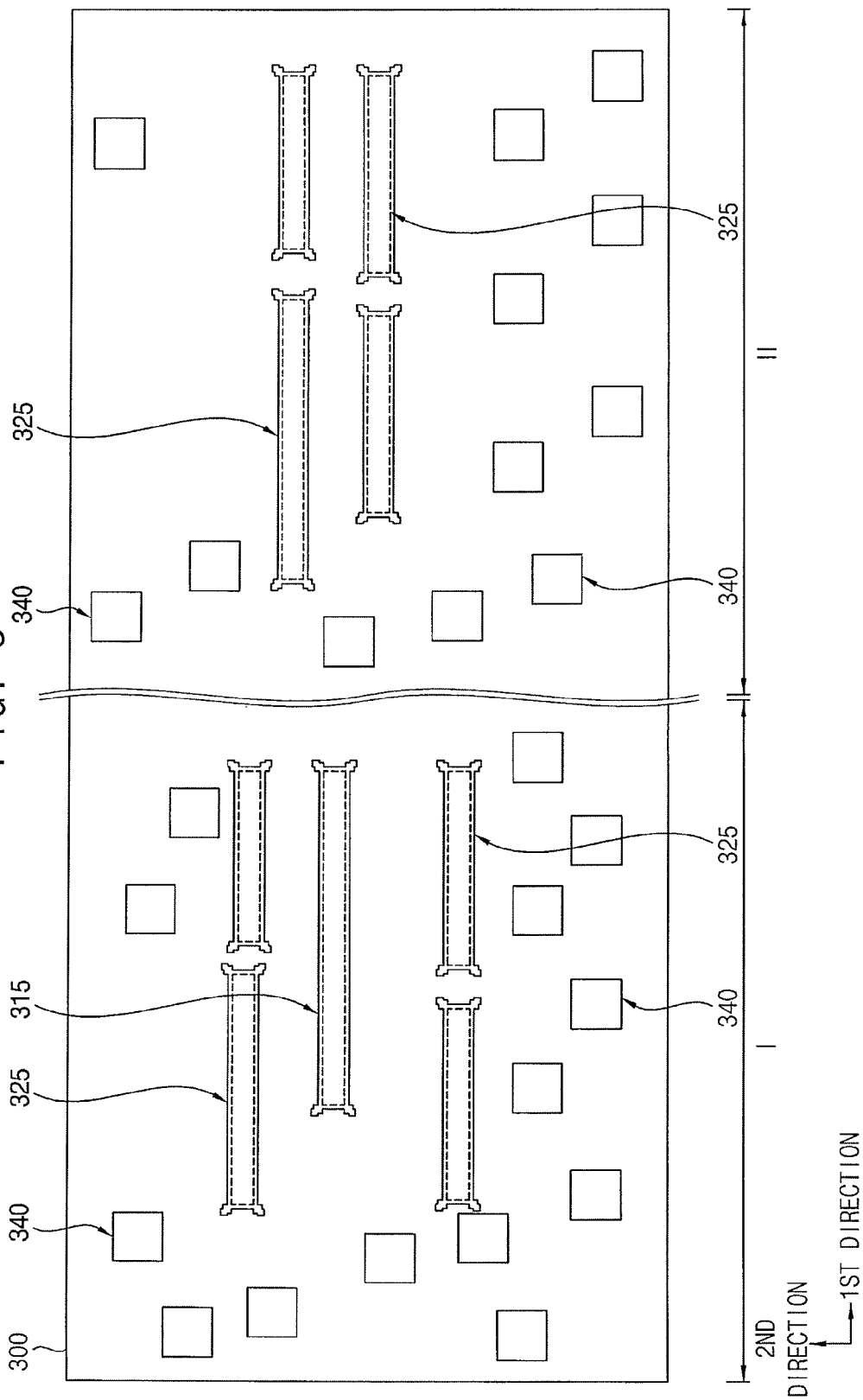

Referring to FIG. 6, a process substantially the same as or similar to that described above with reference to FIG. 2 may be performed.

Thus, an OPC may be performed on the third mask 300 including the first upper wiring pattern 310, the first dummy upper wiring patterns 320, and the second dummy upper wiring patterns 340.

For example, the OPC may be performed on the first upper wiring pattern 310 and the first dummy upper wiring patterns 320 having sizes less than the predetermined size, and need not be performed on the second dummy upper wiring patterns 340 having sizes equal to or greater than the predetermined size.

After the OPC, the layout of the third mask 300 may be corrected. That is, the third mask 300 may include a corrected first upper wiring pattern 315, corrected first dummy upper wiring patterns 325, and the second dummy upper wiring patterns 340.

Figure 7:
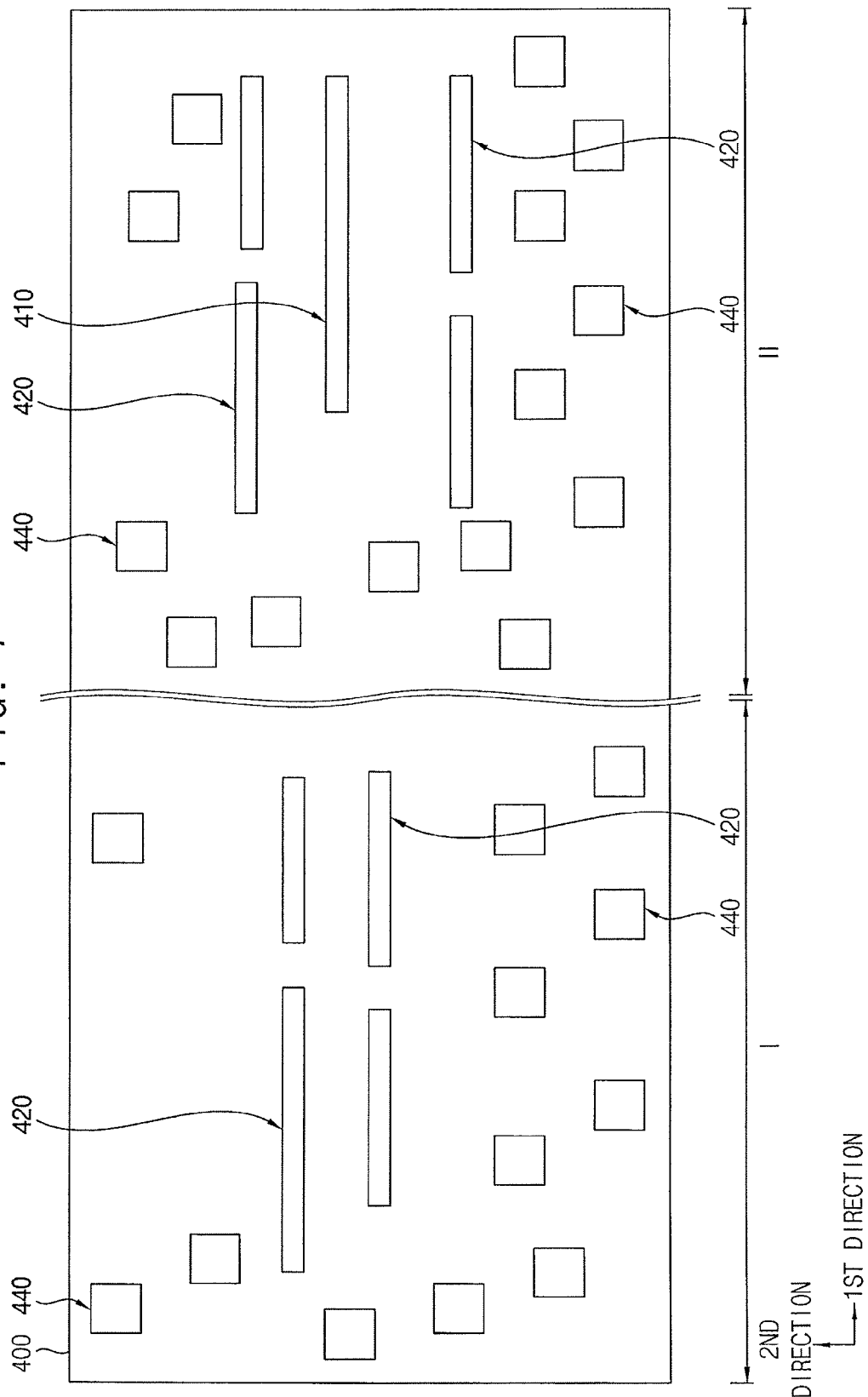

Referring to FIG. 7, a process substantially the same as or similar to that described above with reference to FIG. 5 may be performed.

That is, a layout of a fourth mask 400 including other portions of the upper wiring structure pattern and other portions of the dummy upper wiring structure pattern may be formed.

For example, the fourth mask 400 may include a second upper wiring pattern 410 of the upper wiring structure pattern, and third dummy upper wiring patterns 420 and fourth dummy upper wiring patterns 440 of the dummy upper wiring structure pattern.

In an exemplary embodiment of the present inventive concept, the second upper wiring pattern 410, the third dummy upper wiring patterns 420, and the fourth dummy upper wiring patterns 440 may have shapes similar to those of the first upper wiring pattern 310, the first dummy upper wiring patterns 320, and the second dummy upper wiring patterns 340, respectively. Thus, sizes of the second upper wiring pattern 410, the third dummy upper wiring patterns 420, and the fourth dummy upper wiring patterns 440 may be the fifth, sixth and seventh lengths L5, L6 and L7, respectively.

However, when the third and fourth masks 300 and 400 are vertically overlapped, the second upper wiring pattern 410, the third dummy upper wiring patterns 420 and the fourth dummy upper wiring patterns 440 may be horizontally close to but might not vertically overlap the first upper wiring pattern 310, the first dummy upper wiring patterns 320 and the second dummy wiring patterns 340, respectively. Thus, the third dummy upper wiring patterns 420 having relatively small sizes may be relatively close to the second upper wiring pattern 410, while the fourth dummy upper wiring patterns 440 having relatively large sizes may be relatively distant from the second upper wiring pattern 410.

In an exemplary embodiment of the present inventive concept, each of the upper wiring structure pattern and the dummy upper wiring structure pattern may be divided into a plurality of parts (e.g., two parts) and the layouts thereof may be formed by the third and fourth masks 300 and 400, respectively. Alternatively, each of the upper wiring structure pattern and the dummy upper wiring structure pattern need not be divided into a plurality of parts, and the layout thereof may be formed by only one mask (e.g., the third mask 300). A case in which the patterns are divided into two parts will be described in more detail below; however, exemplary embodiments of the present inventive concept are not limited thereto.

Figure 8:
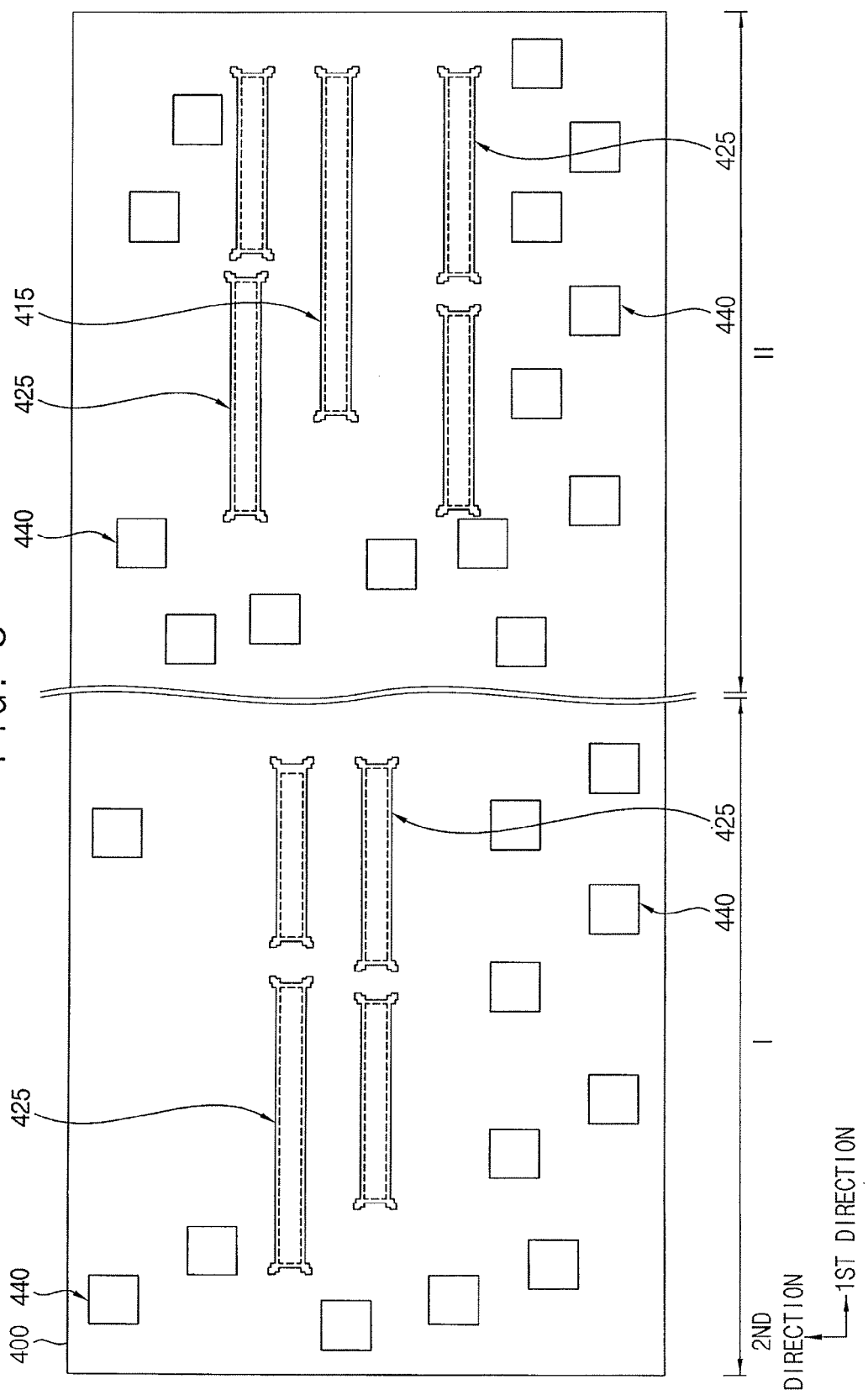

Referring to FIG. 8, a process substantially the same as or similar to that described above with reference to FIG. 6 may be performed.

Thus, an OPC may be performed on the fourth mask 400 including the second upper wiring pattern 410, the third dummy upper wiring patterns 420, and the fourth dummy upper wiring patterns 440.

In an exemplary embodiment of the present inventive concept, the OPC may be performed on the second upper wiring pattern 410 and the third dummy upper wiring patterns 420 having sizes less than the predetermined size, and need not be performed on the fourth dummy upper wiring patterns 440 having sizes equal to or greater than the predetermined size.

After the OPC, the layout of the fourth mask 400 may be corrected. That is, the fourth mask 400 may include a corrected second upper wiring pattern 415, corrected third dummy upper wiring patterns 425, and the fourth dummy upper wiring patterns 440.

Figure 9:
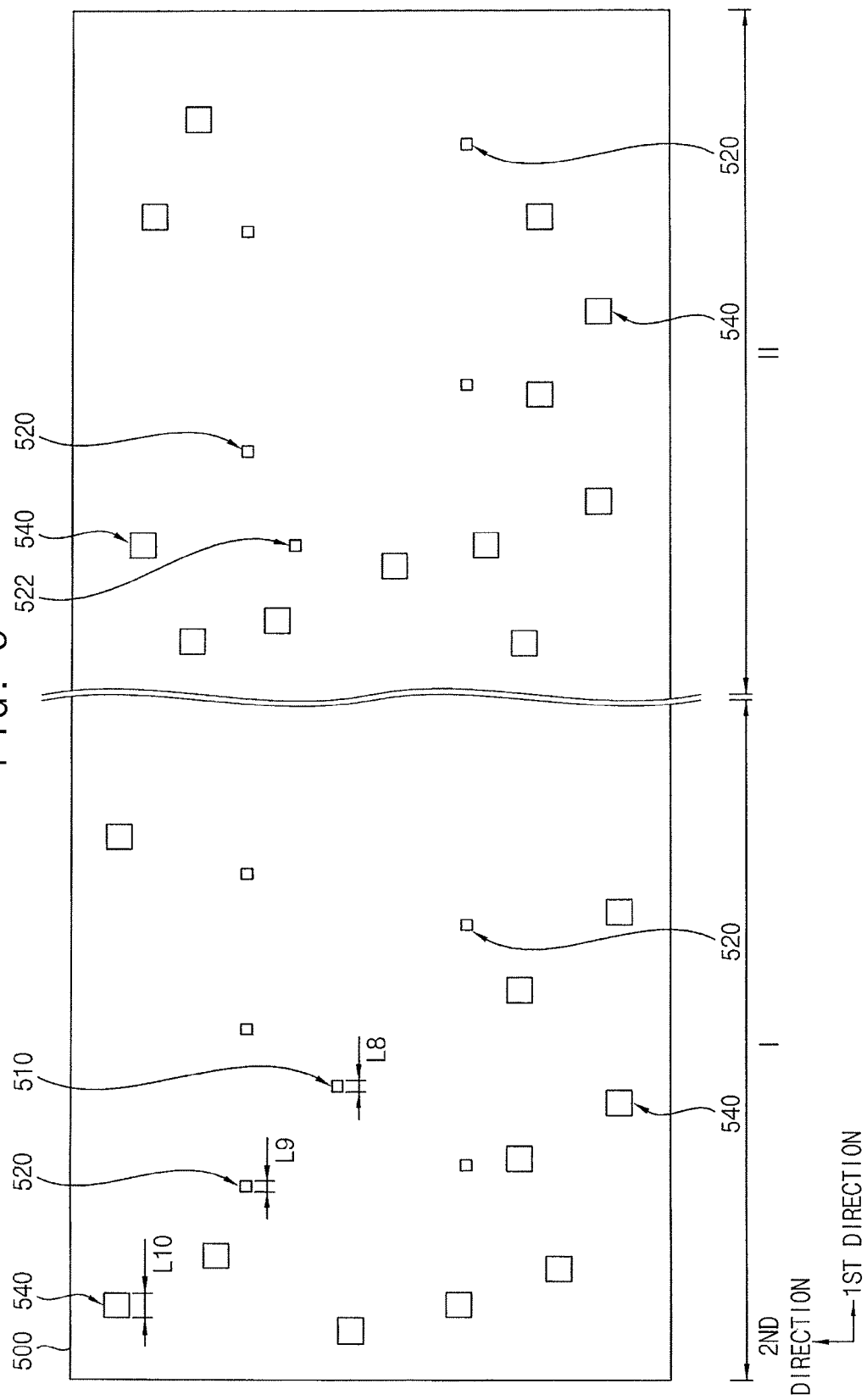

Referring to FIG. 9, a layout of a fifth mask 500 including a portion of a via structure and a portion of a dummy via structure pattern may be formed.

The fifth mask 500 may include a first via pattern 510 of the via structure pattern, and first dummy via patterns 520 and 522 and second dummy via patterns 540 of the dummy via structure pattern.

In an exemplary embodiment of the present inventive concept, each of the first via pattern 510, the first dummy via patterns 520 and 522, and the second dummy via patterns 540 may have a shape of a square in a plan view; however, exemplary embodiments of the present inventive concept are not limited thereto.

In an exemplary embodiment of the present inventive concept, the first via pattern 510, the first dummy via patterns 520 and 522, and the second dummy via patterns 540 may have sizes of eighth, ninth, and tenth lengths L8, L9 and L10, respectively.

In an exemplary embodiment of the present inventive concept, the eighth and ninth lengths L8 and L9 (e.g., the sizes of the first via pattern 510 and the first dummy via patterns 520 and 522) may be less than the tenth length L10 (e.g., the sizes of the second dummy via patterns 540). The sizes of the first via pattern 510 and the first dummy via patterns 520 and 522 may be less than the predetermined size, and the sizes of the second dummy via patterns 540 may be equal to or greater than the predetermined size.

In an exemplary embodiment of the present inventive concept, the first dummy via patterns 520 and 522 may be relatively close to the first via pattern 510, and the second dummy via patterns 540 may be relatively distant from the first via pattern 510.

In an exemplary embodiment of the present inventive concept, the first via pattern 510 may vertically overlap the lower wiring structure pattern and the upper wiring structure pattern, and each of the first dummy via patterns 520 and 522 and the second dummy via patterns 540 may vertically overlap the dummy lower wiring structure pattern and the dummy upper wiring structure pattern.

For example, the first via pattern 510 may vertically overlap one of the first and second lower wiring patterns 110 and 210 of the lower wiring structure pattern, and one of the first and second upper wiring patterns 310 and 410 of the upper wiring structure pattern.

Each of the first dummy via patterns 520 may vertically overlap one of the first and third dummy lower wiring patterns 120, 130, 220 and 230 of the dummy lower wiring structure pattern, and one of the first and third dummy upper wiring patterns 320 and 420 of the dummy upper wiring structure pattern. In an exemplary embodiment of the present inventive concept, each of the first dummy via patterns 522 may vertically overlap one of the second and fourth dummy lower wiring patterns 140 and 240 of the dummy lower wiring structure pattern, and one of the first and third dummy upper wiring patterns 320 and 420 of the dummy upper wiring structure pattern.

Each of the second dummy via patterns 540 may vertically overlap one of the second and fourth dummy lower wiring patterns 140 and 240 of the dummy lower wiring structure pattern, and one of the second and fourth dummy upper wiring patterns 340 and 440 of the dummy upper wiring structure pattern.

Figure 10:
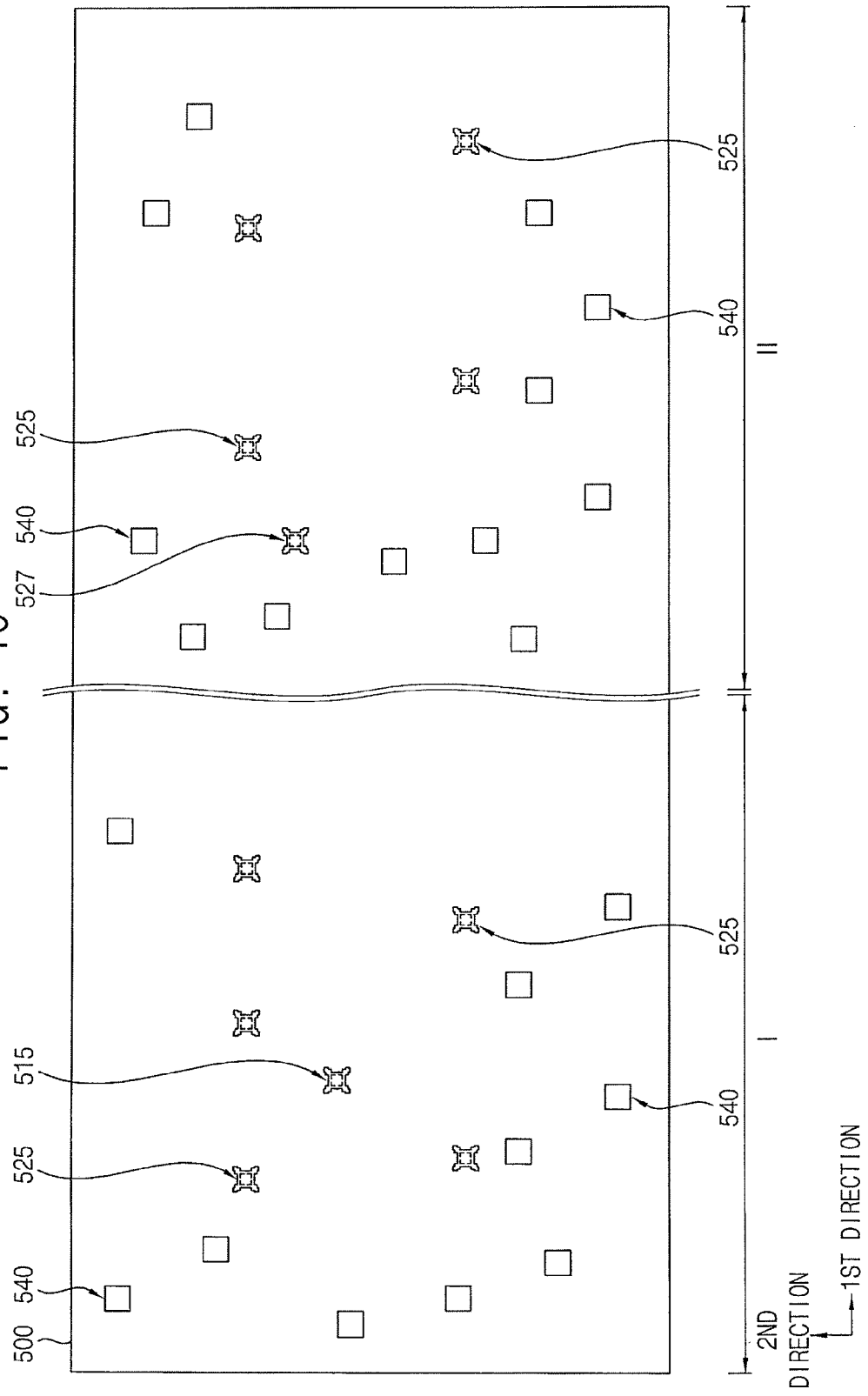

Referring to FIG. 10, a process substantially the same as or similar to that described above with reference to FIG. 2 may be performed.

Thus, an OPC may be performed on the fifth mask 500 including the first via pattern 510, the first dummy via patterns 520 and 522, and the second dummy via patterns 540. That is, the OPC may be performed on the first via pattern 510 and the first dummy via patterns 520 and 522 having sizes less than the predetermined size, and need not be performed on the second dummy via patterns 540 having sizes equal to or greater than the predetermined size.

After the OPC, the layout of the fifth mask 500 may be corrected. That is, the fifth mask 500 may include a corrected first via pattern 515, corrected first dummy via patterns 525 and 527, and the second dummy via patterns 540.

Figure 11:
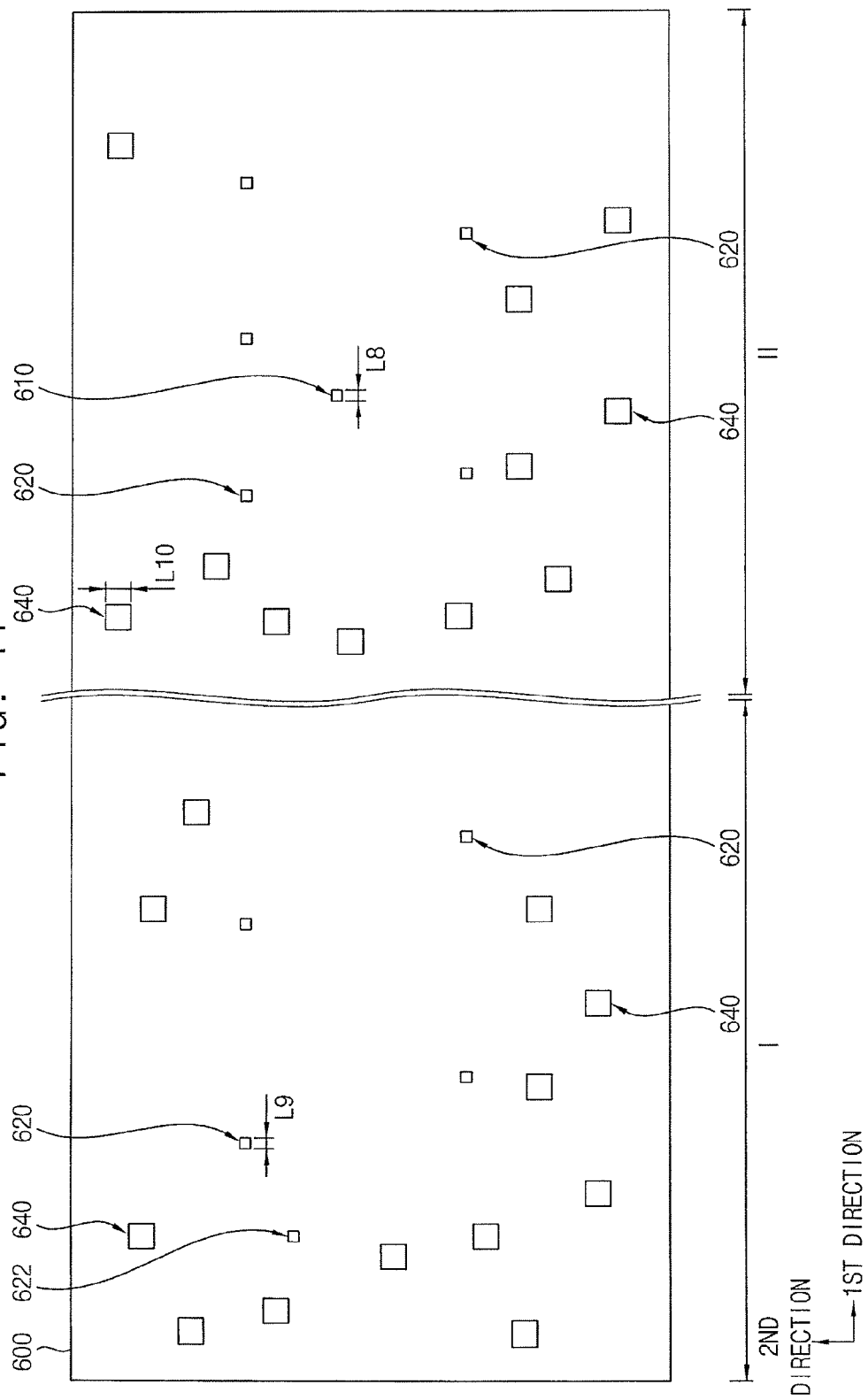

Referring to FIG. 11, a process substantially the same as or similar to that described with reference to FIG. 9 may be performed.

Thus, a sixth mask 600 may include a second via pattern 610 of the via structure pattern, and third dummy via patterns 620 and 622 and fourth dummy via patterns 640 of the dummy via structure pattern.

In an exemplary embodiment of the present inventive concept, the second via pattern 610, the third dummy via patterns 620 and 622, and the fourth dummy via patterns 640 may have shapes and positions similar to those of the first via pattern 510, the first dummy via patterns 520 and 522, and the second dummy via patterns 540, respectively. Thus, the second via pattern 610, the third dummy via patterns 620 and 622, and the fourth dummy via patterns 640 may have sizes of the eighth, ninth, and tenth lengths L8, L9, and L10, respectively.

In an exemplary embodiment of the present inventive concept, the eighth and ninth lengths L8 and L9 (e.g., the sizes of the second via pattern 610 and the third dummy via patterns 620 and 622) may be less than the tenth length L10 (e.g., the sizes of the fourth dummy via patterns 640). The sizes of the second via pattern 610 and the third dummy via patterns 620 and 622 may be less than the predetermined size, and the sizes of the fourth dummy via patterns 640 may be equal to or greater than the predetermined size.

In an exemplary embodiment of the present inventive concept, the third dummy via patterns 620 and 622 may be relatively close to the second via pattern 610, and the fourth dummy via patterns 640 may be relatively distant from the second via pattern 610.

In an exemplary embodiment of the present inventive concept, the second via pattern 610 may vertically overlap one of the first and second lower wiring patterns 110 and 210 of the lower wiring structure pattern, and one of the first and second upper wiring patterns 310 and 410 of the upper wiring structure pattern.

Each of the third dummy via patterns 620 may vertically overlap one of the first and third dummy lower wiring patterns 120, 130, 220 and 230 of the dummy lower wiring structure pattern, and one of the first and third dummy upper wiring patterns 320 and 420 of the dummy upper wiring structure pattern. In an exemplary embodiment of the present inventive concept, each of the third dummy via patterns 622 may vertically overlap one of the second and fourth dummy lower wiring patterns 140 and 240 of the dummy lower wiring structure pattern, and one of the first and third dummy upper wiring patterns 320 and 420 of the dummy upper wiring structure pattern.

Each of the fourth dummy via patterns 640 may vertically overlap one of the second and fourth dummy lower wiring patterns 140 and 240 of the dummy lower wiring structure pattern, and one of the second and fourth dummy upper wiring patterns 340 and 440 of the dummy upper wiring structure pattern.

Figure 12:
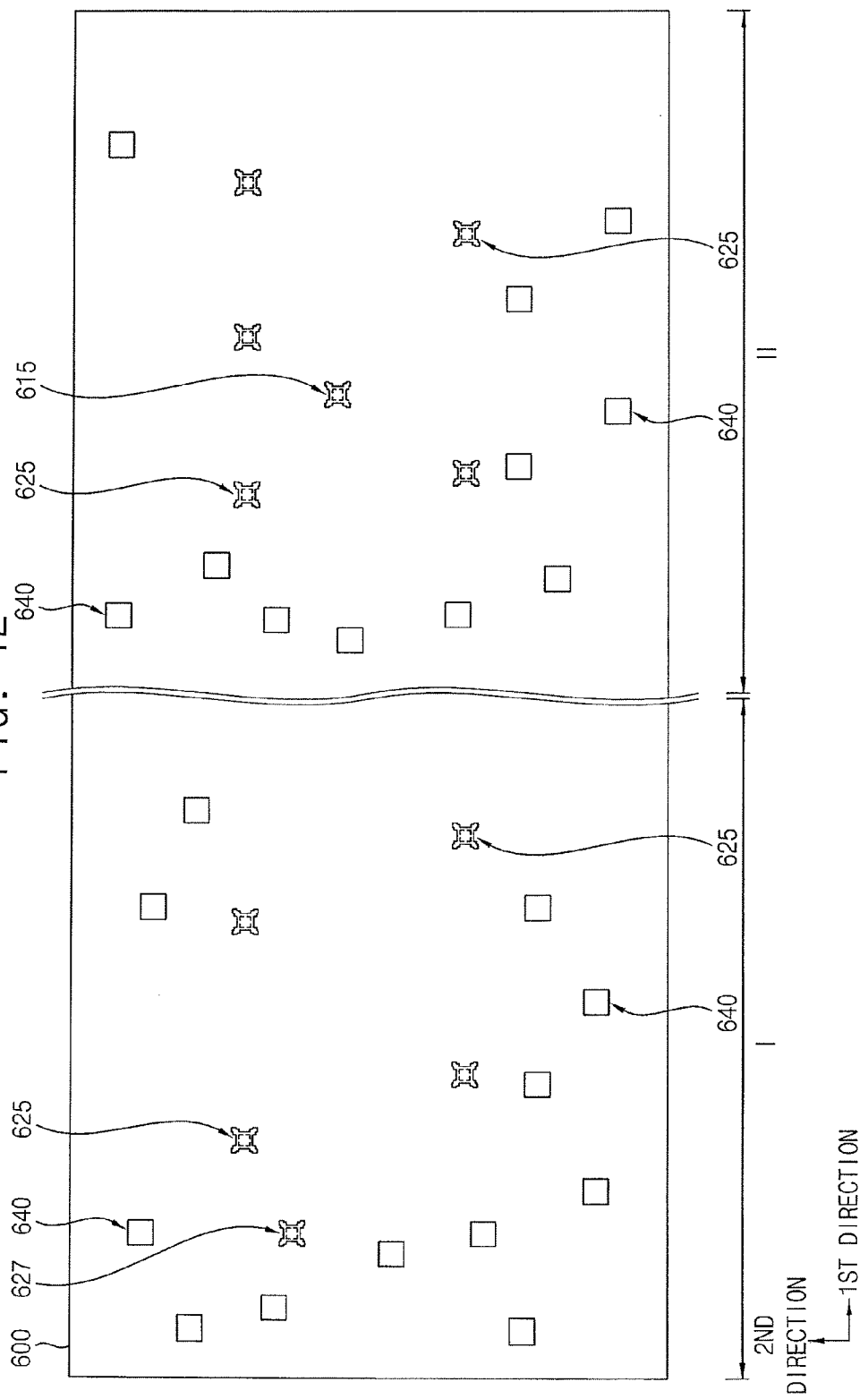
Figure 13:
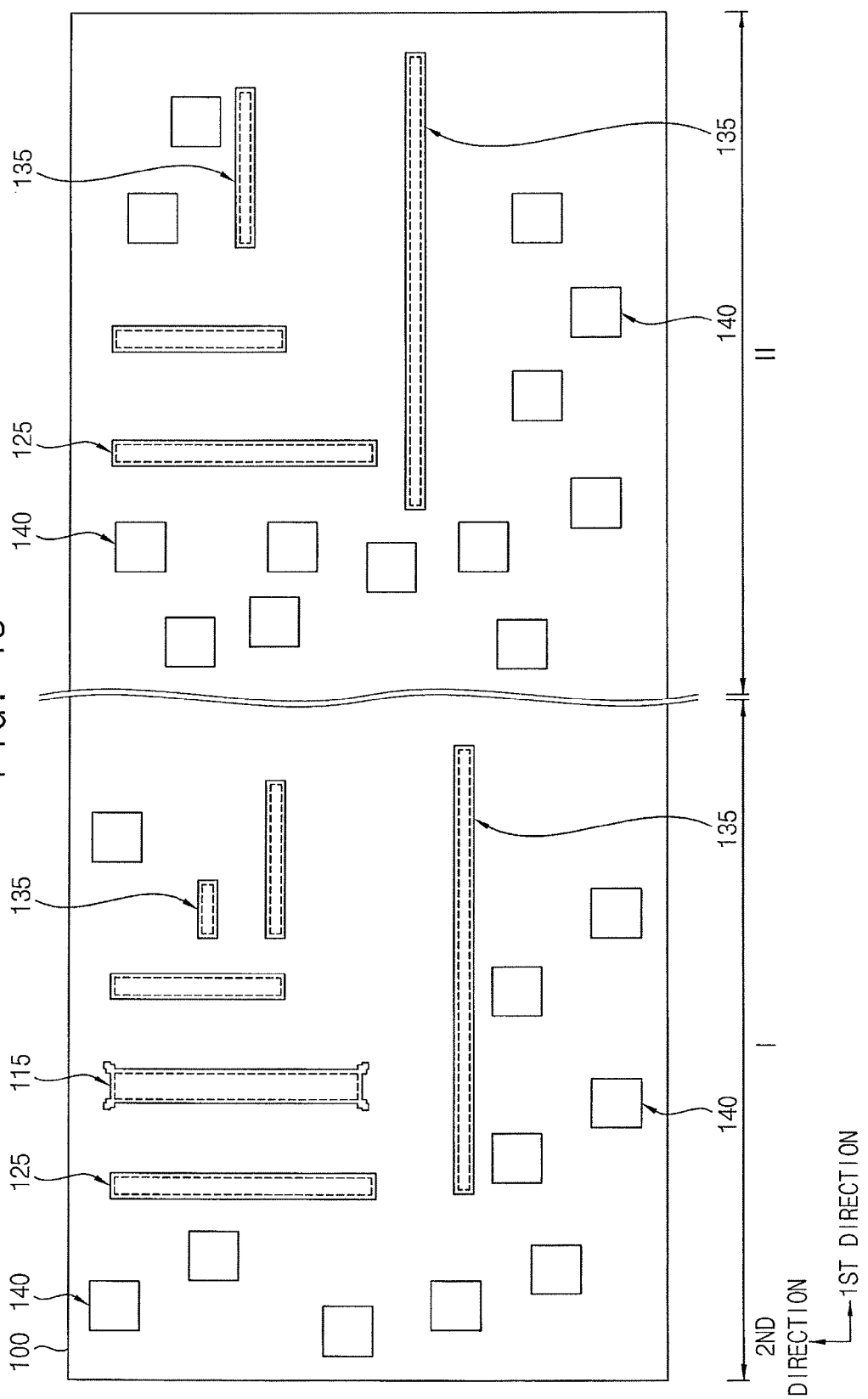
FIGS. 13 to 18 are plan views illustrating a method of forming a wiring structure in accordance with one or more exemplary embodiments of the present inventive concept.
Figure 14:
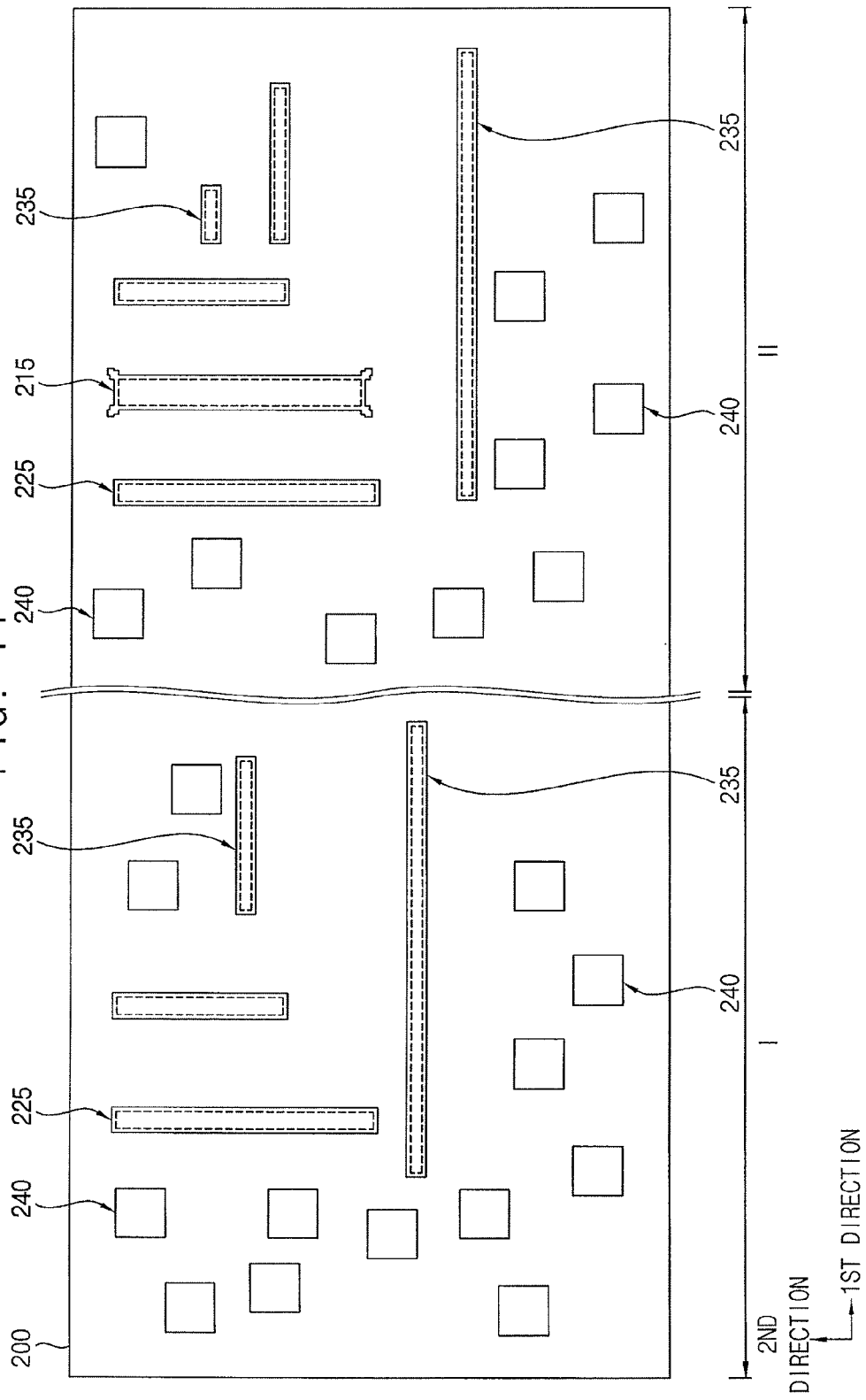
Figure 15:
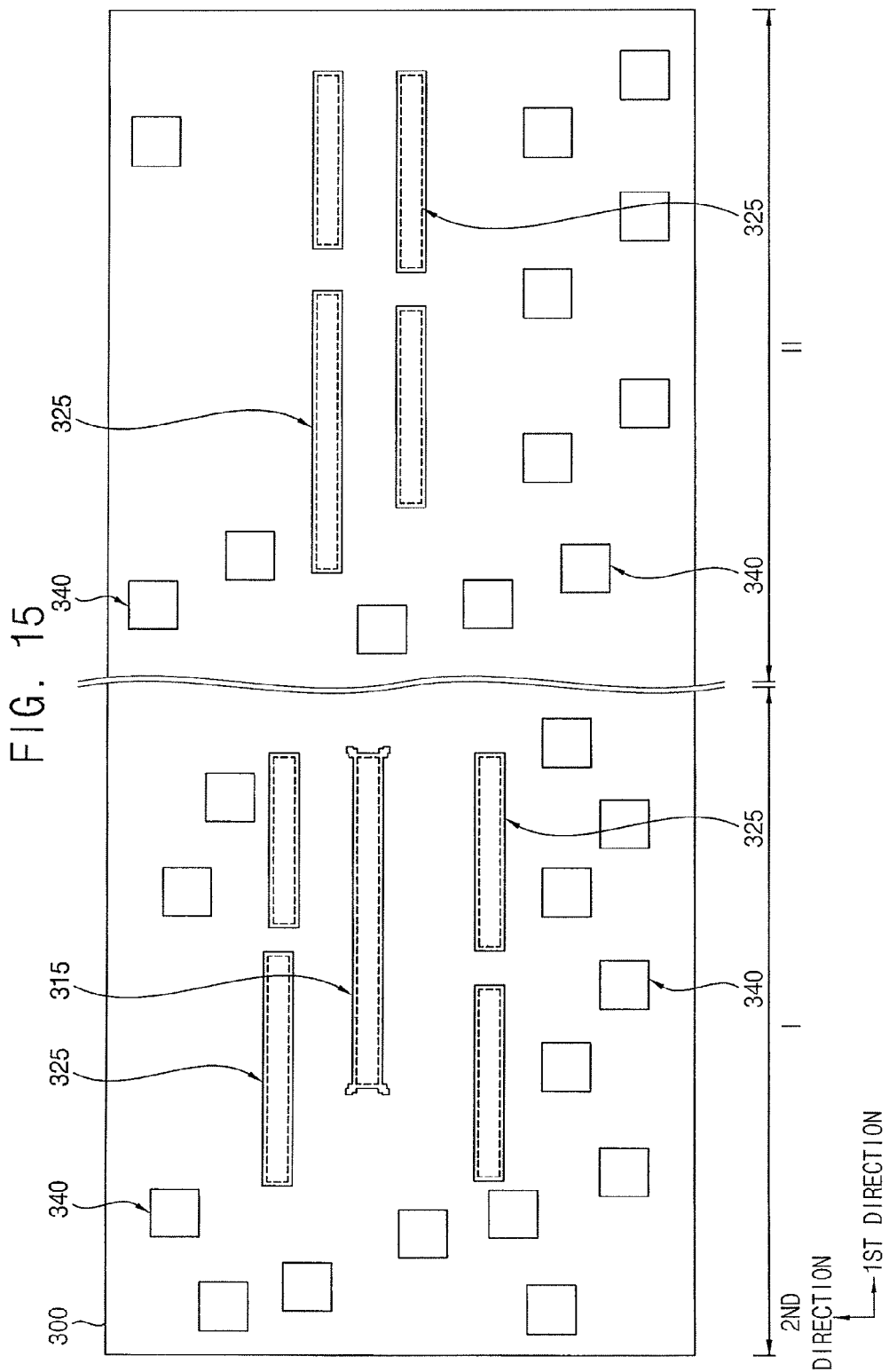
Figure 16:
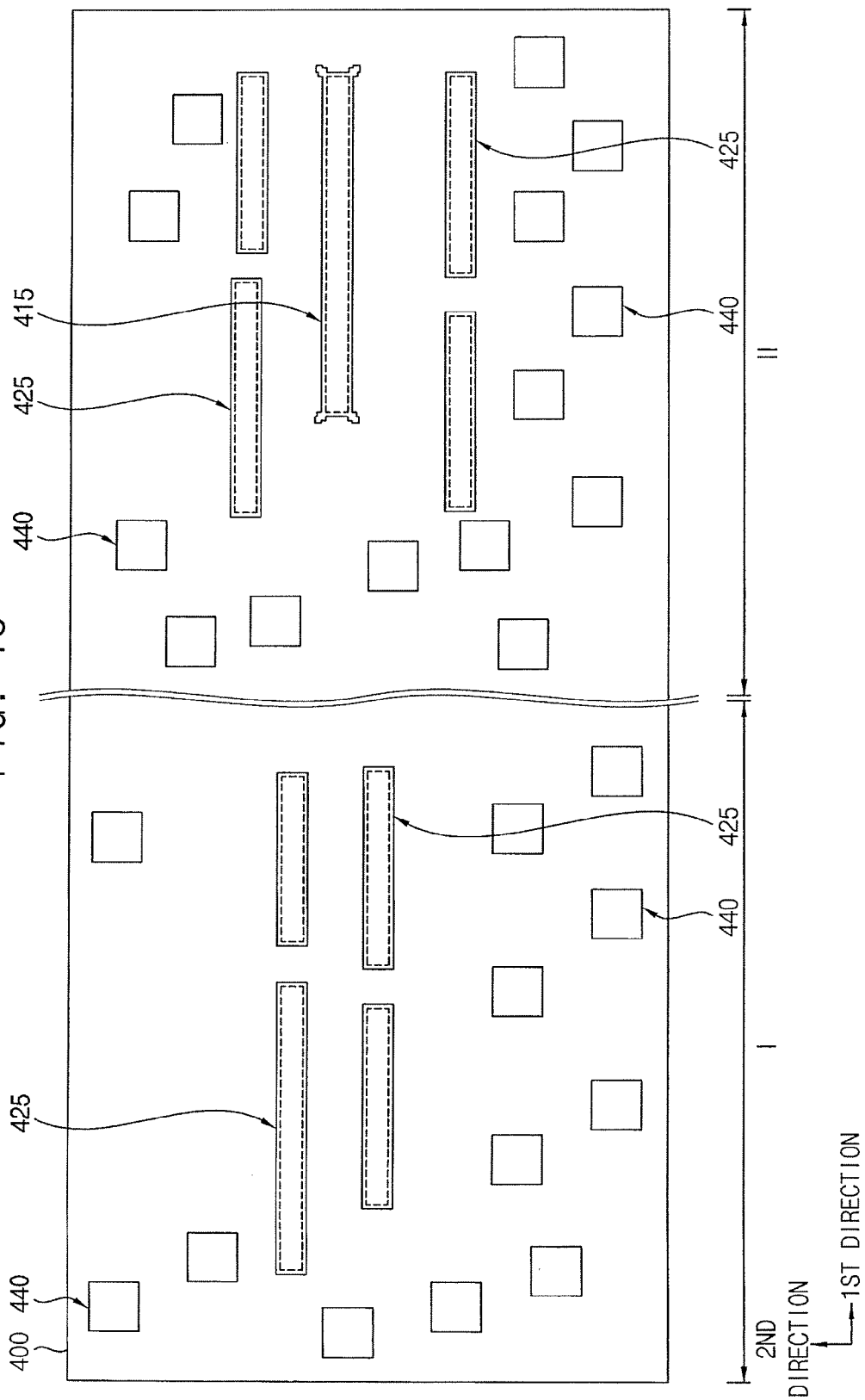
Figure 17:
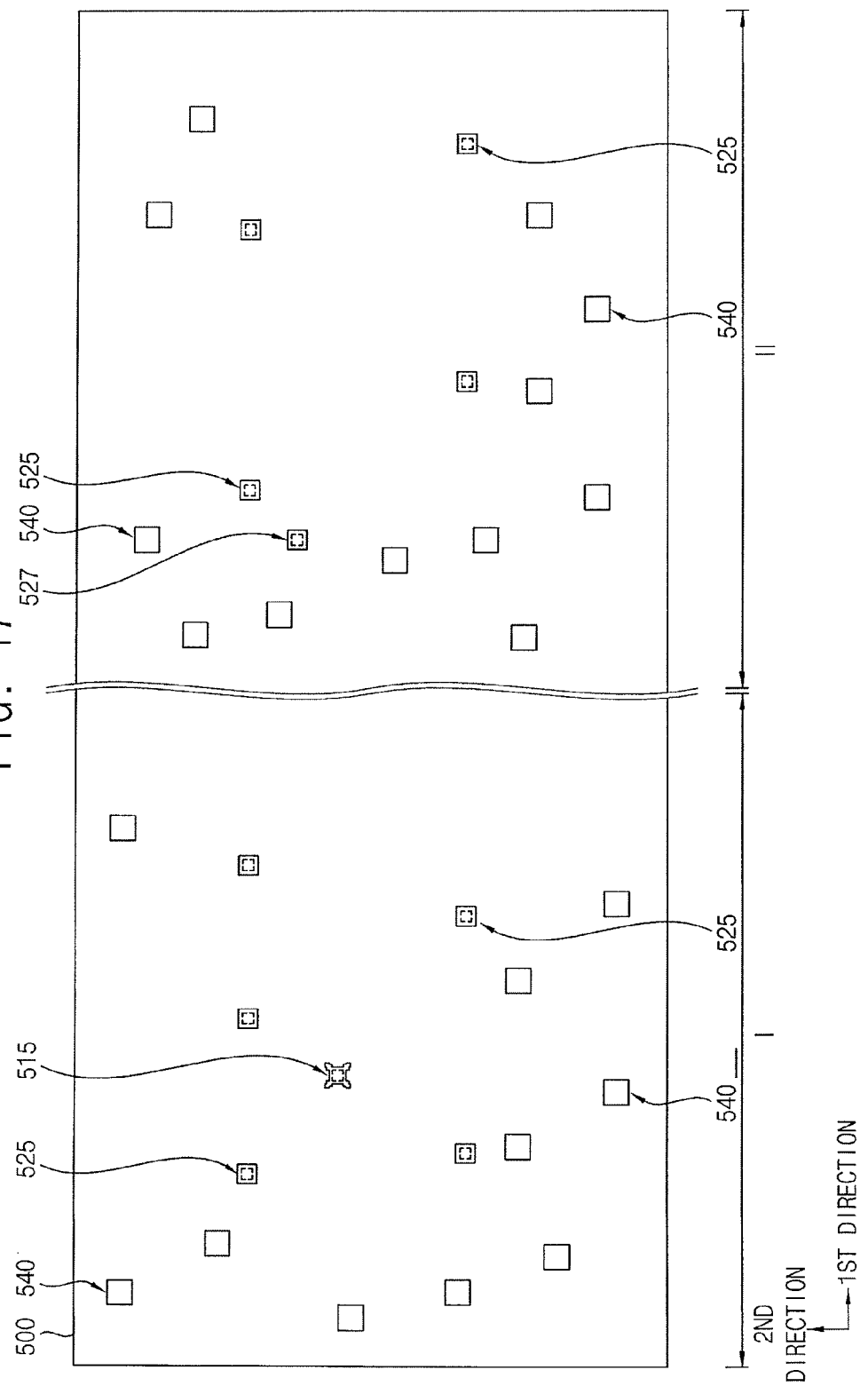
Figure 18:
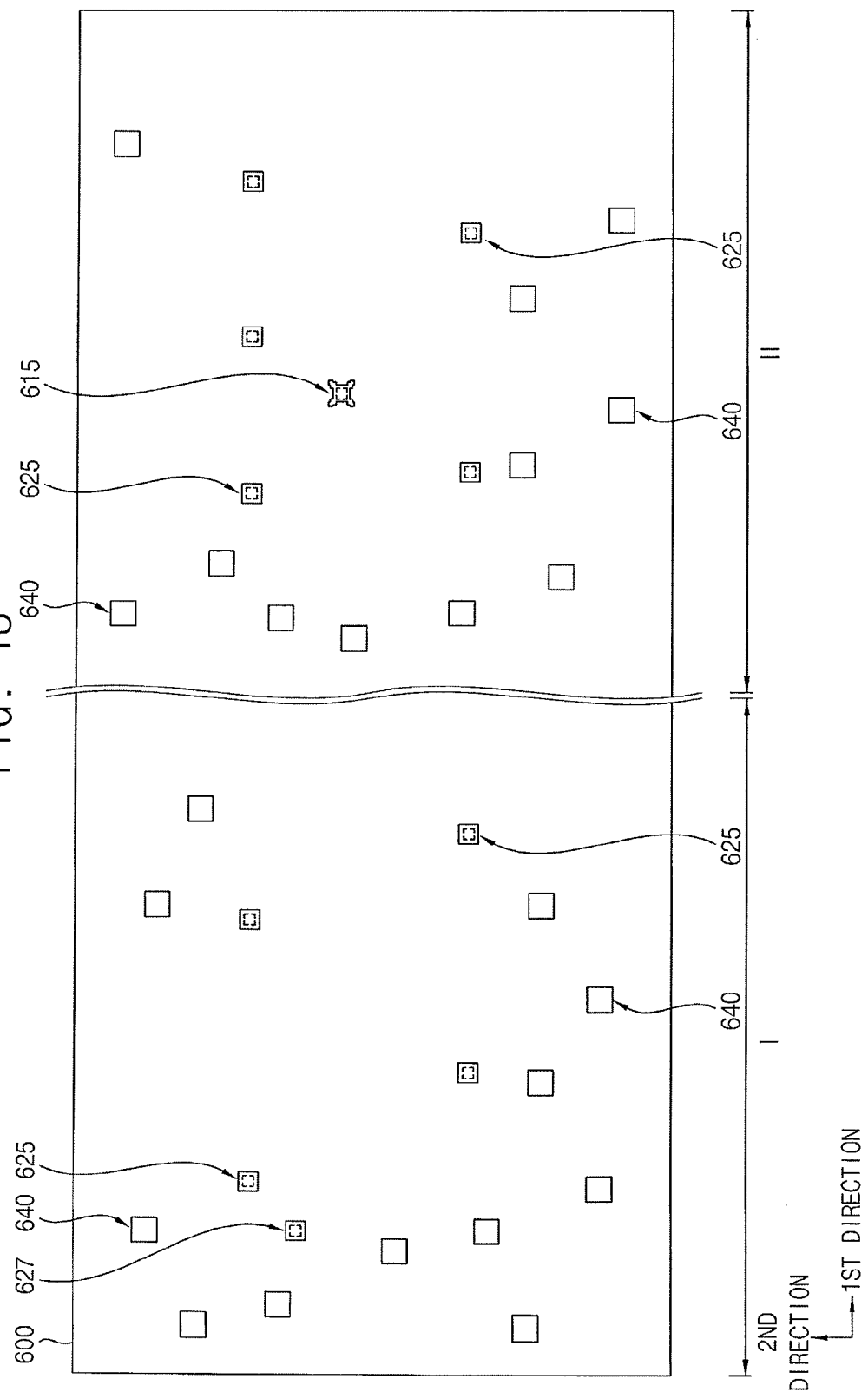

Referring to FIG. 12, a process substantially the same as or similar to that described above with reference to FIG. 2 may be performed.

Thus, an OPC may be performed on the sixth mask 600 including the second via pattern 610, the third dummy via patterns 620 and 622, and the fourth dummy via patterns 640. That is, the OPC may be performed on the second dummy via pattern 610 and the third dummy via patterns 620 and 622 having sizes less than the predetermined size, and the OPC need not be performed on the fourth dummy via patterns 640 having sizes equal to or greater than the predetermined size.

After the OPC, the layout of the sixth mask 600 may be corrected. That is, the sixth mask 600 may include a corrected second via pattern 615, corrected third dummy via patterns 625 and 627, and the fourth dummy via patterns 640.

The first and third dummy lower wiring patterns 120, 130, 220 and 230, the first and third dummy upper wiring patterns 320 and 420, and the first and third dummy via patterns 520 and 620 may be formed relatively close to the first and second lower wiring patterns 110 and 210, the first and second upper wiring patterns 310 and 410, and the first and second via patterns 510 and 610, respectively, having the sizes less than the predetermined size. Thus, when the patterns are formed by a photo process and an etching process, the first and second lower wiring patterns 110 and 210, the first and second upper wiring patterns 310 and 410, and the first and second via patterns 510 and 610 need not be influenced by the first and third dummy lower wiring patterns 120, 130, 220 and 230, the first and third dummy upper wiring patterns 320 and 420, and the first and third dummy via patterns 520 and 620, and thus may be formed to have desired sizes and/or shapes and an occurrence of size distortion may be reduced or eliminated.

The OPC may be performed not only on the first and second lower wiring patterns 110 and 210, the first and second upper wiring patterns 310 and 410, and the first and second via patterns 510 and 610 having the relatively small sizes less than the predetermined size, but also on the first and third dummy lower wiring patterns 120, 130, 220 and 230, the first and third dummy upper wiring patterns 320 and 420, and the first and third dummy via patterns 520 and 620 having the relatively small sizes less than the predetermined size. The first and third dummy lower wiring patterns 120, 130, 220 and 230, the first and third dummy upper wiring patterns 320 and 420, and the first and third dummy via patterns 520 and 620 may have desired sizes and/or shapes in the photo process and the etching process. Thus, all of the first and second lower wiring patterns 110 and 210, the first and second upper wiring patterns 310 and 410, and the first and second via patterns 510 and 610 relatively close to the first and third dummy lower wiring patterns 120, 130, 220 and 230, the first and third dummy upper wiring patterns 320 and 420, and the first and third dummy via patterns 520 and 620 may have desired sizes and/or shapes.

For example, the first and third dummy via patterns 520 and 620 may be relatively close to the first and second via patterns 510 and 610, respectively, which may be formed by being divided into two parts and using the fifth and sixth masks 500 and 600, respectively. Thus, the first and third dummy via patterns 520 and 620 may have relatively high densities.

FIGS. 13 to 18 are plan views illustrating a method of forming a wiring structure in accordance with one or more exemplary embodiments of the present inventive concept.

The method described in more detail below with reference to FIGS. 13 to 18 may include an OPC process, which may be different from the OPC processes described above with reference to FIGS. 2, 4, 6, 8, 10 and 12.

Referring to FIGS. 13 to 18, the OPC for the first and second lower wiring patterns 110 and 210, the first and second upper wiring patterns 310 and 410, and the first and second via patterns 510 and 610 may include enlarging the size of each pattern and processing corners of each pattern. Thus, the layouts of the corrected first and second lower wiring patterns 115 and 215, the corrected first and second upper wiring patterns 315 and 415, and the corrected first and second via patterns 515 and 615 may be formed.

According to an exemplary embodiment of the present inventive concept, the OPC for the first and third dummy lower wiring patterns 120, 130, 220 and 230, the first and third dummy upper wiring patterns 320 and 420, and the first and third via patterns 520, 522, 620 and 622 may include enlarging the size of each pattern, and need not include processing corners of each pattern. Thus, the first and second lower wiring patterns 110 and 210, the first and second upper wiring patterns 310 and 410, and the first and second via patterns 510 and 610 may have desired sizes and/or shapes even with a relatively short running time for performing the OPC.

Referring to FIGS. 13 to 18, the OPC might not include the processing of the corners of all of the first and third dummy lower wiring patterns 120, 130, 220 and 230, the first and third dummy upper wiring patterns 320 and 420, and the first and third via patterns 520, 522, 620 and 622, however, exemplary embodiments of the present inventive concept are not limited thereto. Thus, the OPC may include processing of some of the corners of the first and third dummy lower wiring patterns 120, 130, 220 and 230, the first and third dummy upper wiring patterns 320 and 420, and the first and third via patterns 520, 522, 620 and 622.

FIGS. 19 to 58 are plan views and cross-sectional views illustrating a method of forming a wiring structure in accordance with one or more exemplary embodiments of the present inventive concept. FIGS. 19, 24, 29, 32, 35, 40, 45, 50, 53 and 56 are plan views, and FIGS. 20-23, 25-28, 30-31, 33-34, 36-39, 41-44, 46-49, 51-52, 54-55 and 57-58 are cross-sectional views. FIGS. 20, 22, 25, 27, 30, 33, 36, 38, 41, 43, 46, 48, 51, 54 and 57 are cross-sectional views taken along lines A-A' of corresponding plan views, respectively, and FIGS. 21, 23, 26, 28, 31, 34, 37, 38, 42, 44, 47, 49, 52, 55 and 58 are cross-sectional views taken along lines B-B' of corresponding plan views, respectively.

The method of forming the wiring structure described with reference to FIGS. 19 to 58 may include the method of forming the wiring structure described with reference to FIGS. 1 to 12 or FIGS. 13 to 18, and thus duplicative descriptions may be omitted.

Figure 19:
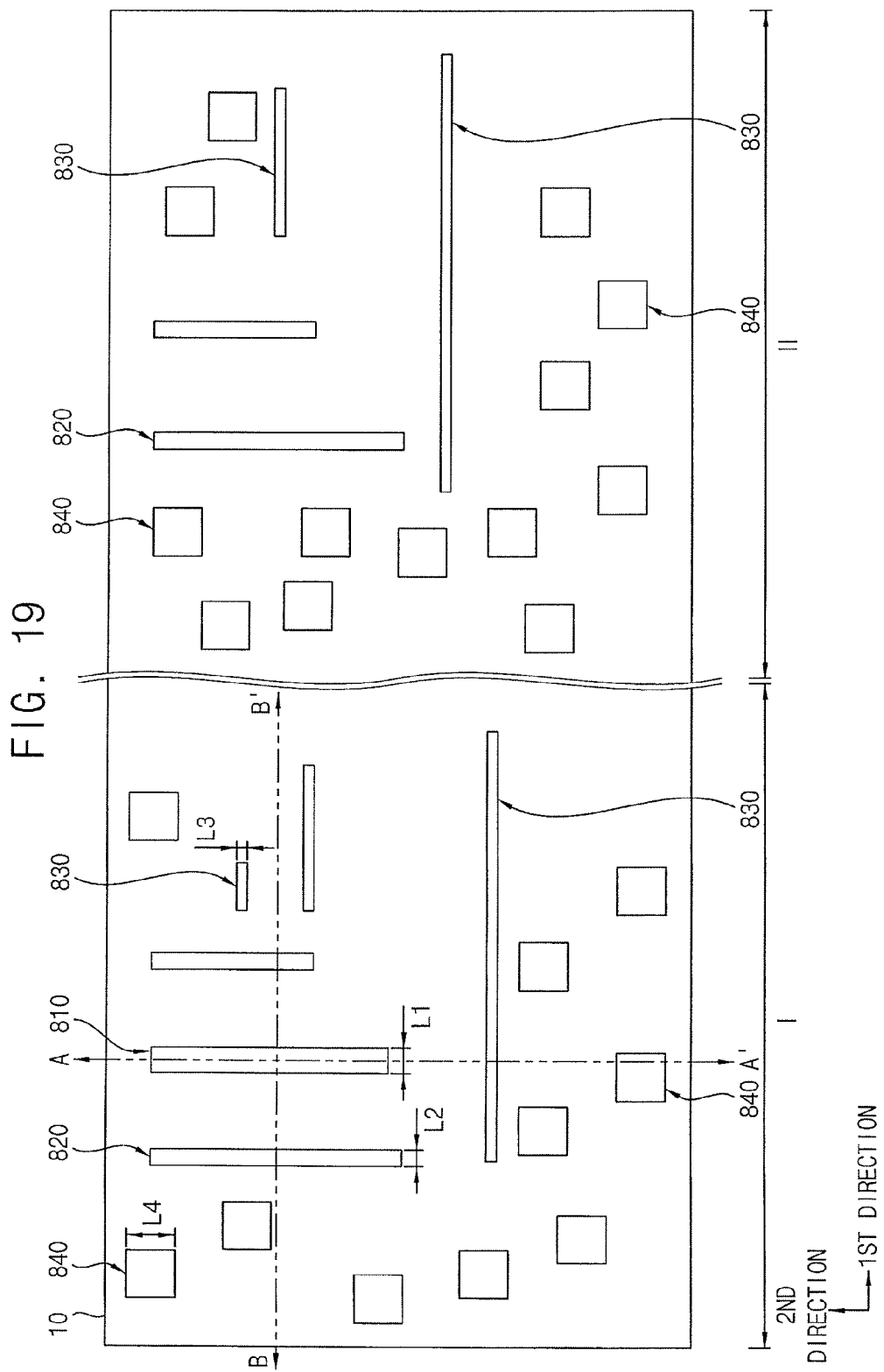
Figure 20:
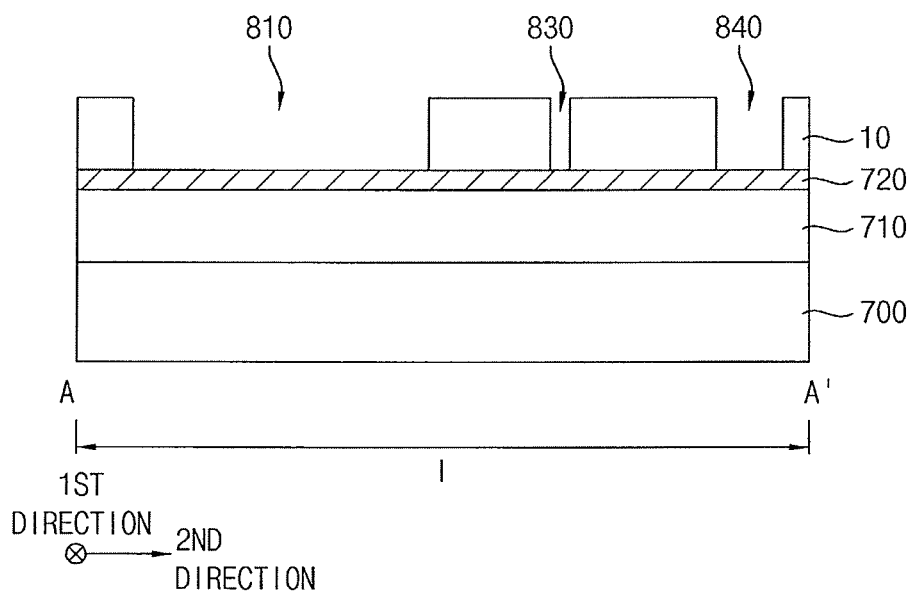
Figure 21:
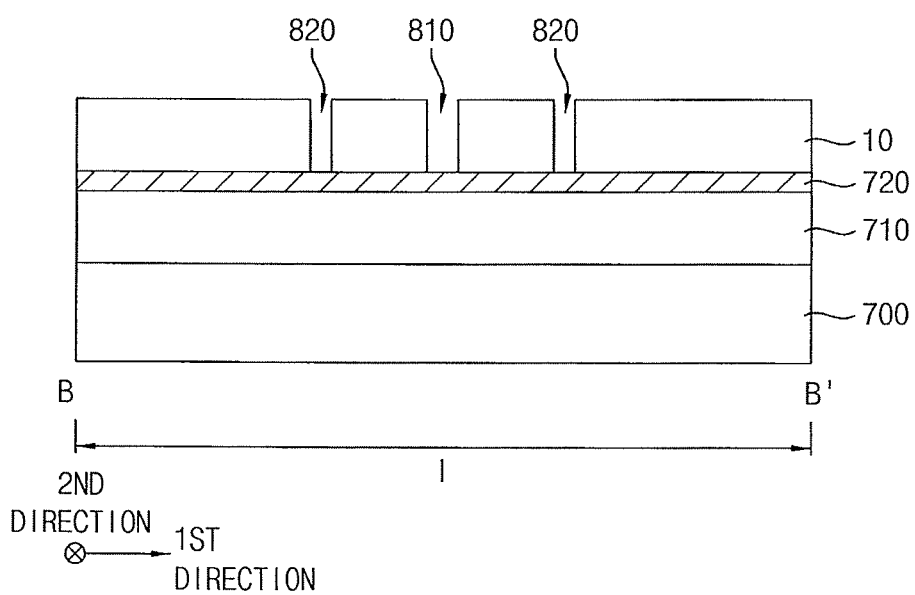

Referring to FIGS. 19 to 21, a first photo mask may be formed based on the first mask 100 having the layout described with reference to FIGS. 1 and 2. The first photo mask may be, for example, a reticle.

A first insulating interlayer 710 and a first etching mask layer 720 may be sequentially formed on a substrate 700, a first photoresist layer may be formed on the first etching mask layer 720, and the first photoresist layer may be patterned using the first photo mask by a first photo process to form a first photoresist pattern 10 on the first etching mask layer 720.

The first photo mask may be formed according to the layout of the first mask 100 on which the OPC has been performed, and thus the first photoresist pattern 10 may have a layout substantially the same as or similar to that of the first mask 100 described with reference to FIG. 1. A first opening 810, second openings 820 and 830, and third openings 840 may be formed in the first photoresist pattern 10 correspondingly to the shapes of the first lower wiring pattern 110, the first dummy lower wiring patterns 120 and 130, and the second dummy lower wiring patterns 140, respectively. Each of the first to third openings 810, 820, 830 and 840 may expose an upper surface of the first etching mask layer 720.

Each of the first to third openings 810, 820, 830 and 840 may have a shape of a rectangle or a shape of a square in a plan view, and minimum lengths of the first to third openings 810, 820, 830 and 840 may be first to fourth lengths L1, L2, L3 and L4, respectively.

The substrate 700 may include a semiconductor material, for example, silicon, or germanium, silicon-germanium. The substrate 700 may include a group III-V semiconductor compound, for example, GaP, GaAs, or GaSb. In an exemplary embodiment of the present inventive concept, the substrate 700 may be a silicon-on-insulator (SOI) substrate or a germanium-on-insulator (GOI) substrate.

Various components, for example, a gate structure, a gate spacer, a source/drain layer, and/or a contact plug may be formed on the substrate 700, which may be covered by the first insulting interlayer 710.

The first insulating interlayer 710 may include an oxide, for example, silicon oxide. The first insulating interlayer 710 may include a low-k dielectric material (e.g., silicon oxide doped with carbon (SiCOH) or silicon oxide doped with fluorine (F—$SiO_2$)), a porous silicon oxide, spin on organic polymer, or an inorganic polymer (e.g., hydrogen silsesquioxane (HSSQ)), or methyl silsesquioxane (MSSQ). The first etching mask layer 720 may include a nitride (e.g., silicon nitride or a metal nitride).

An etch stop layer may be formed under the first insulating interlayer 710, and the etch stop layer may include a nitride (e.g., silicon nitride).

Figure 22:
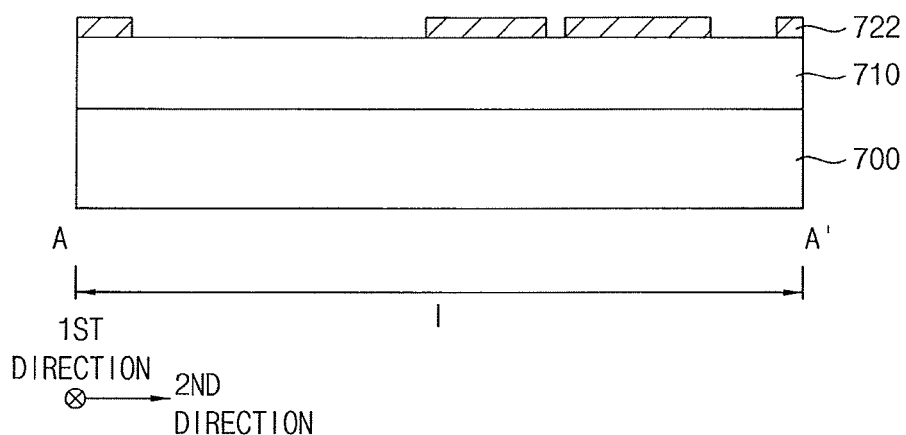
Figure 23:
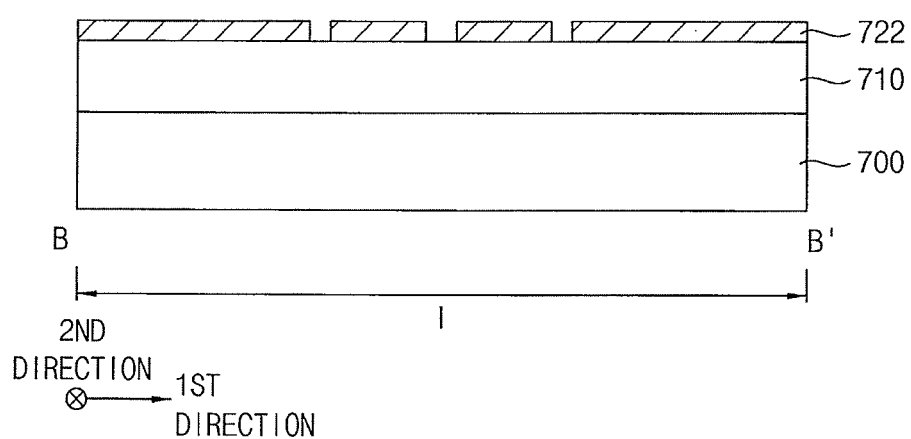

Referring to FIGS. 22 and 23, the first etching mask layer 720 may be etched using the first photoresist pattern 10 as an etching mask to form a preliminary first etching mask 722.

Thus, the preliminary first etching mask 722 may have a shape corresponding to the shape of the first photoresist pattern 10 including the first to third openings 810, 820, 830 and 840.

The first photoresist pattern 10 may be removed. In an exemplary embodiment of the present inventive concept, the first photoresist pattern 10 may be removed by an ashing process and/or a stripping process.

Figure 24:
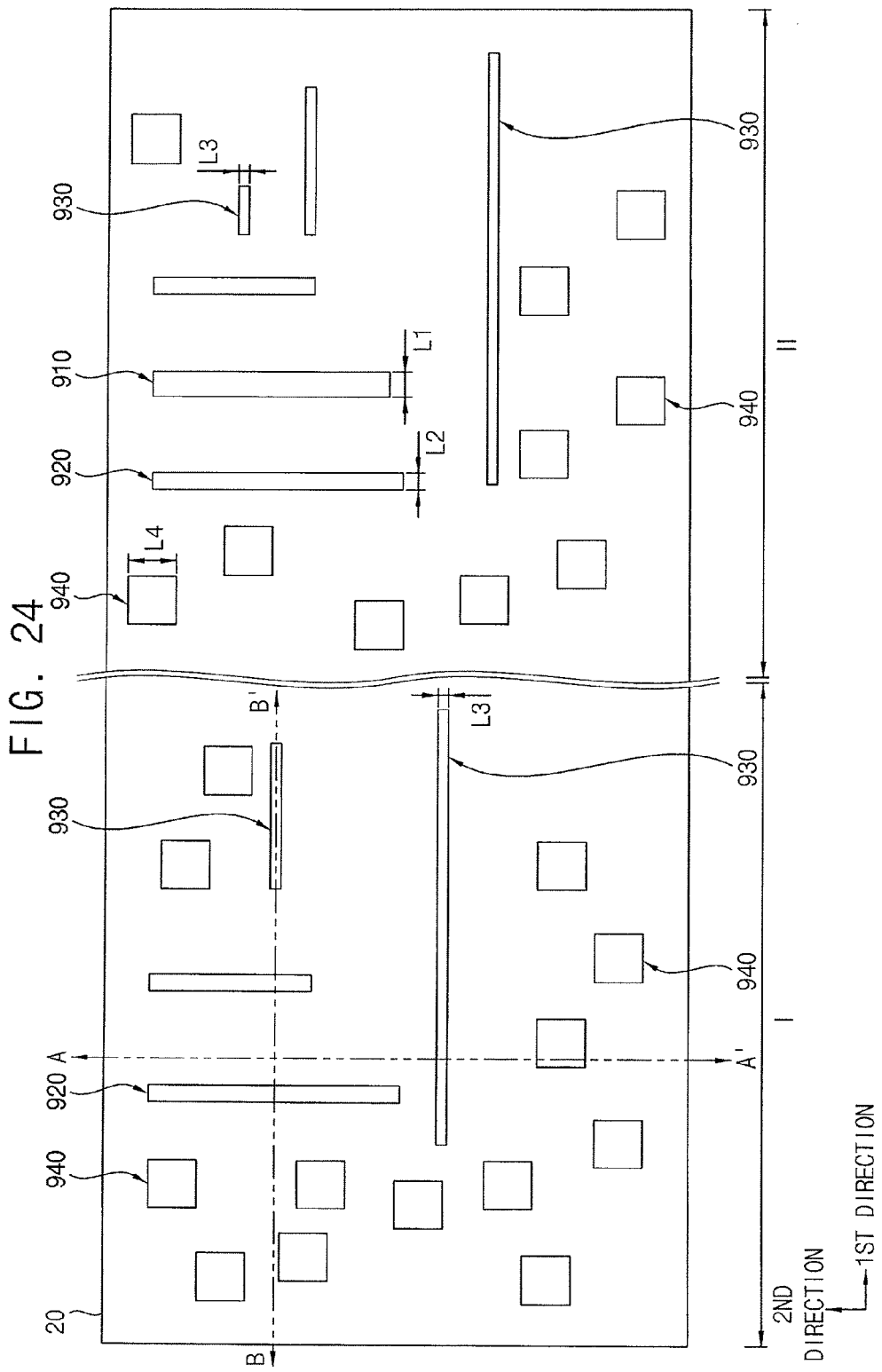
Figure 25:
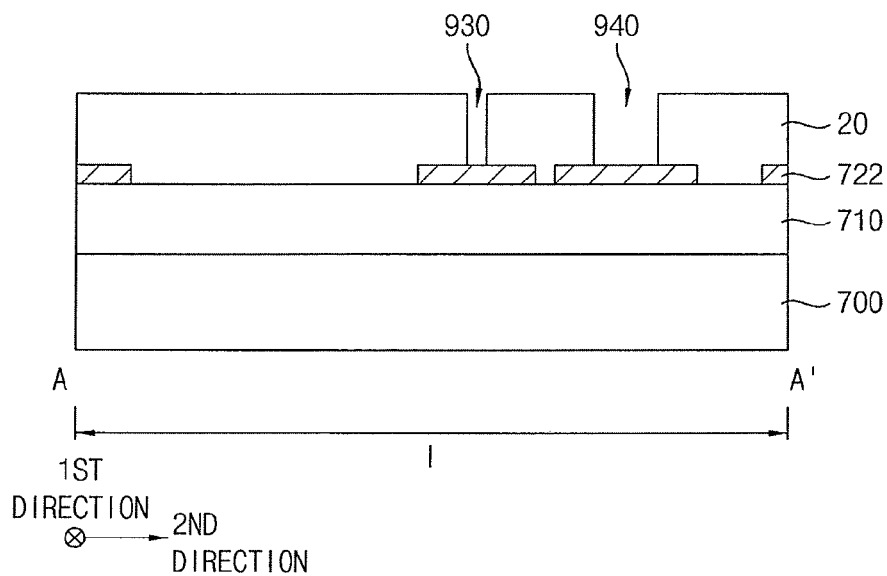
Figure 26:
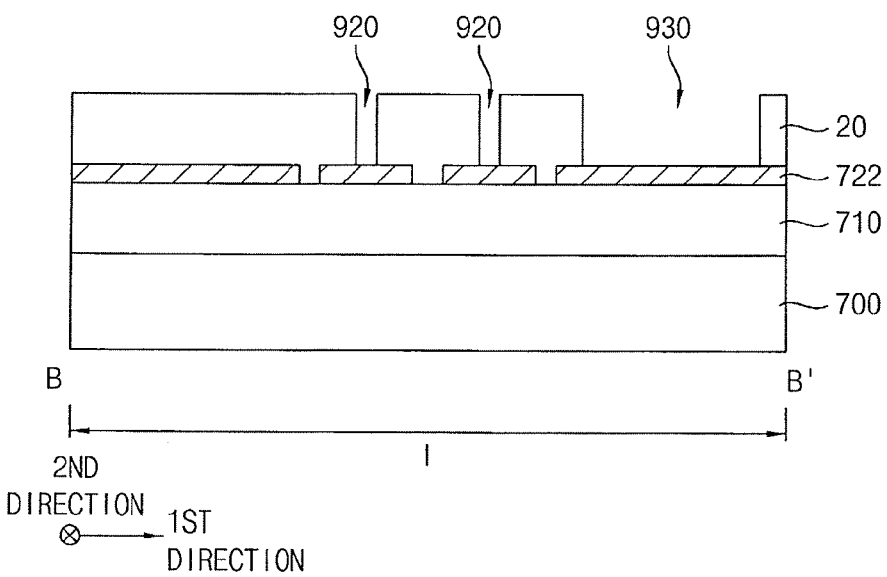

Referring to FIGS. 24 to 26, a second photo mask may be formed based on the second mask 200 having the layout described with reference to FIGS. 3 and 4.

A second photoresist layer may be formed on the first insulating interlayer 710 and the preliminary first etching mask 722, and the second photoresist layer may be patterned using the second photo mask by a second photo process to form a second photoresist pattern 20. In an exemplary embodiment of the present inventive concept, the position of the second photo mask in the second photo process may be substantially the same as that of the first photo mask in the first photo process.

The second photo mask may have a layout substantially the same as or similar to that of the second mask 200 described with reference to FIG. 3. Thus, a fourth opening 910, fifth openings 920 and 930, and sixth openings 940 may be formed in the second photoresist pattern 20 corresponding to the shapes of the second lower wiring pattern 210, the third dummy lower wiring patterns 220 and 230, and the fourth dummy lower wiring patterns 240, respectively. Each of the fourth to sixth openings 910, 920, 930 and 940 may expose an upper surface of the preliminary first etching mask 722.

Each of the fourth to sixth openings 910, 920, 930 and 940 may have a shape of a rectangle or a shape of a square in a plan view, and minimum lengths of the fourth to sixth openings 910, 920, 930 and 940 may be the first to fourth lengths L1, L2, L3 and L4, respectively.

Figure 27:
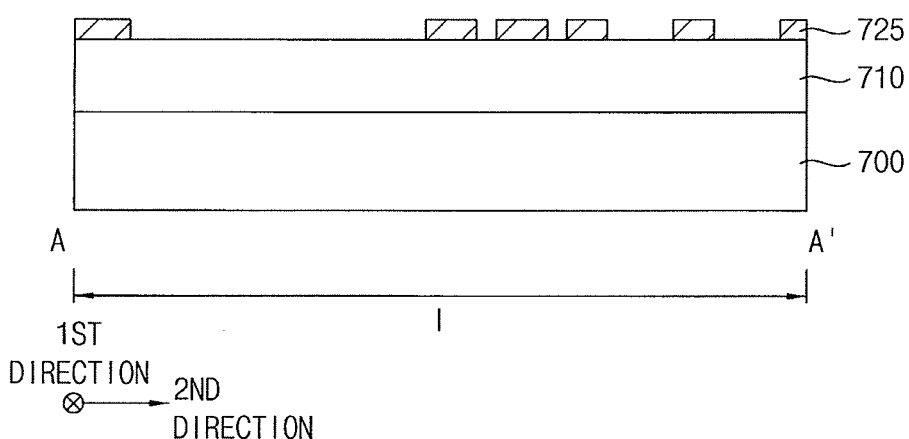
Figure 28:
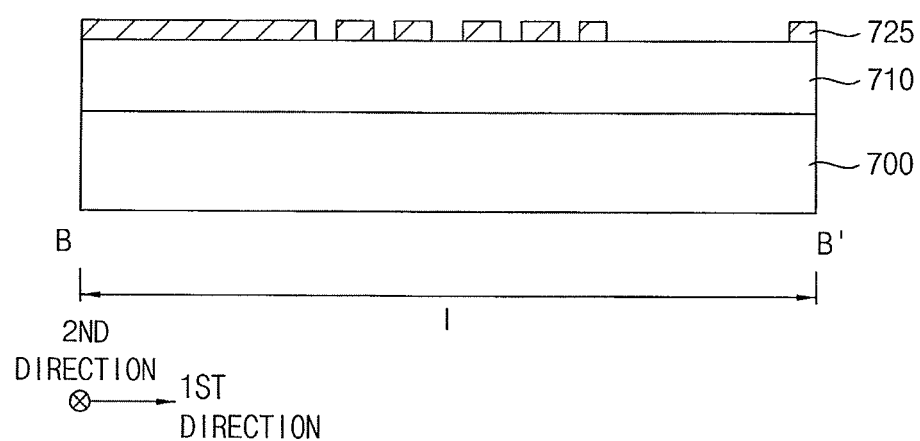

Referring to FIGS. 27 and 28, the preliminary first etching mask 722 may be etched using the second photoresist pattern 20 as an etching mask to form a first etching mask 725.

Thus, the first etching mask 725 may have a layout in which the shape of the first photoresist pattern 10 including the first to third openings 810, 820, 830 and 840 and the shape of the second photoresist pattern 20 including the fourth to sixth openings 910, 920, 930 and 940 are vertically overlapped with each other. That is, openings corresponding to the first to sixth openings 810, 820, 830, 840, 910, 920, 930 and 940 may be formed in the first etching mask 725.

Figure 29:
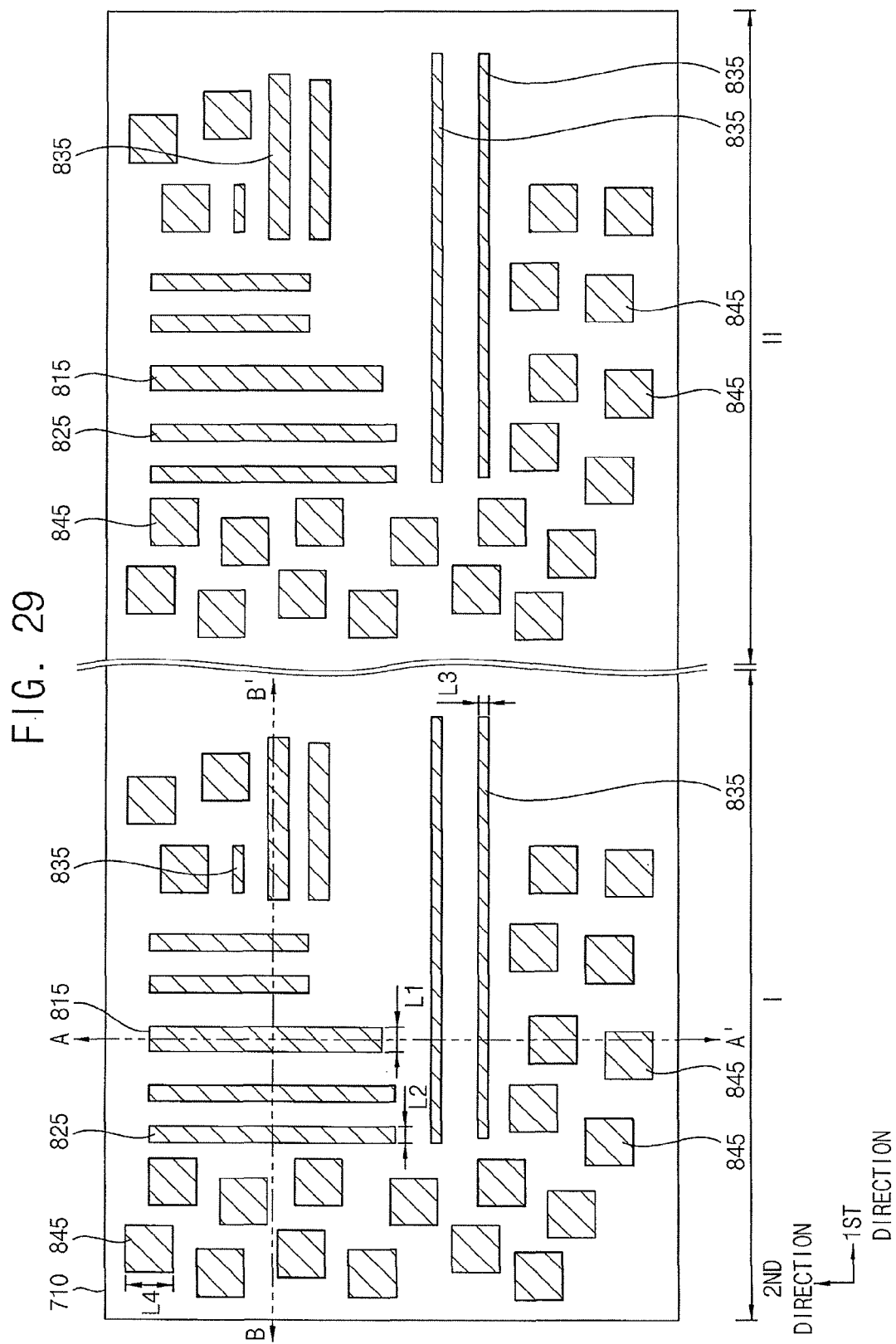
Figure 30:
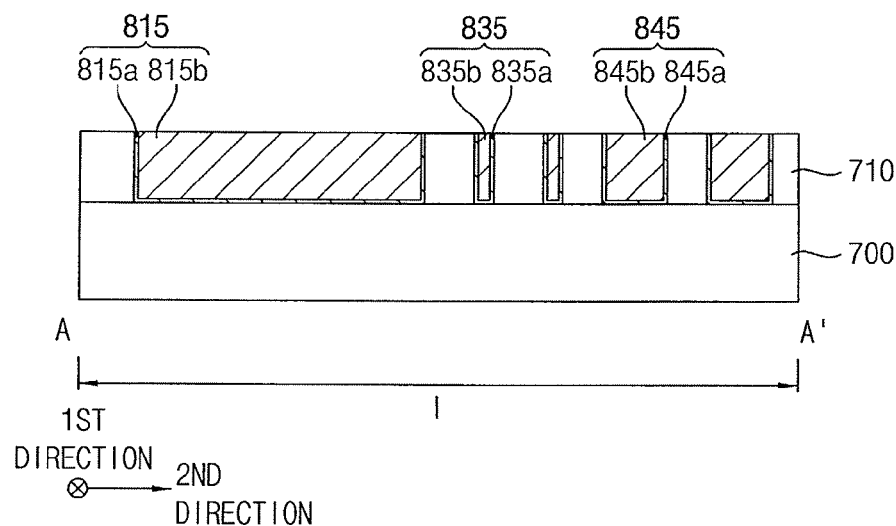
Figure 31:
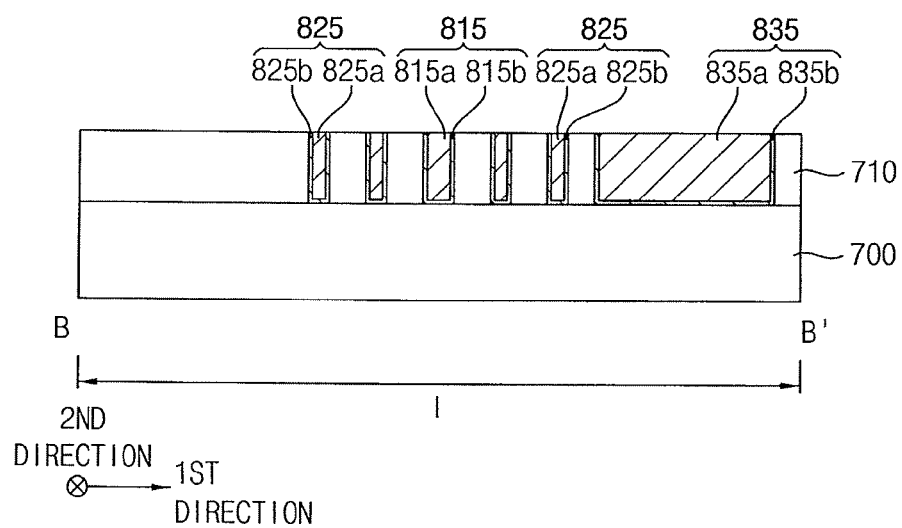

Referring to FIGS. 29 to 31, the first insulating interlayer 710 may be etched using the first etching mask 725 to form first, second and third holes through the first insulating interlayer 710, each of which may expose an upper surface of the substrate 700. A lower wiring 815, first dummy lower wirings 825 and 835, and second dummy lower wirings 845 may fill the first to third holes, respectively.

For example, the first hole may correspond to the first and fourth openings 810 and 910, the second hole may correspond to the second and fifth openings 820, 830, 920 and 930, and the third hole may correspond to the third and sixth openings 840 and 940.

The lower wiring 815, the first dummy lower wirings 825 and 835, and the second dummy lower wirings 845 may be formed by forming a first barrier layer on the exposed upper surface of the substrate 700, sidewalls of the first to third holes, and an upper surface of the first insulating interlayer 710, forming a first conductive layer on the first barrier layer to fill remaining portions of the first to third holes, and planarizing the first conductive layer and the first barrier layer until the upper surface of the first insulating interlayer 710 may be exposed.

In an exemplary embodiment of the present inventive concept, the planarization process may be performed by a chemical mechanical polishing (CMP) process and/or an etch back process.

The first barrier layer may include a metal nitride e.g., tantalum nitride, or titanium nitride), and/or a metal (e.g., tantalum, titanium). The first conductive layer may include a metal (e.g., copper, aluminum, or tungsten).

The lower wiring 815 may fill the first hole, and may include a first conductive pattern 815*b* and a first barrier pattern 815*a* covering a sidewall and a bottom of the first conductive pattern 815*b*. The first dummy lower wirings 825 and 835 may fill the second hole, and may include second conductive patterns 825*b* and 835*b* and second barrier patterns 825*a* and 835*a* covering sidewalls and bottoms of the second conductive patterns 825*b* and 835*b*, respectively. The second dummy lower wirings 845 may fill the third hole, and may include third conductive patterns 845*b* and third barrier patterns 845*a* covering sidewalls and bottoms of the third conductive patterns 845*b*.

Each of the lower wiring 815 and the first and second dummy lower wirings 825, 835 and 845 may have a shape of a rectangle or a shape of a square in a plan view. In an exemplary embodiment of the present inventive concept, the first dummy lower wirings 825 and 835 having sizes less than a predetermined size may be formed to be relatively close to the lower wiring 815 having a size less than the predetermined size. The second dummy lower wirings 845 having sizes equal to or greater than the predetermined size may be relatively distant from the lower wiring 815. Thus, the lower wiring 815 may have a desired size and/or shape that might not be distorted by surrounding structures.

The etching process for forming the lower wiring 815, and the first and second dummy lower wirings 825, 835 and 845 may be divided into two parts and performed independently. Thus, the lower wiring 815, and the first and second dummy lower wirings 825, 835 and 845 may relatively dense. However, exemplary embodiments of the present inventive concept are not limited thereto, and the etching process may be performed only once, or may be divided into a plurality of parts greater than two parts.

The lower wiring 815, and the first and second dummy lower wirings 825, 835 and 845 may be formed by a single damascene process, however, exemplary embodiments of the present inventive concept are not limited thereto. For example, the lower wiring 815, and the first and second dummy lower wirings 825, 835 and 845 may be formed by two or more damascene processes.

Figure 32:
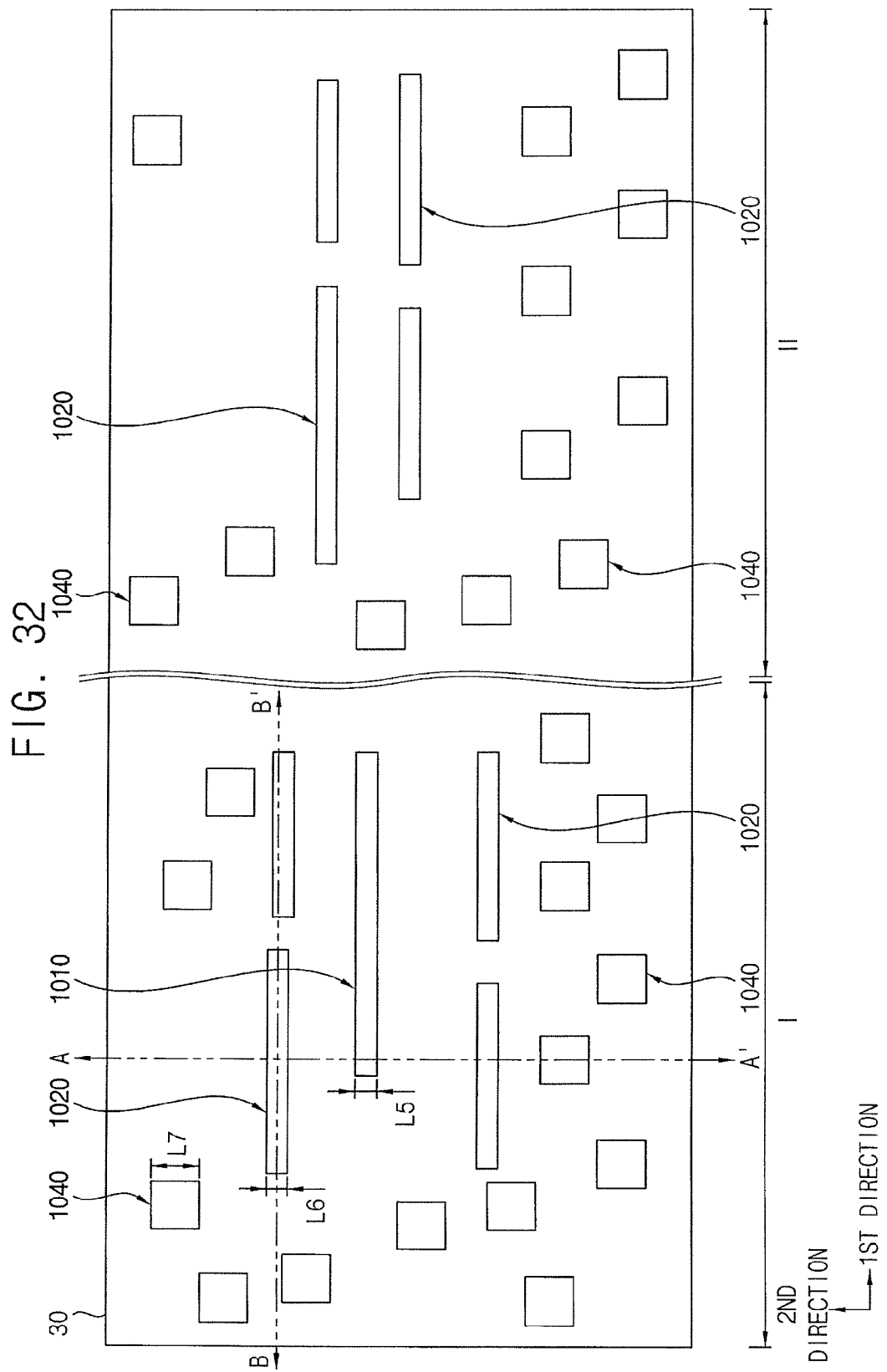
Figure 33:
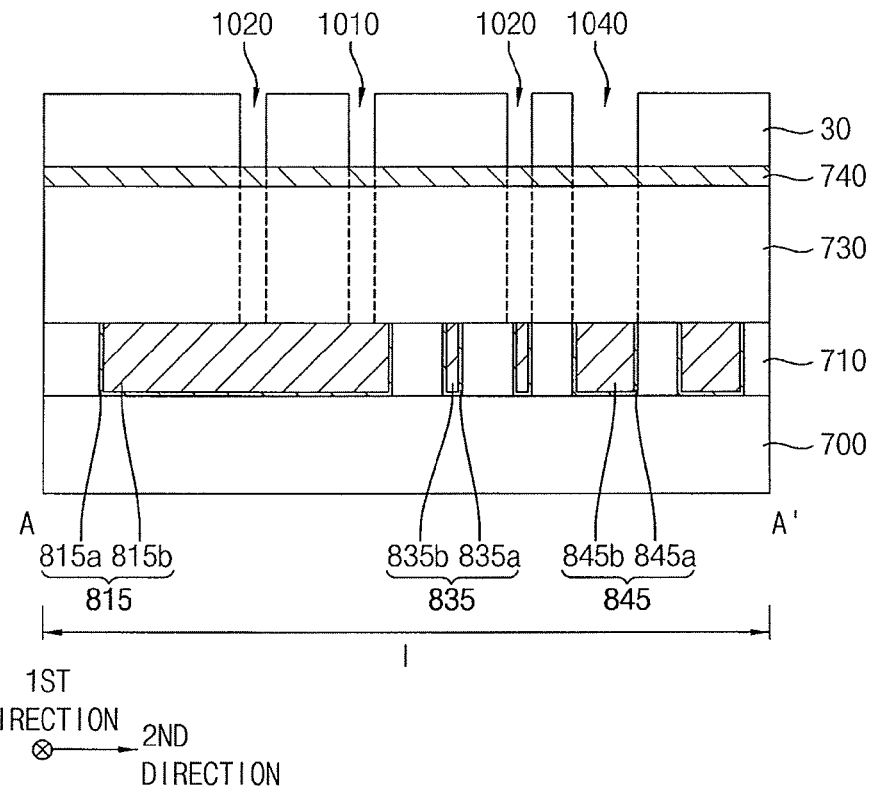
Figure 34:
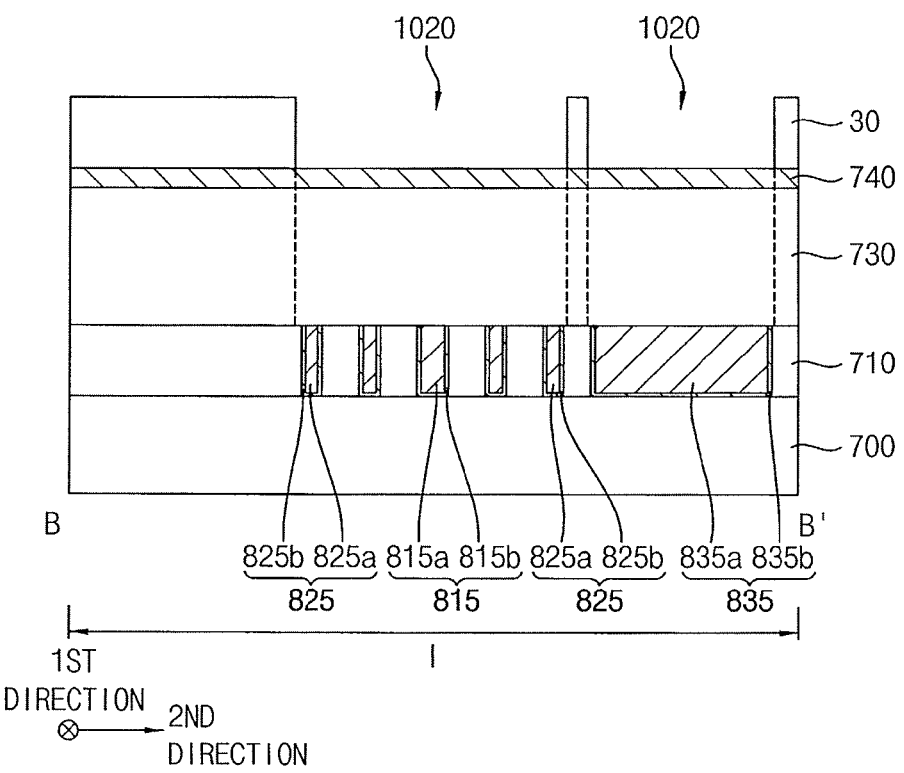

Referring to FIGS. 32 to 34, a third photo mask may be formed based on the third mask 300 having the layout described with reference to FIGS. 5 and 6.

A second insulating interlayer 730 and a second etching mask layer 740 may be sequentially formed on the first insulating interlayer 710, the lower wiring 815, and the first and second dummy lower wirings 825, 835 and 845. A third photoresist layer may be formed on the second etching mask layer 740. The third photoresist layer may be patterned using the third photo mask by a third photo process to form a third photoresist pattern 30 on the second etching mask layer 740. In an exemplary embodiment of the present inventive concept, the position of the third photo mask in the third photo process may be substantially the same as that of the first photo mask in the first photo process.

The third photoresist pattern 30 formed by the third photo process using the third photo mask may have a layout substantially the same as or similar to that of the third mask 300 described with reference to FIG. 5. Thus, a seventh opening 1010, eighth openings 1020, and ninth openings 1040 may be formed in the third photoresist pattern 30 corresponding to the shapes of the first upper wiring pattern 310, the first dummy upper wiring patterns 320, and the second dummy upper wiring patterns 340, respectively. Each of the seventh to ninth openings 1010, 1020 and 1040 may expose an upper surface of the second etching mask layer 740.

Each of the seventh to ninth openings 1010, 1020 and 1040 may have a shape of a rectangle or a shape of a square in a plan view, and minimum lengths of the seventh to ninth openings 1010, 1020 and 1040 may be fifth, sixth and seventh lengths L5, L6 and L7, respectively.

In an exemplary embodiment of the present inventive concept, the seventh opening 1010 may at least partially vertically overlap the lower wiring 815.

The second insulating interlayer 730 may include a low-k dielectric material (e.g., silicon oxide doped with carbon (SiCOH) or silicon oxide doped with fluorine (F—SiO$_2$)), a porous silicon oxide, spin on organic polymer, or an inorganic polymer (e.g., hydrogen silsesquioxane (HSSQ)), or methyl silsesquioxane (MSSQ). Alternatively, the second insulating interlayer 730 may include an oxide (e.g., silicon oxide). The second etching mask layer 740 may include a nitride (e.g., silicon nitride or a metal nitride).

An etch stop layer may be formed under the second insulating interlayer 730, and the etch stop layer may include a nitride (e.g., silicon nitride).

Figure 35:
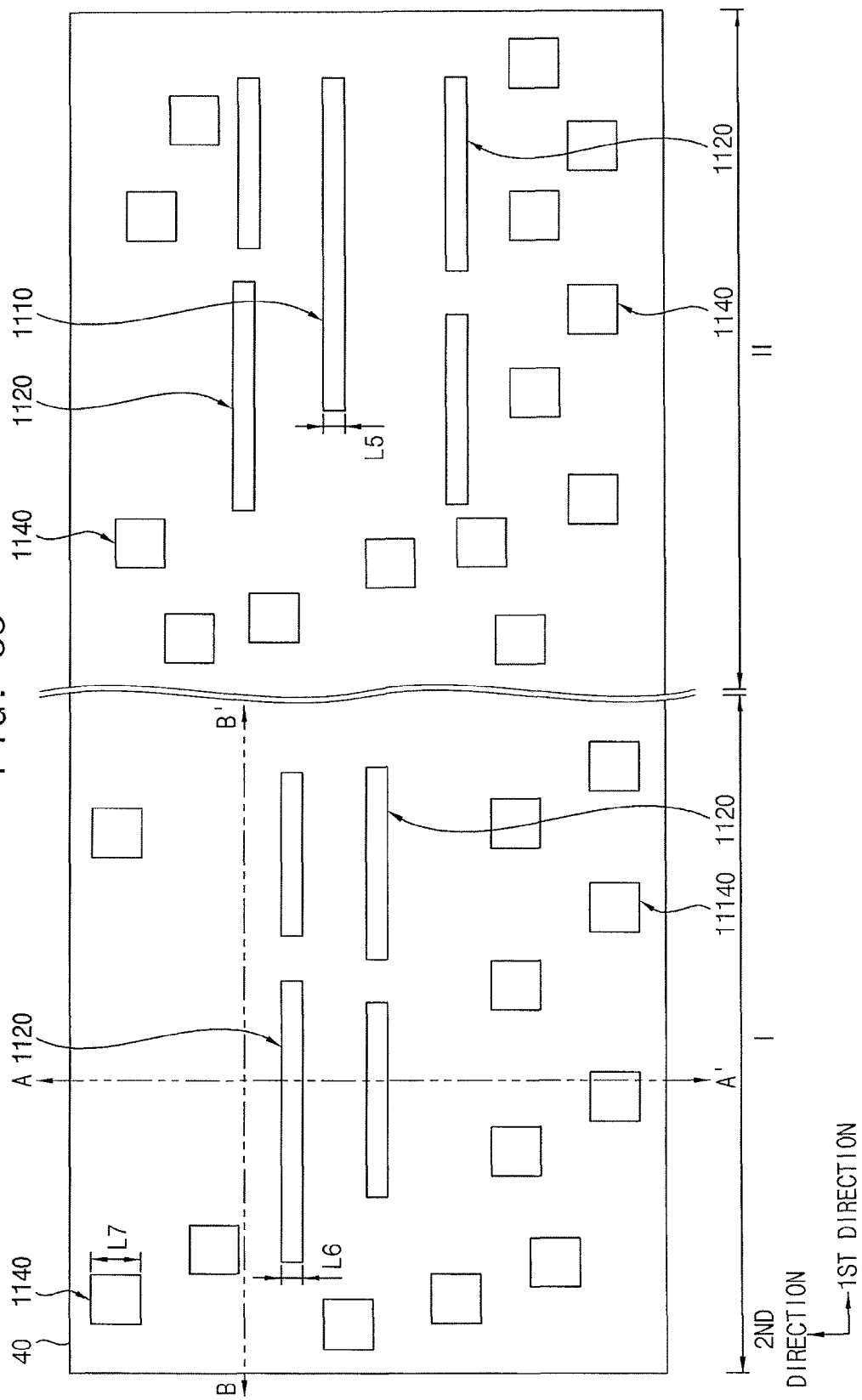
Figure 36:
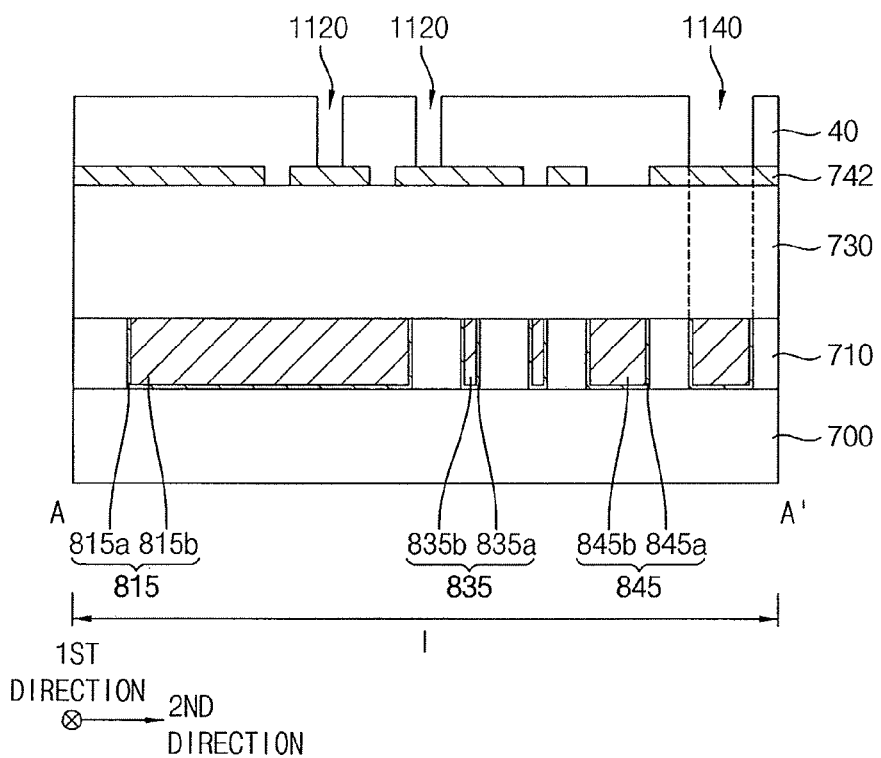
Figure 37:
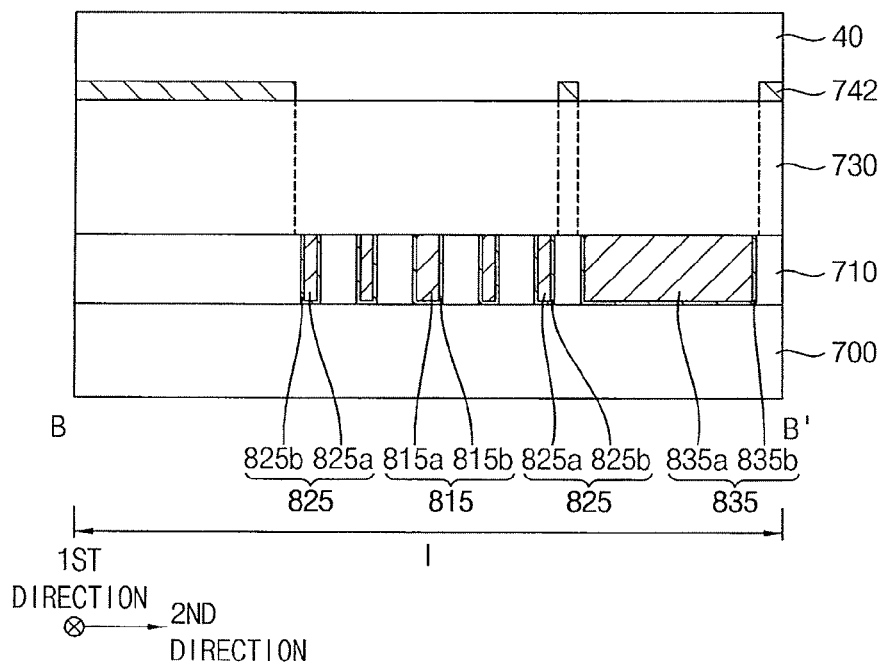

Referring to FIGS. 35 to 37, the second etching mask layer 740 may be etched using the third photoresist pattern 30 as an etching mask to form a preliminary second etching mask 742.

Thus, the preliminary second etching mask 742 may have a shape corresponding to the shape of the third photoresist pattern 30 including the seventh to ninth openings 1010, 1020 and 1040.

After removing the third photoresist pattern 30, a fourth photo mask may be formed based on the fourth mask 400 having the layout described with reference to FIGS. 7 and 8.

A fourth photoresist layer may be formed on the second insulating interlayer 730 and the preliminary second etching mask 722. The fourth photoresist layer may be patterned using the fourth photo mask by a fourth photo process to form a fourth photoresist pattern 40. In an exemplary embodiment of the present inventive concept, the position of the fourth photo mask in the fourth photo process may be substantially the same as that of the first photo mask in the first photo process.

The fourth photo mask may have a layout substantially the same as or similar to that of the fourth mask 400 described with reference to FIG. 7. Thus, a tenth opening 1110, eleventh openings 1120, and twelfth openings 1140 may be formed in the fourth photoresist pattern 40 correspondingly to the shapes of the second upper wiring pattern 410, the third dummy upper wiring patterns 320, and the fourth dummy upper wiring patterns 340, respectively. Each of the tenth to twelfth openings 1110, 1120 and 1140 may expose an upper surface of the preliminary second etching mask 742.

Each of the tenth to twelfth openings 1110, 1120 and 1140 may have a shape of a rectangle or a shape of a square in a plan view, and minimum lengths of the tenth to twelfth openings 1110, 1120 and 1140 may be the fifth to seventh lengths L5, L6 and L7, respectively.

Figure 38:
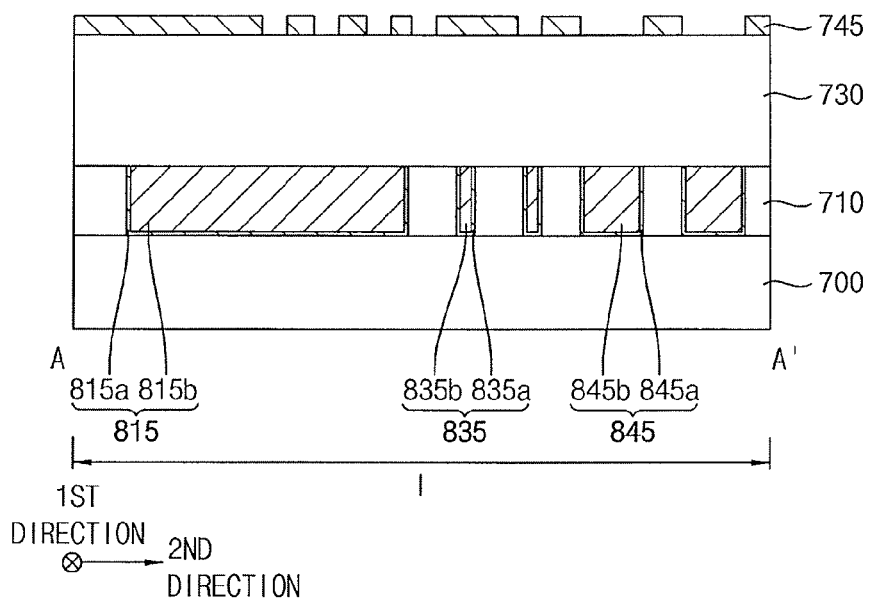
Figure 39:
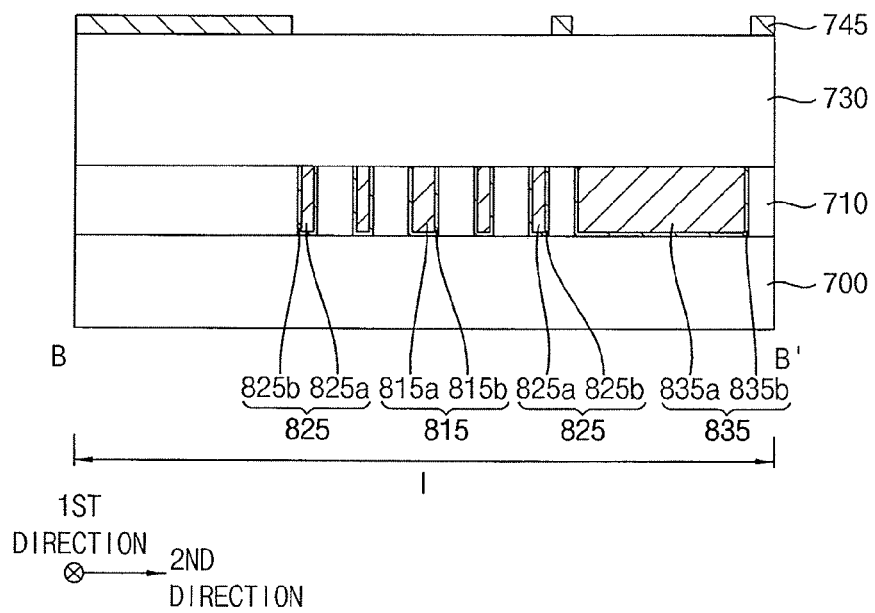

Referring to FIGS. 38 and 39, the preliminary second etching mask 742 may be etched using the fourth photoresist pattern 40 as an etching mask to form a second etching mask 745.

Thus, the second etching mask 745 may have a layout in which the shape of the third photoresist pattern 30 including the seventh to ninth openings 1010, 1020 and 1040 and the shape of the fourth photoresist pattern 40 including the tenth to twelfth openings 1110, 1120 and 1140 are vertically overlapped with each other. That is, openings corresponding to the seventh to twelfth openings 1010, 1020, 1040, 1110, 1120 and 1140 may be formed in the second etching mask 745.

Figure 40:
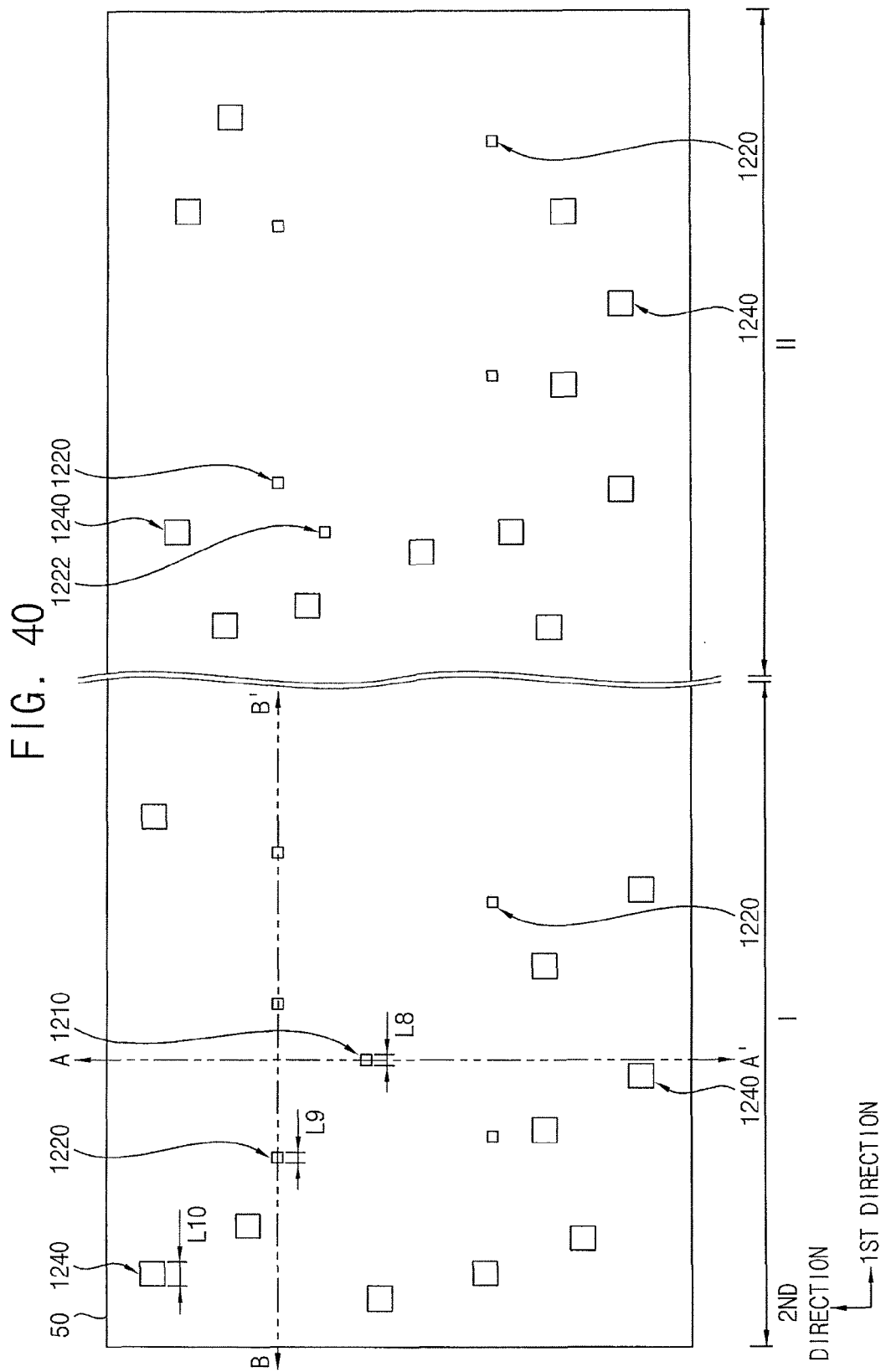
Figure 41:
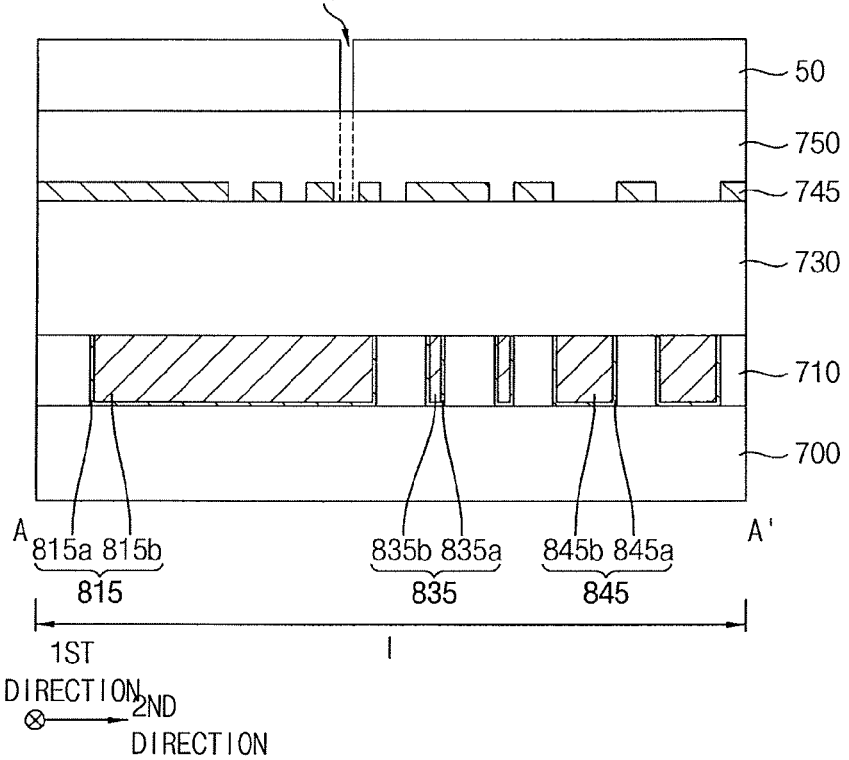
Figure 42:
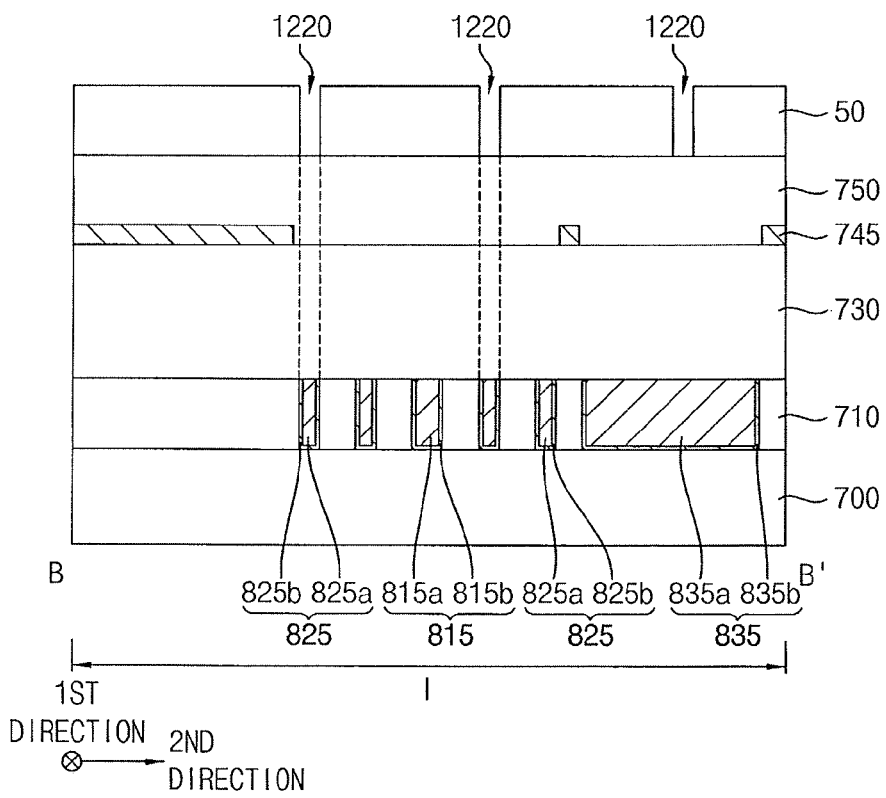

Referring to FIGS. 40 to 42, a fifth photo mask may be formed based on the fifth mask 500 having the layout described with reference to FIGS. 9 and 10.

A third etching mask layer 750 may be formed on the second insulating interlayer 730 and the second etching mask 745, a fifth photoresist layer may be formed on the third etching mask layer 750, and the fifth photoresist layer may be patterned using the fifth photo mask by a fifth photo process to form a fifth photoresist pattern 50 on the third etching mask layer 750. In an exemplary embodiment of the present inventive concept, the position of the fifth photo mask in the fifth photo process may be substantially the same as that of the first photo mask in the first photo process.

The fifth photoresist pattern 50 formed by the fifth photo process using the fifth photo mask may have a layout substantially the same as or similar to that of the fifth mask 500 described with reference to FIG. 9. Thus, a thirteenth opening 1210, fourteenth openings 1220 and 1222, and fifteenth openings 1240 may be formed in the fifth photoresist pattern 50 corresponding to the shapes of the first via pattern 510, the first dummy via patterns 520 and 522, and the second dummy via patterns 540, respectively. Each of the thirteenth to fifteenth openings 1210, 1220, 1222 and 1240 may expose an upper surface of the third etching mask layer 750.

Each of the thirteenth to fifteenth openings 1210, 1220, 1222 and 1240 may have a shape of a rectangle or a shape of a square in a plan view, and minimum lengths of the thirteenth to fifteenth openings 1210, 1220, 1222 and 1240 may be eighth, ninth and tenth lengths L8, L9 and L10, respectively.

In an exemplary embodiment of the present inventive concept, the thirteenth opening 1210 may vertically overlap the lower wiring 815, and one of the openings in the second etching mask 745 corresponding to the seventh and tenth openings 1010 and 1110.

Each of the fourteenth openings 1220 may vertically overlap one of the first dummy lower wirings 825 and 835, and one of the eighth and eleventh openings 1020 and 1120.

In an exemplary embodiment of the present inventive concept, each of the fourteenth openings 1222 may vertically overlap one of the second dummy lower wirings 845, and one of the eighth and eleventh openings 1020 and 1120. Alternatively, each of the fourteenth openings 1222 may vertically overlap one of the first dummy lower wirings 825 and 835, and one of the ninth and twelfth openings 1040 and 1140.

Each of the fifteenth openings 1240 may vertically overlap one of the second dummy lower wirings 845, and one of the ninth and twelfth openings 1040 and 1140.

The third etching mask layer 750 may include a spin-on-hardmask (SOH) material.

Figure 43:
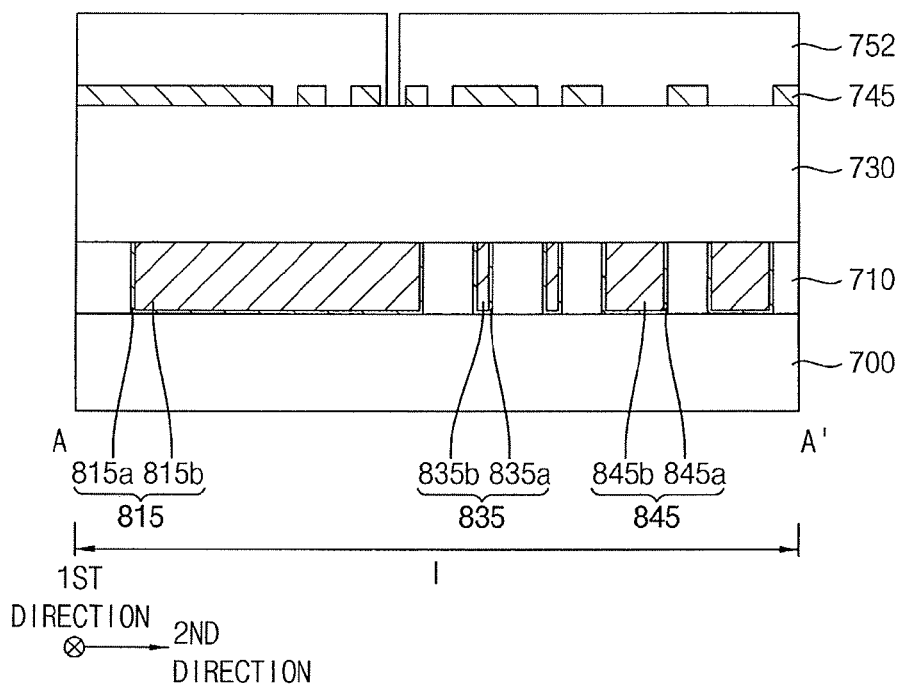
Figure 44:
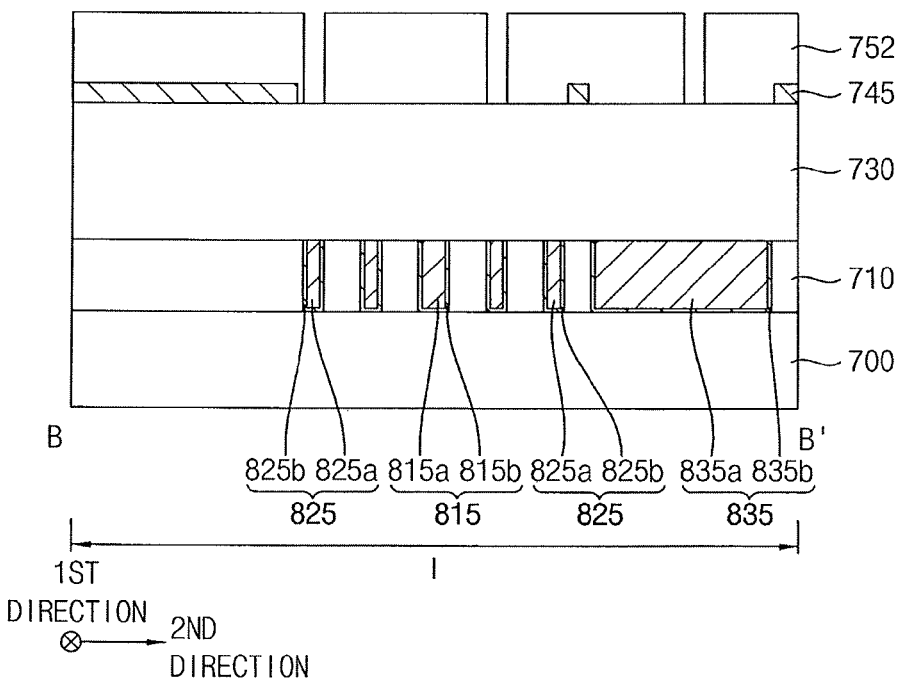

Referring to FIGS. 43 and 44, the third etching mask layer 750 may be etched using the fifth photoresist pattern 50 as an etching mask to form a preliminary third etching mask 752.

Thus, the preliminary third etching mask 752 may have a shape corresponding to the shape of the fifth photoresist pattern 50 including the thirteenth to fifteenth openings 1210, 1220, 1222 and 1240.

The fifth photoresist pattern 50 may be removed.

Referring to FIGS. 45 to 47, a sixth photo mask may be formed based on the sixth mask 600 having the layout designed by the processes described with reference to FIGS. 11 and 12.

A sixth photoresist layer may be formed on the second insulating interlayer 730 and the preliminary third etching mask 752, and the sixth photoresist layer may be patterned using the sixth photo mask by a sixth photo process to form a sixth photoresist pattern 60 on the second insulating interlayer 730 and the preliminary third etching mask 752. In an exemplary embodiment of the present inventive concept, the position of the sixth photo mask in the sixth photo process may be substantially the same as that of the first photo mask in the first photo process.

The sixth photoresist pattern 60 formed by the sixth photo process using the sixth photo mask may have a layout substantially the same as or similar to that of the sixth mask 600 described with reference to FIG. 11. Thus, a sixteenth opening 1310, seventeenth openings 1320 and 1322, and eighteenth openings 1340 may be formed in the sixth photoresist pattern 60 corresponding to the shapes of the second via pattern 610, the third dummy via patterns 620 and 622, and the fourth dummy via patterns 640, respectively. Each of the sixteenth to eighteenth openings 1310, 1320, 1322 and 1340 may expose an upper surface of the preliminary third etching mask 752.

Each of the sixteenth to eighteenth openings 1310, 1320, 1322 and 1340 may have a shape of a rectangle or a shape of a square in a plan view, and minimum lengths of the sixteenth to eighteenth openings 1310, 1320, 1322 and 1340 may be the eighth, ninth and tenth lengths L8, L9 and L10, respectively.

In an exemplary embodiment of the present inventive concept, the sixteenth opening 1310 may vertically overlap the lower wiring 815, and one of the openings in the second etching mask 745 corresponding to the seventh and tenth openings 1010 and 1110.

Each of the seventeenth openings 1320 may vertically overlap one of the first dummy lower wirings 825 and 835, and one of the eighth and eleventh openings 1020 and 1120.

In an exemplary embodiment of the present inventive concept, each of the seventeenth openings 1322 may vertically overlap one of the second dummy lower wirings 845, and one of the eighth and eleventh openings 1020 and 1120. Alternatively, each of the seventeenth openings 1322 may vertically overlap one of the first dummy lower wirings 825 and 835, and one of the ninth and twelfth openings 1040 and 1140.

Each of the eighteenth openings 1340 may vertically overlap one of the second dummy lower wirings 845, and one of the ninth and twelfth openings 1040 and 1140.

Figure 48:
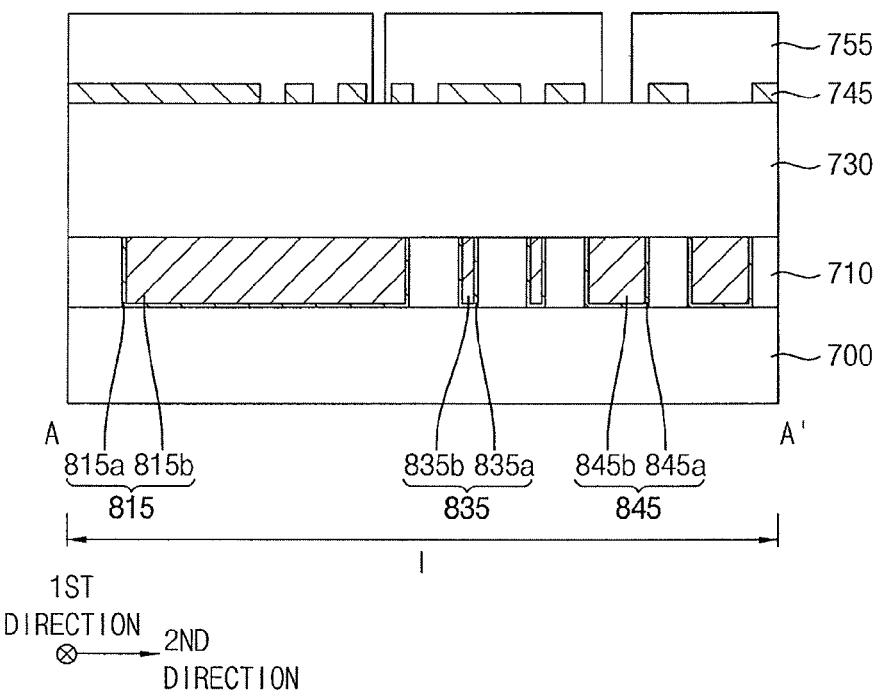
Figure 49:
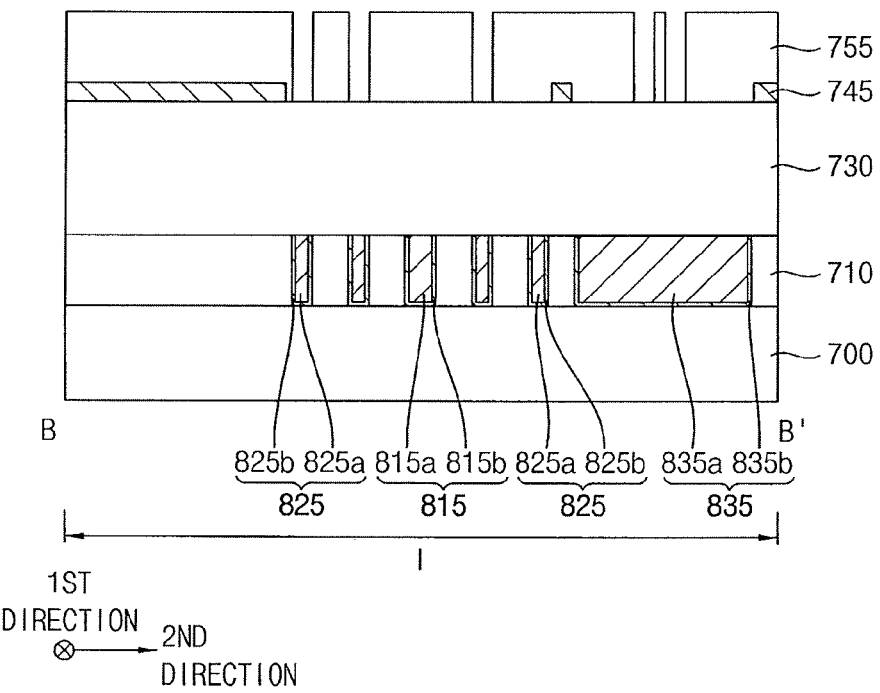

Referring to FIGS. 48 to 49, the preliminary third etching mask 752 may be etched using the sixth photoresist pattern 60 as an etching mask to form a third etching mask 755.

Thus, the third etching mask 755 may have a layout in which the shape of the fifth photoresist pattern 50 including the thirteenth to fifteenth openings 1210, 1220, 1222 and 1240 and the shape of the sixth photoresist pattern 60 including the sixteenth to eighteenth openings 1310, 1320, 1322 and 1340 are vertically overlapped with each other. That is, openings corresponding to the thirteenth to eighteenth openings 1210, 1220, 1222, 1240, 1310, 1320, 1322 and 1340 may be formed in the third etching mask 755.

The sixth photoresist pattern 60 may be removed.

Figure 50:
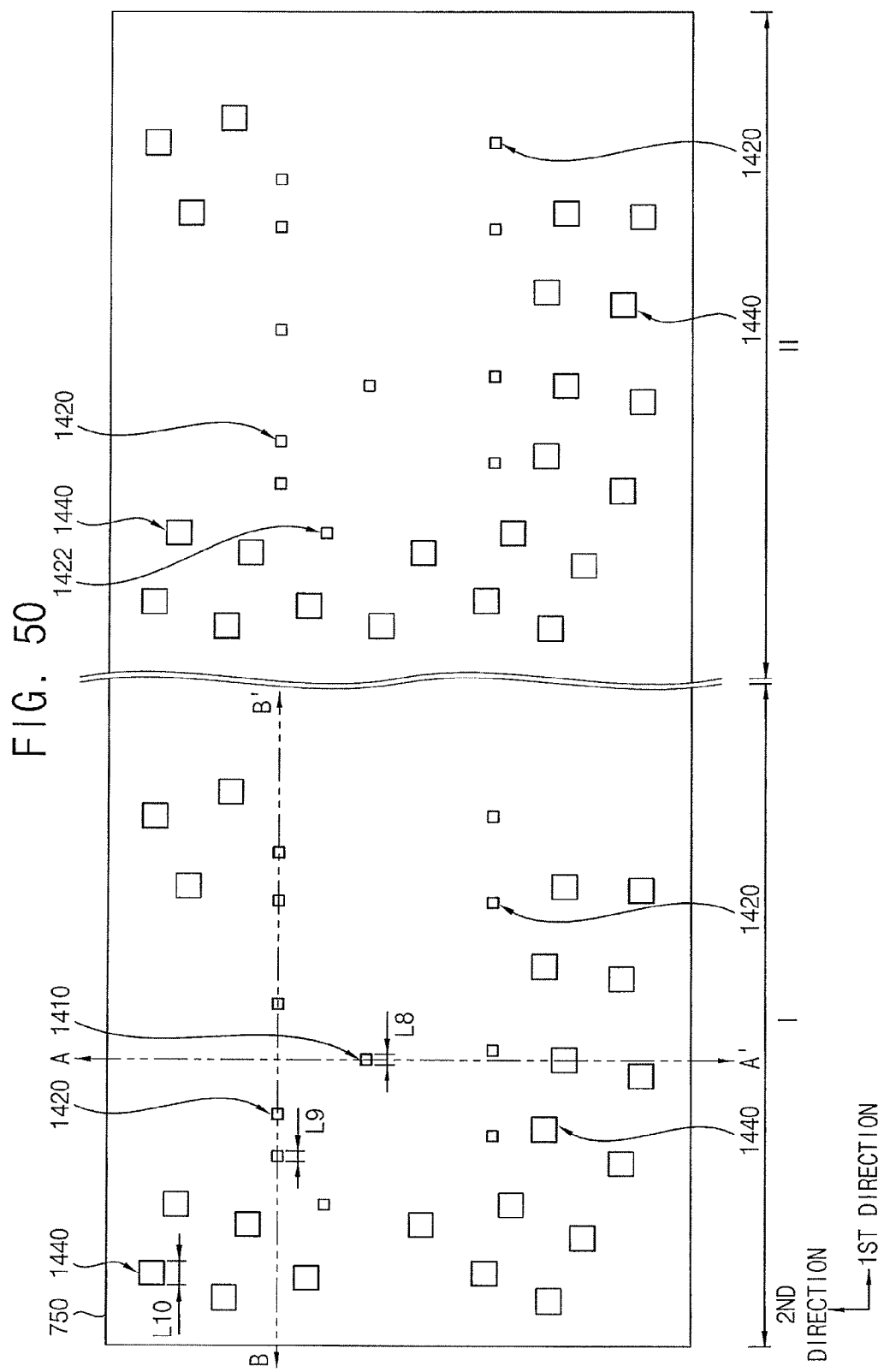
Figure 51:
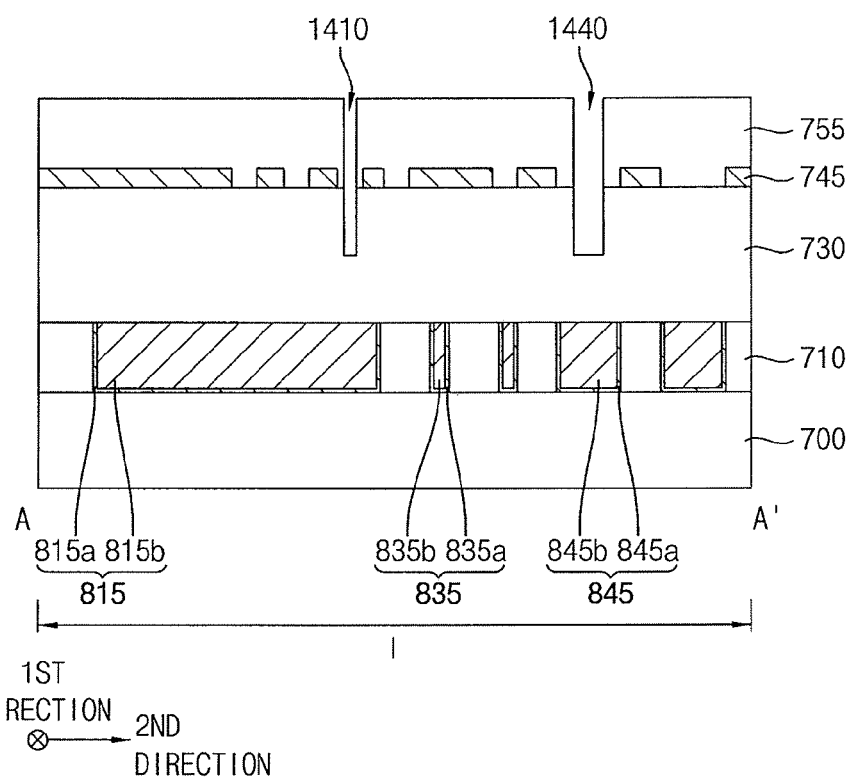
Figure 52:
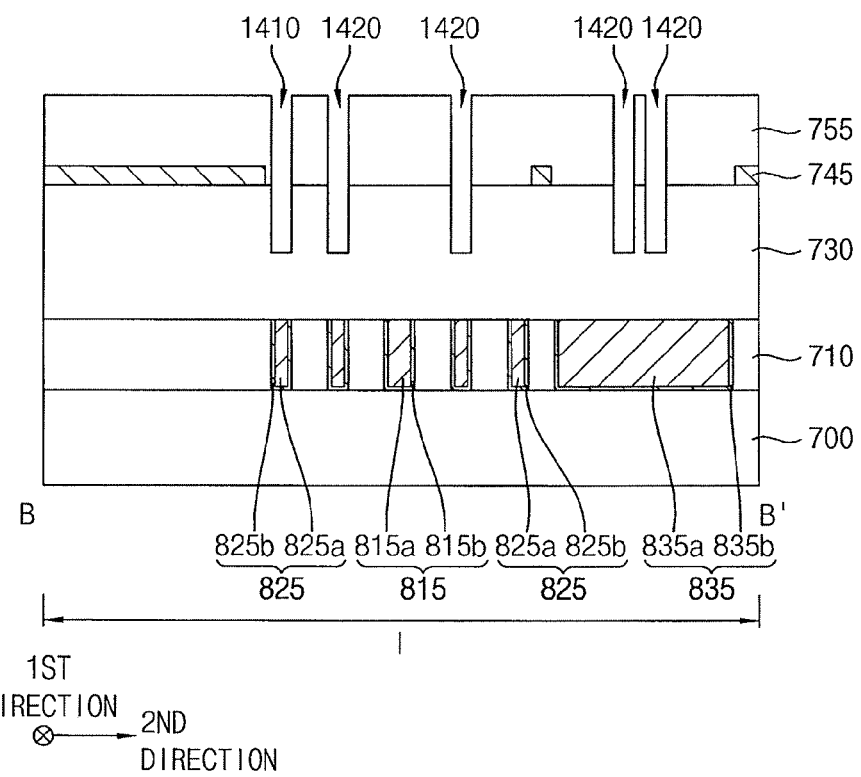

Referring to FIGS. 50 to 52, an upper portion of the second insulating interlayer 730 may be etched using the second and third etching masks 745 and 755 to form first recesses 1410, second recesses 1420 and 1422, and third recesses 1440.

In an exemplary embodiment of the present inventive concept, the first recess 1410 may correspond to the thirteenth and sixteenth openings 1210 and 1310, the second recesses 1420 and 1422 may correspond to the fourteenth and seventeenth openings 1220, 1222, 1320 and 1322, and the third recesses 1440 may correspond to the fifteenth and eighteenth openings 1240 and 1340.

Figure 53:
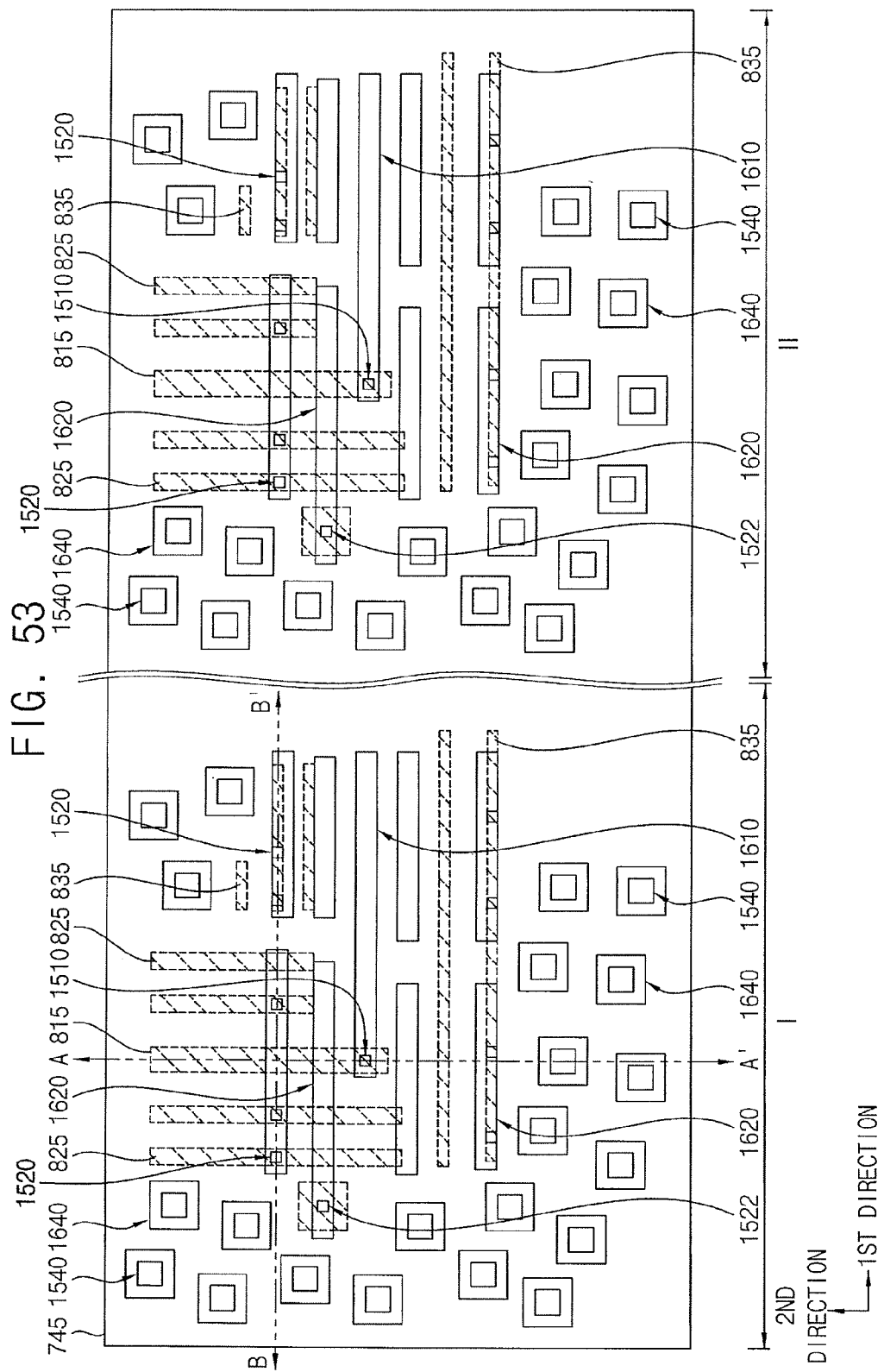
Figure 54:
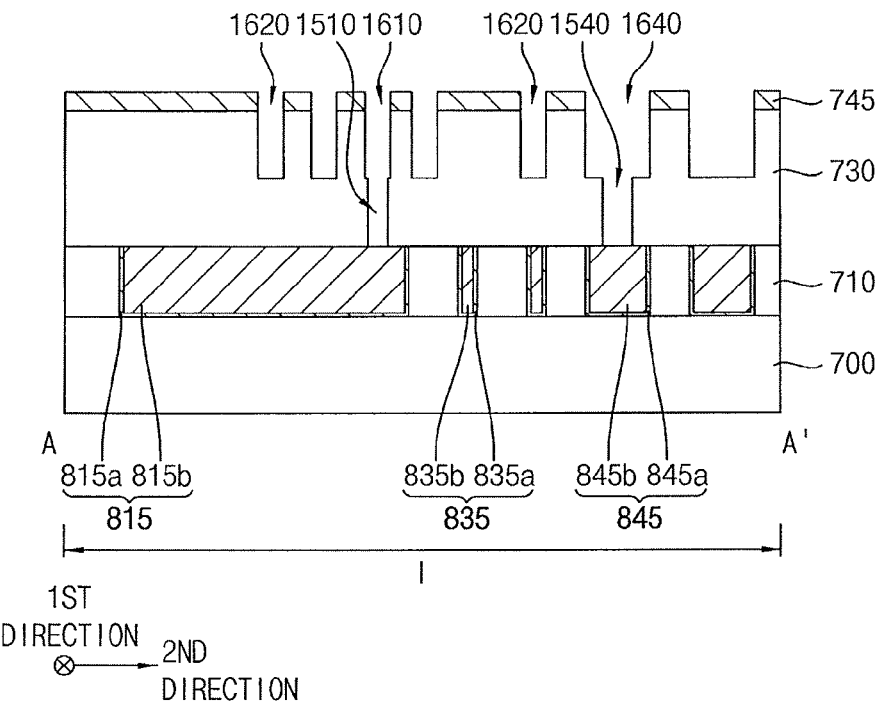
Figure 55:
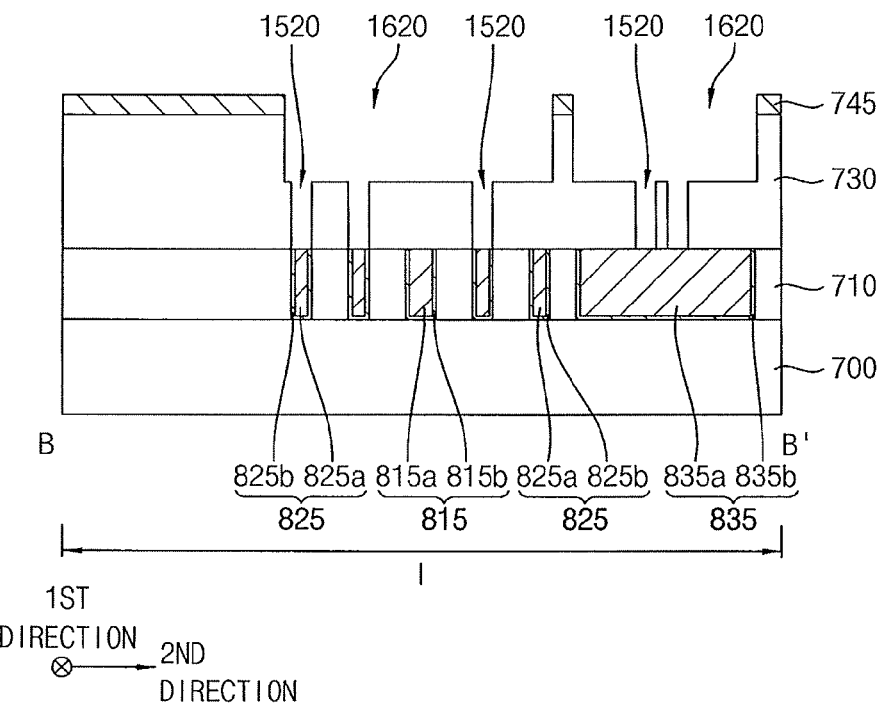

Referring to FIGS. 53 to 55, after removing the third etching mask 755, the second insulating interlayer 730 may be etched using the second etching mask 745 to form first via holes 1510, second via holes 1520 and 1522, and third via holes 1540 at lower portions of the second insulating interlayer 730, and to form first trenches 1610, second trenches 1620, and third trenches 1640 at upper portions of the second insulating interlayer 730.

The first to third via holes 1510, 1520, 1522 and 1540 may correspond to the first to third recesses 1410, 1420, 1422 and 1440, respectively. The first via hole 1510 may expose an upper surface of the lower wiring 815. Each of the second via holes 1520 may expose an upper surface of the first dummy lower wirings 825 and 835. Each of the second via holes 1522 may expose an upper surface of the second dummy lower wiring 845. Each of the third via holes 1540 may expose an upper surface of the second dummy lower wiring 845. Alternatively, each of the second via holes 1522 may expose an upper surface of the first dummy lower wirings 825 and 835.

The first to third trenches 1610, 1620 and 1640 may correspond to the openings of the second etching mask 745 corresponding to the seventh to twelfth openings 1010, 1020, 1040, 1110, 1120 and 1140. For example, the first trench 1610 may correspond to the openings of the second etching mask 745 corresponding to the seventh and tenth openings 1010 and 1110, the second trench 1620 may correspond to the eighth and eleventh openings 1020 and 1120, and the third trench 1640 may correspond to the ninth and twelfth openings 1040 and 1140.

In an exemplary embodiment of the present inventive concept, each of the first to third via holes 1510, 1520, 1522 and 1540 may be in communication with one of the first to third trenches 1610, 1620 and 1640.

Figure 56:
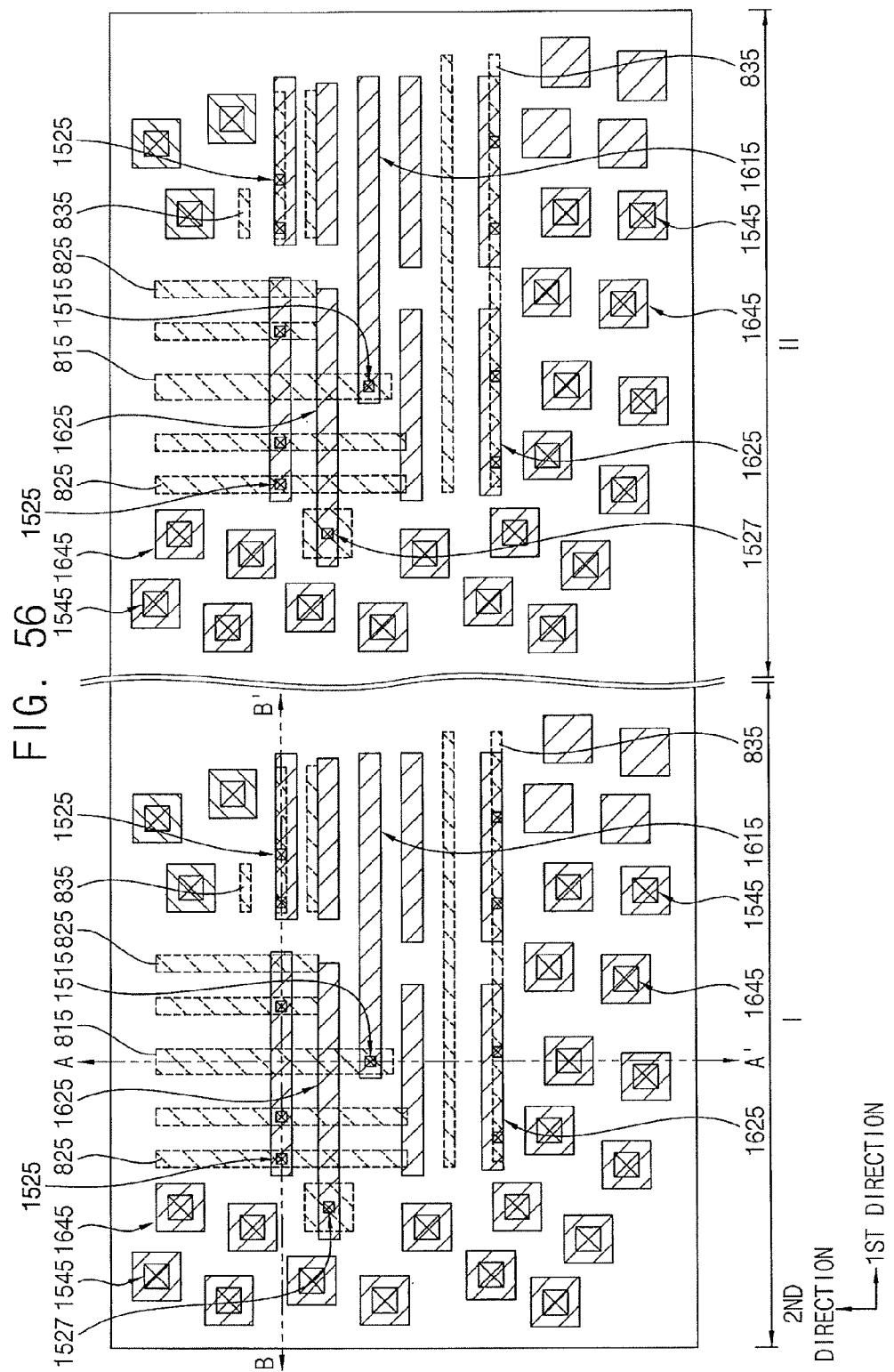
Figure 57:
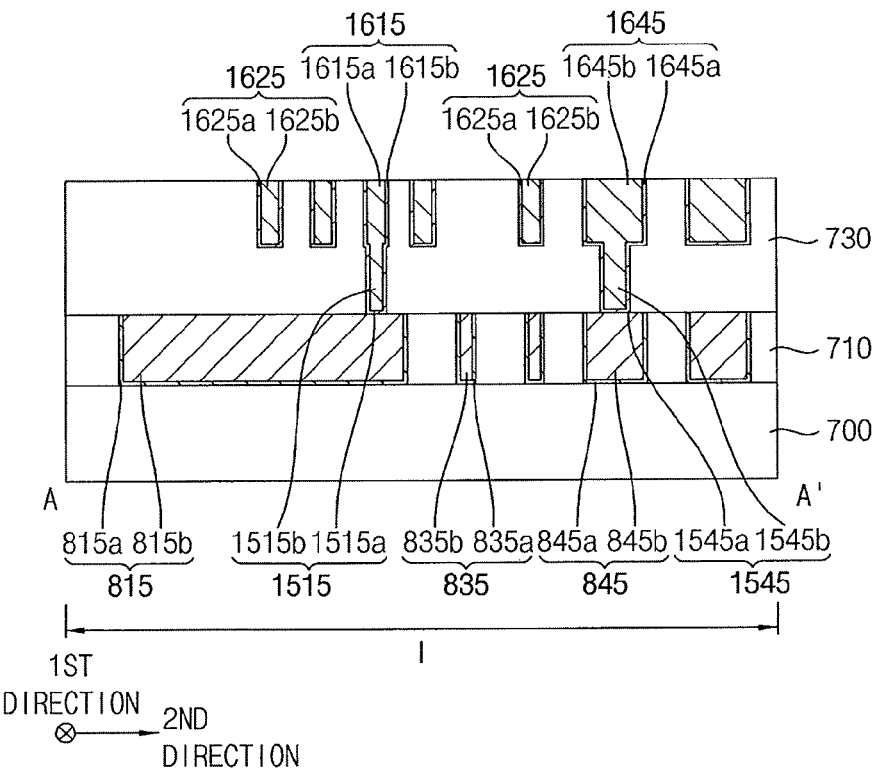
Figure 58:
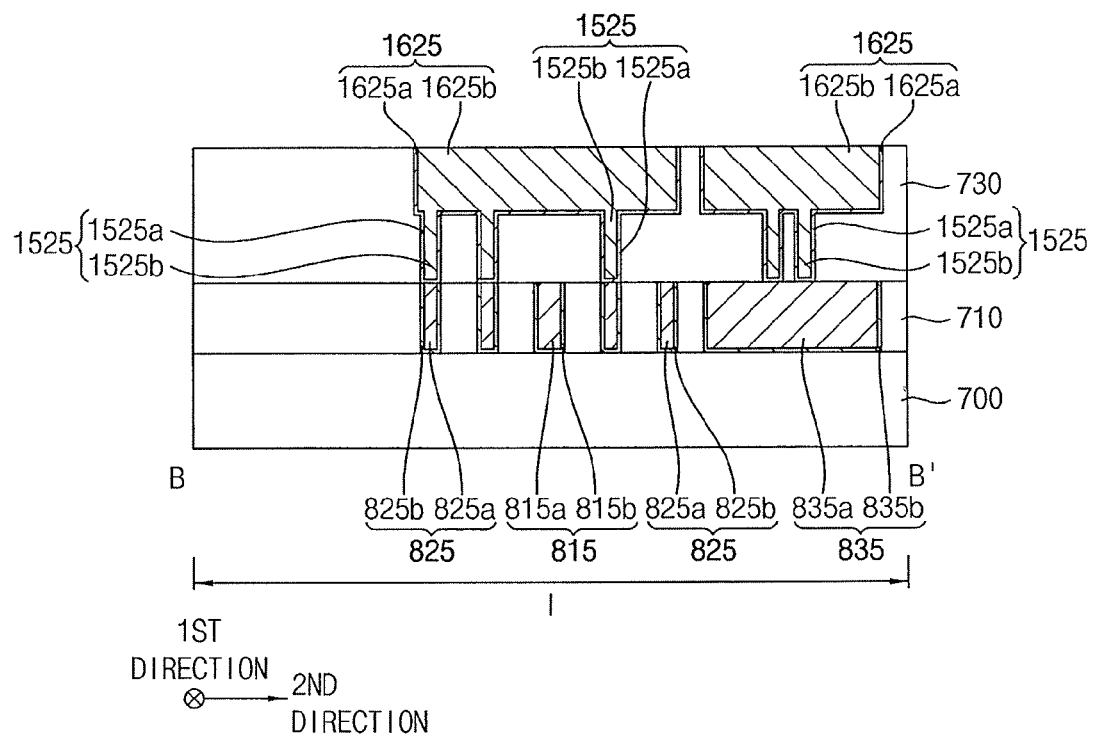

Referring to FIGS. 56 to 58, a via 1515, first dummy vias 1525 and 1527, and second dummy vias 1545, an upper wiring 1615, and first and second dummy upper wirings 1625 and 1645 may be formed to fill the first to third via holes 1510, 1520, 1522 and 1540, and the first to third trenches 1610, 1620 and 1640.

The via 1515, the first and second dummy vias 1525, 1527 and 1545, the upper wiring 1615, and the first and second dummy upper wirings 1625 and 1645 may be formed by forming a second barrier layer on the exposed upper surfaces of the lower wiring 815 and the first and second dummy lower wirings 825, 835 and 845, inner walls of the first to third via holes 1510, 1520, 1522 and 1540 and the first to third trenches 1610, 1620 and 1640, and an upper surface of the second insulating interlayer 730. The via 1515, the first and second dummy vias 1525, 1527 and 1545, the upper wiring 1615, and the first and second dummy upper wirings 1625 and 1645 may be formed by forming a second conductive layer on the second barrier layer to fill remaining portions of the first to third via holes 1510, 1520, 1522 and 1540 and the first to third trenches 1610, 1620 and 1640, and planarizing the second conductive layer and the second barrier layer until the upper surface of the second insulating interlayer 730 are exposed.

In an exemplary embodiment of the present inventive concept, the planarization process may be performed by a CMP process and/or an etch back process.

The second barrier layer may include a metal nitride (e.g., tantalum nitride, or titanium nitride), and/or a metal (e.g., tantalum, titanium), and the second conductive layer may include a metal (e.g., copper, aluminum, or tungsten).

The via 1515 may fill the first via hole 1510, and may include a fourth conductive pattern 1515b and a fourth barrier pattern 1515*a* covering a sidewall and a bottom of the fourth conductive pattern 1515*b*. The first dummy via 1525 and 1527 may fill the second via holes 1520 and 1522. The first dummy via 1525 may include a fifth conductive pattern 1525*b* and a fifth barrier pattern 1525*a* covering a sidewall and a bottom of the fifth conductive pattern 1525*b*. The second dummy via 1545 may fill the third via hole 1540, and may include a sixth conductive pattern 1545*b* and a sixth barrier pattern 1545*a* covering a sidewall and a bottom of the sixth conductive pattern 1545*b*.

The upper wiring 1615 may fill the first trench 1610, and may include a seventh conductive pattern 1615*b* and a seventh barrier pattern 1615*a* covering a sidewall and a bottom of the seventh conductive pattern 1615*b*. The first dummy upper wiring 1625 may fill the second trench 1620, and may include an eighth conductive pattern 1625*b* and an eighth barrier pattern 1625*a* covering a sidewall and a bottom of the eighth conductive pattern 1625*b*. The second dummy upper wiring 1645 may fill the third trench 1640, and may include a ninth conductive pattern 1645*b* and a ninth barrier pattern 1645*a* covering a sidewall and a bottom of the ninth conductive pattern 1645*b*.

Each of the via 1515, the first and second dummy vias 1525, 1527 and 1545, the upper wiring 1615, and the first and second dummy upper wirings 1625 and 1645 may have a shape of a rectangle or a shape of a square.

In an exemplary embodiment of the present inventive concept, the first dummy vias 1525 having sizes less than the predetermined size may be relatively close to the via 1515 having a size less than the predetermined size, and the second dummy vias 1545 having sizes equal to or greater than the predetermined size may be relatively distant from the via 1515. Thus, the via 1515 may have a desired size and/or shape without being distorted by surrounding structures.

In an exemplary embodiment of the present inventive concept, the first dummy upper wirings 1625 having sizes less than the predetermined size may be relatively close to the upper wiring 1615 having a size less than the predetermined size, and the second dummy upper wirings 1645 having sizes equal to or greater than the predetermined size may be relatively distant from the upper wiring 1615. Thus, the upper wiring 1615 may have a desired size and/or shape without being distorted by surrounding structures.

The etching process for forming the via 1515, and the first and second dummy vias 1525, 1527 and 1545, and the etching process for forming the upper wiring 1615, and the first and second dummy upper wirings 1625 and 1645 may be divided into two parts and performed independently, and thus the via 1515, and the first and second dummy vias 1525, 1527 and 1545 the upper wiring 1615, and the first and second dummy upper wirings 1625 and 1645 may have a relatively high density. However, exemplary embodiments of the present inventive concept are not limited thereto. For example, the etching process may be performed only once, or the etching process may be divided into two or more parts.

The first dummy vias 1525 and 1527 may be relatively close to the via 1515 having a relatively small size, and each of the first dummy vias 1525 and 1527 may have a relatively small size. Thus, in the photo process and the etching process, the size and the shape of the via 1515 may not be influenced by the first dummy vias 1525, and the via 1515 may have a desired size and/or shape.

The OPC may be performed on the via 1515 having the relatively small size and on the first dummy vias 1525 and 1527 having relatively small sizes, and thus the first dummy vias 1525 and 1527 may have desired sizes and/or shapes. Thus, the via 1515 relatively close to the first dummy vias 1525 and 1527 may have the desired size and/or shape.

The first dummy vias 1525 and 1527 relatively close to the via 1515 may be divided into two parts and formed by two respective etching process, and thus may have relatively high densities.

The wiring structure and the method of forming the wiring structure according to exemplary embodiments of the present inventive concept may be applied to various types of memory devices having wiring structures. For example, wiring structure and the method of forming the wiring structure may be included in logic devices such as central processing units (CPUs), main processing units (MPUs), and application processors (APs), volatile memory devices such as DRAM devices, and SRAM devices, or non-volatile memory devices such as flash memory devices, PRAM devices, MRAM devices, and RRAM devices.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A method of forming a mask layout, the method comprising:
    forming a layout of a first mask including a lower wiring structure pattern and a dummy lower wiring structure pattern;
    forming a layout of a second mask including an upper wiring structure pattern and a dummy upper wiring structure pattern, the second mask overlapping the first mask;
    forming a layout of a third mask including a first via structure pattern and a first dummy via structure pattern, the first via structure pattern commonly overlapping the lower wiring structure pattern and the upper wiring structure pattern, and the first dummy via structure pattern commonly overlapping the dummy lower wiring structure pattern and the dummy upper wiring structure pattern; and
    forming a layout of a fourth mask overlapping the third mask and including a second via structure pattern and a second dummy via structure pattern, the second via structure pattern commonly overlapping the lower wiring structure pattern and the upper wiring structure pattern, and the second dummy via structure pattern commonly overlapping the dummy lower wiring structure pattern and the dummy upper wiring structure pattern.

2. The method of claim 1, further comprising:
    performing a first optical proximity correction (OPC) on the third mask; and
    performing a second OPC on the fourth mask.

3. The method of claim 2, wherein the first dummy via structure pattern includes a plurality of first dummy via patterns and a plurality of second dummy via patterns, each of the first dummy via patterns having a size less than a predetermined size, and each of the second dummy via patterns having a size equal to or greater than the predetermined size,
    and wherein performing the first OPC on the third mask includes performing the first OPC on the first via structure pattern and the first dummy via patterns.

4. The method of claim 3, wherein the dummy lower wiring structure pattern includes a plurality of first dummy lower wiring patterns and a plurality of second dummy lower wiring patterns, each of the first dummy lower wiring patterns having a size less than the predetermined size, and each of the second dummy lower wiring patterns having a size equal to or greater than the predetermined size, wherein the dummy upper wiring structure pattern includes a plurality of first dummy upper wiring patterns and a plurality of second dummy upper wiring patterns, each of the first dummy upper wiring patterns having a size less than the predetermined size, and each of the second dummy upper wiring patterns having a size equal to or greater than the predetermined size, and wherein each of the first dummy via patterns overlaps at least one of the first dummy lower wiring patterns and the first dummy upper wiring patterns.

5. The method of claim 4, wherein each of the first dummy via patterns commonly overlaps one of the first dummy lower wiring patterns and one of the second dummy upper wiring patterns, or commonly overlaps one of the second dummy lower wiring patterns and one of the first dummy upper wiring patterns.

6. The method of claim 4, wherein each of the first dummy via structure pattern, the dummy lower wiring structure pattern and the dummy upper wiring structure pattern has a shape of a rectangle or a shape of a square in a plan view, and a size of each of the first dummy via structure pattern, the dummy lower wiring structure pattern and the dummy upper wiring structure pattern is defined as a length of a relatively shorter side of the rectangle or a length of a side of the square.

7. The method of claim 4, wherein the first dummy via patterns are relatively closer to the first via than the second dummy via patterns, the first dummy lower wiring patterns are relatively closer to the first via than the second dummy lower wiring patterns, and the first dummy upper wiring patterns are relatively closer to the first via than the second dummy upper wiring patterns.

8. The method of claim 4, further comprising, performing a third OPC on the lower wiring structure pattern and the first dummy lower wiring patterns, and performing a fourth OPC on the upper wiring structure pattern and the first dummy upper wiring patterns.

9. The method of claim 8, wherein the first OPC, the second OPC and the third OPC include enlarging sizes of and processing corners of the first via structure pattern, the lower wiring structure pattern and the upper wiring structure pattern, and wherein the first OPC includes enlarging sizes of the first dummy via patterns.

10. The method of claim 9, wherein the third and fourth OPCs include enlarging sizes of the first dummy lower wiring patterns and the first dummy upper wiring patterns.

11. The method of claim 2, wherein the second dummy via structure pattern includes a plurality of third dummy via patterns and a plurality of fourth dummy via patterns, each of the third dummy via patterns having a size less than the predetermined size, and each of the fourth dummy via patterns having a size equal to or greater than the predetermined size, and wherein performing the second OPC includes performing the second OPC on the second via structure pattern and the third dummy via patterns.

12. The method of claim 11, wherein the dummy lower wiring structure pattern includes a plurality of first dummy lower wiring patterns and a plurality of second dummy lower wiring patterns, each of the first dummy lower wiring patterns having a size less than the predetermined size, and each of the second dummy lower wiring patterns having a size equal to or greater than the predetermined size, wherein the dummy upper wiring structure pattern includes a plurality of first dummy upper wiring patterns and a plurality of second dummy upper wiring patterns, each of the first dummy upper wiring patterns having a size less than the predetermined size, and each of the second dummy upper wiring patterns having a size equal to or greater than the predetermined size, and wherein each of the third dummy via patterns overlaps at least one of the first dummy lower wiring patterns and the first dummy upper wiring patterns.

13. The method of claim 1, wherein the first dummy via structure pattern includes a plurality of first dummy via patterns and a plurality of second dummy via patterns, each of the first dummy via patterns having a size less than a predetermined size, and each of the second dummy via patterns having a size equal to or greater than the predetermined size, wherein the second dummy via structure pattern includes a plurality of third dummy via patterns and a plurality of fourth dummy via patterns, each of the third dummy via patterns having a size less than the predetermined size, and each of the fourth dummy via patterns having a size equal to or greater than the predetermined size, and wherein the number of the first dummy via patterns in the first mask is equal to the number of the third dummy via patterns in the second mask.

14. A method of forming a mask layout, the method comprising:

forming a first mask including a lower wiring structure pattern and a dummy lower wiring structure pattern;

forming a second mask overlapping the first mask and including an upper wiring structure pattern and a dummy upper wiring structure pattern;

forming a third mask including a first via structure pattern and a first dummy via structure pattern, the first via structure pattern commonly overlapping the lower wiring structure pattern and the upper wiring structure pattern, the first dummy via structure pattern commonly overlapping the dummy lower wiring structure pattern and the dummy upper wiring structure pattern, the first dummy via structure pattern including a plurality of first dummy via patterns and a plurality of second dummy via patterns, each of the first dummy via patterns having a size less than a predetermined size, and each of the second dummy via patterns having a size substantially equal to or greater than the predetermined size;

performing a first OPC on the first via structure pattern and the first dummy via patterns;

forming a fourth mask overlapping the third mask and including a second via structure pattern and a second dummy via structure pattern, the second via structure pattern commonly overlapping the lower wiring structure pattern and the upper wiring structure pattern, the second dummy via structure pattern commonly overlapping the dummy lower wiring structure pattern and the dummy upper wiring structure pattern, the second via structure pattern including a plurality of third dummy via patterns and a plurality of fourth dummy via patterns, each of the third dummy via patterns having a size less than the predetermined size, and each of the fourth dummy via patterns having a size equal to or greater than the predetermined size; and performing a second OPC on the second via structure pattern and the third dummy via patterns.

15. The method of claim 14, wherein the dummy lower wiring structure pattern includes a plurality of first dummy lower wiring patterns and a plurality of second dummy lower wiring patterns, each of the first dummy lower wiring patterns having a size less than the predetermined size, and each of the second dummy lower wiring patterns having a size substantially equal to or greater than the predetermined size, wherein the dummy upper wiring structure pattern includes a plurality of first dummy upper wiring patterns and a plurality of second dummy upper wiring patterns, each of the first dummy upper wiring patterns having a size less than the predetermined size, and each of the second dummy upper wiring patterns having a size substantially equal to or greater than the predetermined size, and wherein each of the first dummy via patterns overlaps at least one of the first dummy lower wiring patterns and the first dummy upper wiring patterns.

\* \* \* \* \*